(12) United States Patent
Saitoh et al.

(10) Patent No.: US 6,700,156 B2
(45) Date of Patent: Mar. 2, 2004

(54) INSULATED GATE SEMICONDUCTOR DEVICE

(75) Inventors: Wataru Saitoh, Kawasaki (JP); Ichiro Omura, Yokohama (JP); Satoshi Aida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/321,613

(22) Filed: Dec. 18, 2002

(65) Prior Publication Data

US 2003/0201456 A1 Oct. 30, 2003

Related U.S. Application Data

(63) Continuation-in-part of application No. 10/183,457, filed on Jun. 28, 2002, now abandoned.

(30) Foreign Application Priority Data

Apr. 26, 2002 (JP) ........................ 2002-127334
Oct. 11, 2002 (JP) ........................ 2002-298838

(51) Int. Cl.[7] ................................................ H01L 29/76
(52) U.S. Cl. ........................ 257/327; 257/341
(58) Field of Search ................................ 257/327, 330, 257/331, 334, 335, 337, 339, 341, 342, 340, 401

(56) References Cited

U.S. PATENT DOCUMENTS 5,883,402 A * 3/1999 Omura et al. ............... 257/146
2001/0026989 A1 * 10/2001 Thapar ....................... 438/400

* cited by examiner

*Primary Examiner*—Mark V. Prenty
(74) *Attorney, Agent, or Firm*—Oblon, Spivak, McClelland, Maier & Neustadt, P.C.

(57) ABSTRACT

An insulated gate semiconductor device includes a first semiconductor layer of a first conductivity type. A plurality of second semiconductor layers of a second conductivity type selectively formed in a surface area of the first semiconductor layer. At least one third semiconductor layer of the first conductivity type is formed in a surface area of each of the second semiconductor layers. A fourth semiconductor layer is formed on a bottom of the first semiconductor layer. At least one fifth semiconductor layer of the second conductivity type is provided in the first semiconductor layer and connected to at least one of the plurality of second semiconductor layers. The fifth semiconductor layer has impurity concentration that is lower than that of the second semiconductor layers.

75 Claims, 32 Drawing Sheets

INSULATED GATE SEMICONDUCTOR DEVICE

CROSS-REFERENCE TO RELATED APPLICATIONS

This is a Continuation-in-Part application of U.S. patent application No. 10/183,457, filed Jun. 28, 2002, now abandoned, the entire contents of which are incorporated herein by reference.

This application is based upon and claims the benefit of priority from the prior Japanese Patent Applications No. 2002-127334, filed Apr. 26, 2002; and No. 2002-298838, filed Oct. 11, 2002, the entire contents of both of which are incorporated herein by reference.

BACKGROUND OF THE INVENTION

1. Field of the Invention

The present invention relates to an insulated gate semiconductor device used for power control. More specifically, the invention relates to a MOS gate device such as a switching power MOSFET (metal oxide semiconductor field effect transistor) and an IGBT (insulated gate bipolar transistor).

2. Description of the Related Art

To increase in switching frequency is effective in miniaturizing a power supply circuit such as a switching power supply. In other words, downsizing a passive element such as an inductance and a capacitor in a power supply circuit is effective. However, as the switching frequency heightens, a switching loss of switching elements such as a MOSFET and an IGBT increases. The increase in switching loss lowers the efficiency of a power supply. A decrease in switching loss due to a speedup of switching elements is therefore essential to miniaturization of a power supply circuit.

In MOS gate elements, such as a MOSFET and an IGBT, currently used as switching elements, a gate length is shortened and thus the opposing area of gate and drain electrodes is decreased. Consequently, the MOS gate elements can be increased in speed by reducing gate-to-drain capacitance.

If, however, the gate-to-drain capacitance is reduced to speed up the MOS gate elements, resonance occurs between parasitic inductance and switching element capacitance contained in wiring. The resonance becomes a factor in causing high-frequency noise (switching noise) at the time of switching. To suppress the switching noise, soft switching has to be performed or a filter circuit has to be provided or a gate drive circuit has to be devised. The suppression of switching noise increases costs.

As described above, conventionally, high-speed switching can be achieved by reducing gate-to-drain capacitance. However, switching noise should be suppressed and thus soft switching should be performed or an external circuit such as a filter circuit should be employed.

BRIEF SUMMARY OF THE INVENTION

According to an aspect of the present invention, there is provided an insulated gate semiconductor device comprises a first semiconductor layer of a first conductivity type; a plurality of second semiconductor layers of a second conductivity type selectively formed in a surface area of the first semiconductor layer; at least one third semiconductor layer of the first conductivity type formed in a surface area of each of the second semiconductor layers; a plurality of first main electrodes connected to the second semiconductor layers and the third semiconductor layer, respectively; a fourth semiconductor layer formed on a bottom of the first semiconductor layer; a second main electrode connected to the fourth semiconductor layer; a control electrode formed on a surface of each of the second semiconductor layers, the third semiconductor layer, and the first semiconductor layer with a gate insulation film interposed therebetween; and at least one fifth semiconductor layer of the second conductivity type provided in the first semiconductor layer and connected to at least one of the plurality of second semiconductor layers, the fifth semiconductor layer having impurity concentration that is lower than that of the second semiconductor layers.

DETAILED DESCRIPTION OF THE INVENTION

Embodiments of the present invention will now be described with reference to the accompanying drawings. In each of the embodiments, a first conductivity type is an n type and a second conductivity type is a p type.

(First Embodiment)

Figure 1:
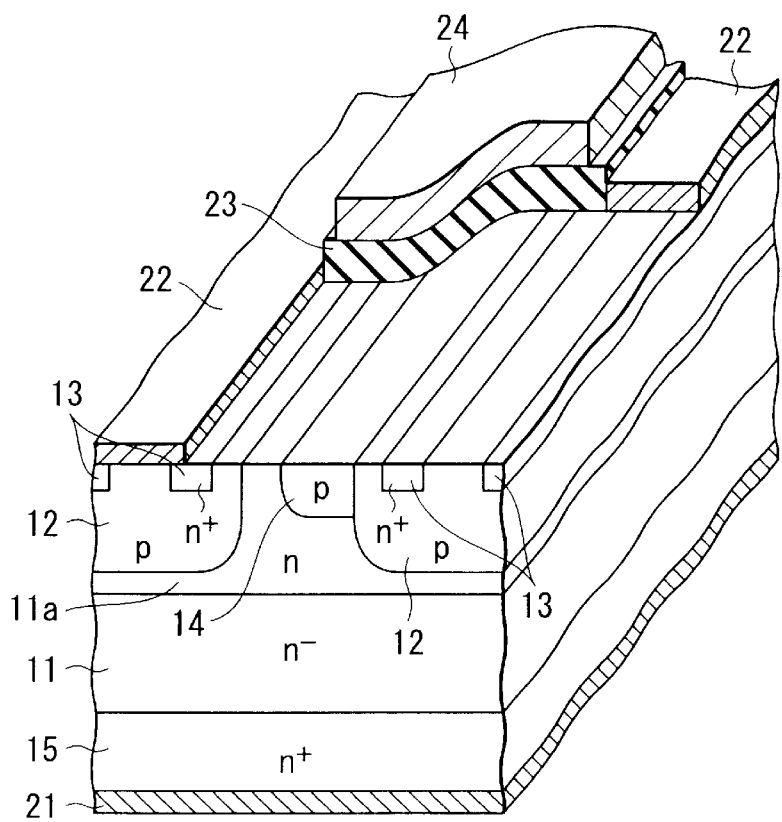
FIG. 1 is a partially cutaway perspective view showing a structure of a vertical power MOSFET according to a first embodiment of the present invention.

FIG. 1 shows a structure of a vertical power MOSFET according to a first embodiment of the present invention.

Referring to FIG. 1, an n-type low-resistance layer 11a is formed by diffusion on one surface (top) of an n⁻-type drift layer 11 serving as a first semiconductor layer. A plurality of p-type base layers 12 are selectively formed by diffusion as second semiconductor layers in a surface area of the layer 11a. The p-type base layers 12 are each shaped like a strip in a first direction perpendicular to the front of the MOSFET. A plurality of n⁺-type source layers 13 are selectively formed by diffusion as third semi-conductor layers in a surface area of each of the p-type base layers 12.

A p-type layer 14 is selectively formed by diffusion as a fifth semiconductor layer in a surface area of the n-type low-resistance layer 11a and between adjacent two p-type base layers 12. The p-type layer 14 is shaped like a strip in the first direction along the p-type base layers 12 and contacts one of adjacent p-type base layers 12. The p-type layer 14 has impurity concentration that is lower than that of the p-type base layers 12.

An n⁺-type drain layer 15 is formed as a fourth semiconductor layer on the other surface (bottom) of the n⁻-type drift layer 11. A drain electrode 21 serving as a second main electrode contacts the entire surface of the layer 15.

A source electrode 22, which includes part of the n⁺-type source layers 13, is formed as a first main electrode on each of the p-type base layers 12. The source electrodes 22 are each shaped like a strip in the first direction. A planar gate electrode 24 is formed as a control electrode between adjacent source electrodes 22 through a gate insulation film 23 (e.g., a silicon oxide film). In other words, the gate electrode 24 is formed within a region extending from the n⁺-type source layer 13 in one p-type base layer 12 to that in another p-type base layer 12 via the n-type low-resistance layer 11a and p-type layer 14. The gate insulation film 23 has a thickness of about 0.1 μm.

For example, a substrate that is obtained by forming an n⁻-type layer on a low resistance silicon substrate by epitaxial growth is used to form the above-described n⁻-type drift layer 11 and n⁺-type drain layer 15. Another substrate that is obtained by forming an n⁺-type layer on a silicon substrate by diffusion can be used.

The p-type layer 14 is formed in that surface area of the n-type low-resistance layer 11a that is formed under the gate electrode 24 between the p-type base layers 12 (the layer 14 is also referred to as a gate-underlying p-type layer hereinafter). The p-type layer 14 has impurity concentration that is lower than that of the p-type base layers 12. The layer 14 is depleted when a high voltage is applied. High-speed and low-noise switching characteristics can thus be achieved in the MOSFET according to the first embodiment. More specifically, the MOSFET achieves high-speed and low-noise switching characteristics using characteristics that gate-to-drain capacitance increases in response to a drain voltage.

Figure 2:
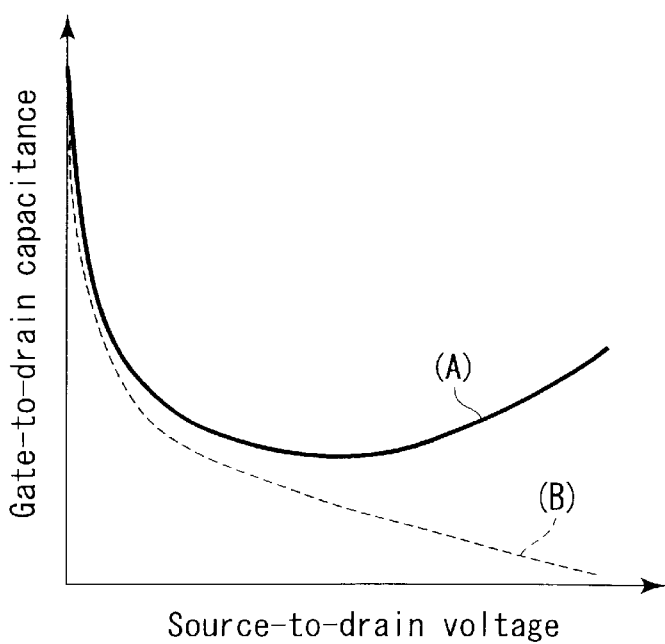
FIG. 2 is a graph showing the dependency of gate-to-drain capacitance upon source-to-drain voltage in the MOSFET shown in FIG. 1 and that in a prior art MOSFET to compare them with each other.

FIG. 2 shows the dependency of gate-to-drain capacitance upon source-to-drain voltage in the MOSFET according to the first embodiment and that in a prior art MOSFET (not shown) to compare them with each other.

In the prior art MOSFET indicated by a broken line (B), the gate-to-drain capacitance continues to decrease in proportion to the source-to-drain voltage.

In contrast, in the MOSFET of the present invention indicated by a solid line (A), the gate-to-drain capacitance increases as the source-to-drain voltage becomes high. In other words, the gate-to-drain capacitance gradually decreases if the source-to-drain voltage is low. As the source-to-drain voltage heightens, the gate-to-drain capacitance increases. The reason is as follows. The increase in source-to-drain voltage (high drain voltage) depletes the gate-underlying p-type layer 14 and thus the apparent opposing area of the gate electrode 24 and drain electrode 21 increases as the apparent gate length does.

The smaller the gate-to-drain capacitance, the higher the switching speed of the MOSFET. If, however, the capacitance is small when the MOSFET completely turns off, a jumping voltage increases. It is desirable that the capacitance should be small when the MOSFET starts to turn off or when the drain voltage is low and it should be large when the MOSFET finishes turning off or when the drain voltage is high.

In the prior art MOSFET (B), the narrower the interval between p-type base layers, the smaller the opposing area of the gate and drain electrodes. In other words, the gate-to-drain capacitance decreases. If a drain voltage is applied, a depletion layer extends from the p-type base layers. The gate-to-drain capacitance decreases more and more. A gate driving circuit is therefore required to achieve high-speed, low-noise switching. Complicated control such as a gradual decrease in gate current is also required.

The MOSFET according to the first embodiment makes the use of characteristics that the gate-to-drain capacitance increases in response to the drain voltage. In other words, when the MOSFET starts to turn off, the gate-underlying p-type layer 14 is not depleted by a low drain voltage and the interval between p-type base layers 12 is narrowed. Thus, the opposing area of the gate electrode 24 and drain electrode 21 decreases and so does the gate-to-drain capacitance, thereby securing high-speed switching characteristics. On the other hand, when the MOSFET finishes turning off by a high drain voltage, the layer 14 is depleted and the apparent interval between p-type base layers 12 is broadened. Thus, the opposing area of the gate electrode 24 and drain electrode 21 increases and so does the gate-to-drain capacitance, thereby preventing the drain voltage from jumping to reduce switching noise. Consequently, high-speed, low-noise switching characteristics can be achieved without any external circuit or complicated control.

Figure 3:
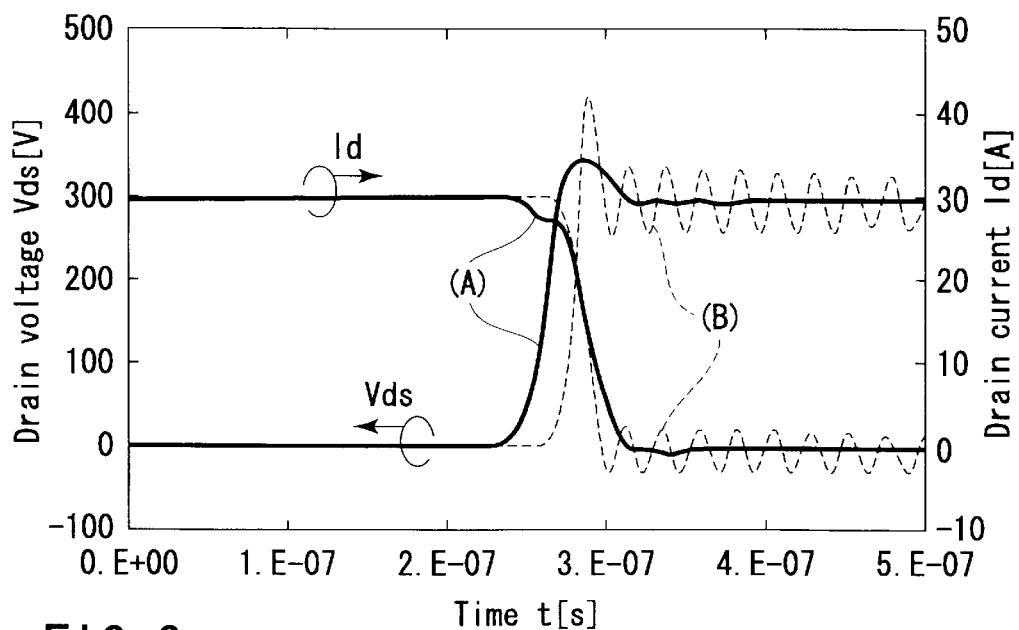
FIG. 3 is a graph showing a drain voltage waveform and a drain current waveform generated when the MOSFET shown in FIG. 1 turns off and those generated when a prior art MOSFET turns off to compare them with each other.

FIG. 3 shows a drain voltage (Vds) waveform and a drain current (Id) waveform generated when the MOSFET shown in FIG. 1 turns off and those generated when a prior art MOSFET turns off to compare them with each other.

In the prior art MOSFET indicated by a broken line (B) in FIG. 3, the switching speed is increased by shortening the gate length as has been described above. The jumping voltage (drain voltage Vds) generated when the MOSFET turns off increases in proportion to the switching speed as indicated by a broken line in FIG. 3. The drain voltage Vds greatly varies thereafter and is not stabilized easily.

In contrast, the MOSFET of the present invention indicated by a solid line (A) decreases in the gate-to-drain capacitance when a low drain voltage is applied and increases in the gate-to-drain capacitance when a high drain voltage is applied. The switching speed remains high and the jumping voltage lowers by more than half that of the prior art MOSFET as indicated by the broken line in FIG. 3. The drain voltage Vds is prevented from varying.

Figure 4:
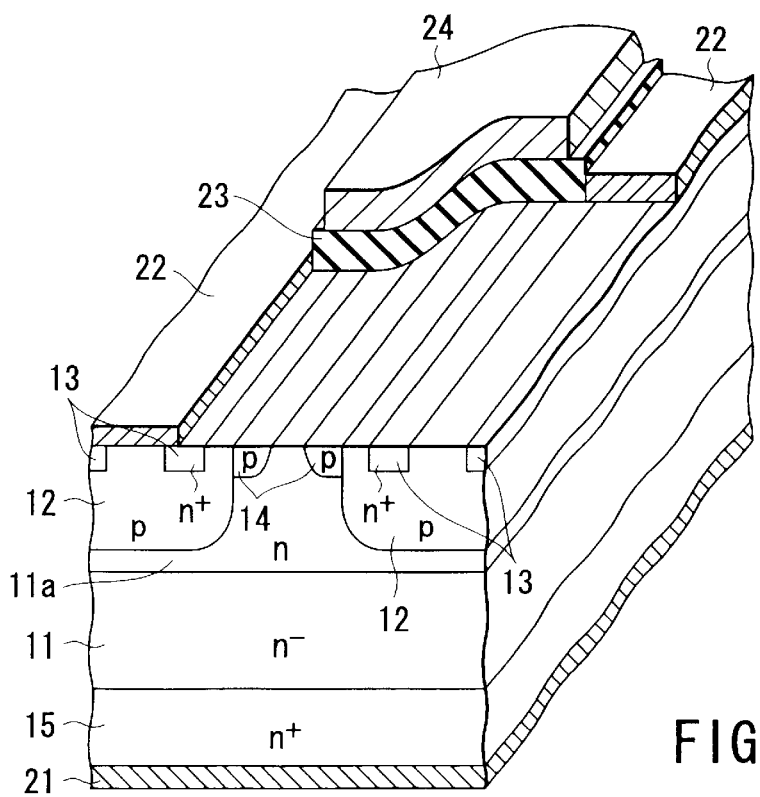
FIG. 4 is a partially cutaway perspective view showing another structure of a vertical power MOSFET according to the first embodiment of the present invention.

In the MOSFET shown in FIG. 1, the gate-underlying p-type layer 14 is formed on one of adjacent two p-type base layers 12. The present invention is not limited to this formation. For example, a gate-underlying p-type layer 14 can be formed on each of adjacent two p-type base layers 12, as shown in FIG. 4.

The gate-underlying p-type layers 14 are not necessarily formed more shallowly than the p-type base layers 12. The layers 14 can be depleted at a high drain voltage in terms of operation. Therefore, the layers 14 can be formed to the same depth as that of the p-type base layers 12 or they can be done more deeply than the base layers 12. If, however, the layers 14 are formed shallowly, the effective opposing area of the gate electrode 24 and drain electrode 21 greatly increases when the layers 14 are completely depleted. Thus, the gate-to-drain capacitance varies with an increase in drain voltage and a great advantage of low-noise switching can be obtained. It is thus desirable to form the gate-underlying p-type layers 14 more shallowly than the p-type base layers 12.

In the MOSFET depicted in FIG. 1, the n-type low-resistance layer 11a is provided in order to reduce the resistance between adjacent p-type base layers 12. In other words, the layer 11a is formed more deeply than the p-type base layers 12. Resistance can thus be prevented from expanding to the broad n⁻-type drift layer 11 from a narrow JFET (junction FET) region interposed between the p-type base layers 12. The n-type low-resistance layer 11a can be formed more shallowly than the p-type base layers 12 in order to lower on-resistance.

Figure 5:
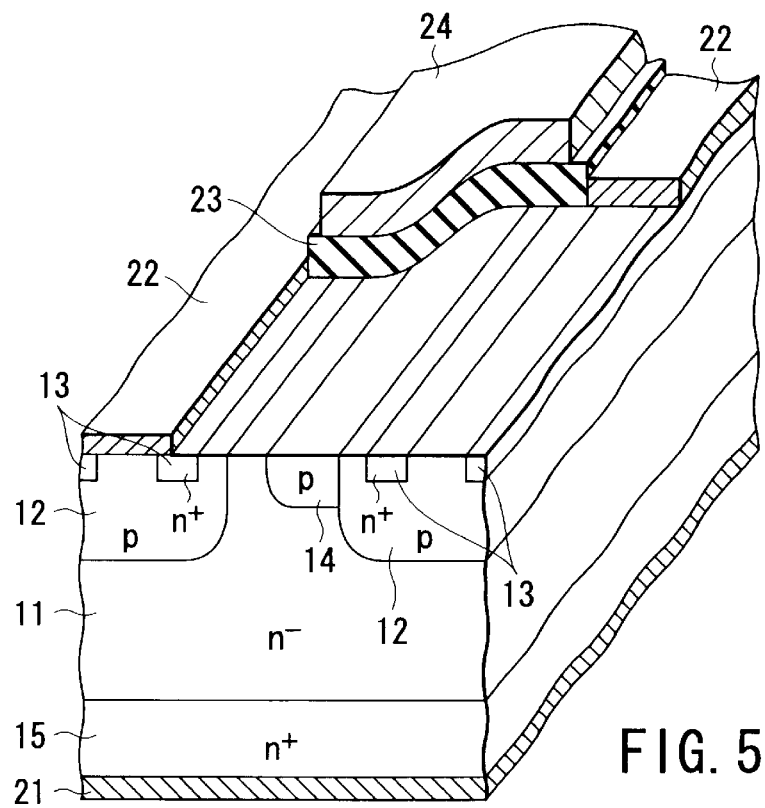
FIG. 5 is a partially cutaway perspective view showing still another structure of a vertical power MOSFET according to the first embodiment of the present invention.

The n-type low-resistance layer 11a does not affect high-speed, low-noise switching characteristics. The formation of an n-type low-resistance layer can thus be omitted as shown in FIG. 5. The same is true of the MOSFET shown in FIG. 4.

Paying attention to on-resistance as well as high-speed switching, gate capacitance indicative of the high-speed switching is usually proportional to the area and the on-resistance is inversely proportional to the area. There is a trade-off relationship between high-speed switching and low on-resistance. In the MOSFET of the first embodiment, however, its switching speed can be increased simply by slightly increasing a channel resistance and the resistance of the JFET region. The trade-off relationship between high-speed switching and low on-resistance is therefore improved. The on-resistance can easily be made lower without changing the switching speed.

The rated voltage (breakdown voltage) of a switching element is usually 2.5 times to 3 times as high as the power supply voltage. It is thus desirable that the gate-to-drain capacitance be increased with respect to a voltage that is almost equal to the power supply voltage. In other words, it is desirable that the switching element have a characteristic that its gate-to-drain capacitance starts to increase at a voltage that is one-third to two-thirds of the rated voltage.

If the gate-underlying p-type layer 14 is completely depleted, the opposing area of the gate and drain electrodes 24 and 21 greatly increases and so does the gate-to-drain capacitance. It is thus desirable that the gate-underlying p-type layer 14 be completely depleted at a voltage that is one-third to two-thirds of the rated voltage.

The gate-to-drain capacitance increases if the gate-underlying p-type layer 14 is completely depleted (see FIG. 2). However, when the gate-to-drain capacitance does not increase or its decrease stops to a given amount or its decrease is minimized, the capacitance at the time of turnoff becomes larger than that in the prior art MOSFET. Switching noise is therefore suppressed and the gate-underlying p-type layer 14 is not depleted completely but can be done partially.

Figure 6:
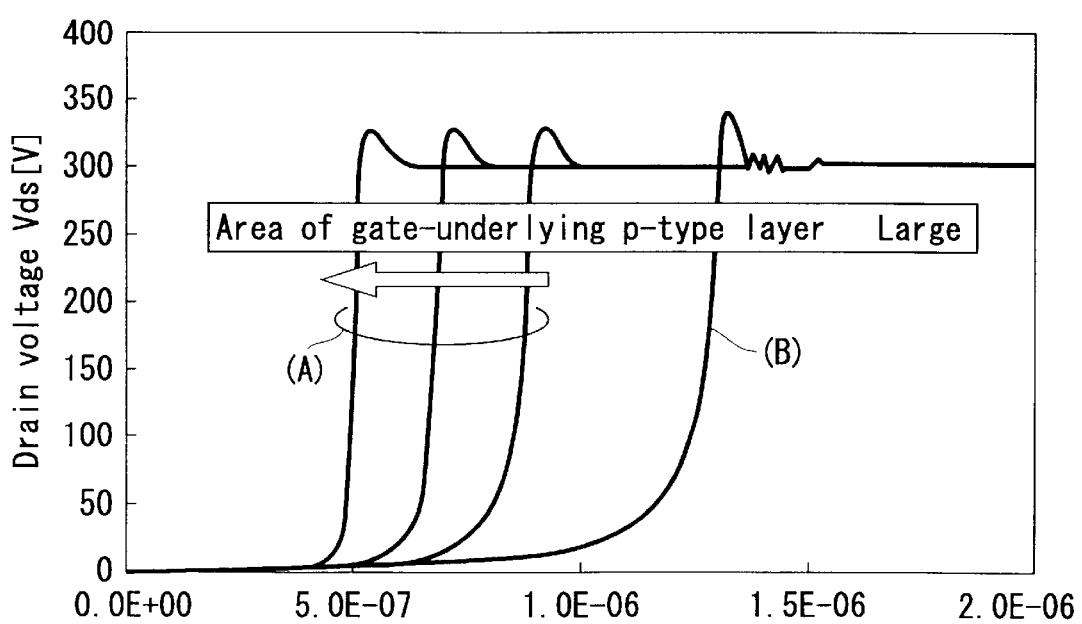
FIG. 6 is a graph showing a turnoff waveform of the MOSFET according to the first embodiment of the present invention and that of the prior art MOSFET to compare them with each other.

FIG. 6 shows a turnoff waveform of the MOSFET (A) according to the first embodiment of the present invention and that of the prior art MOSFET (B) to compare them with each other.

When a low drain voltage is applied, the p-type layer 14 decreases the gate-to-drain capacitance; therefore, switching speed is increased. When a high drain voltage is applied, the p-type layer 14 is depleted. Thus, the apparent gate length increases and so does the gate-to-drain capacitance. The jumping voltage can thus be suppressed.

As is apparent from FIG. 6, the switching speed becomes high with increase in the area of the p-type layer 14 to be depleted between p-type base layers 12 under the gate electrode 24.

Figure 7:
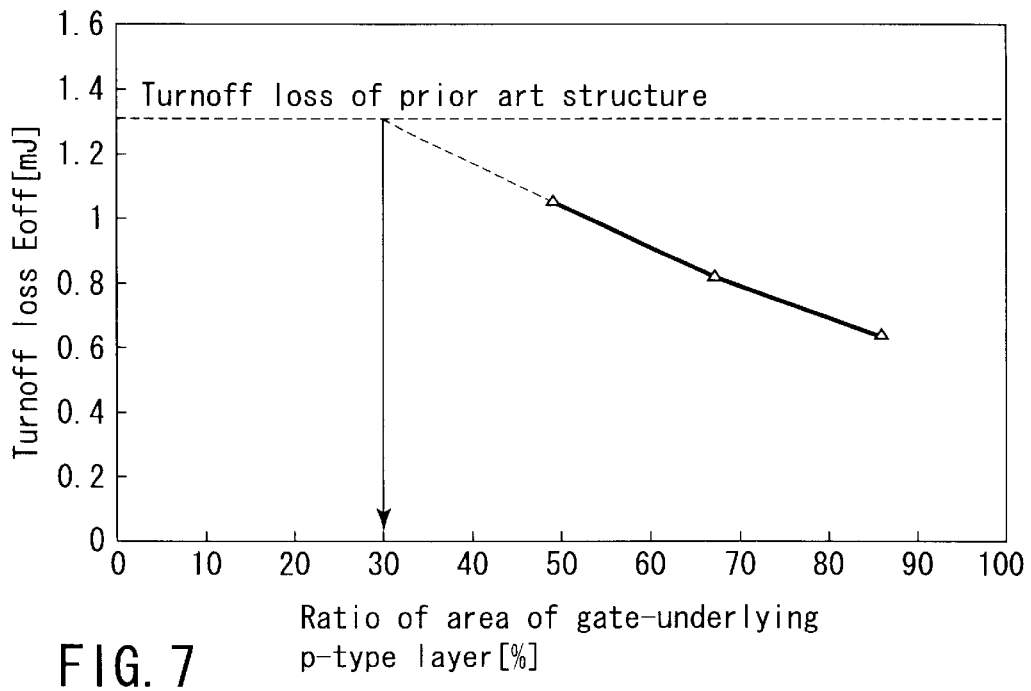
FIG. 7 is a graph showing variations in turnoff loss caused when a gate-underlying p-type layer varies in area in the MOSFET according to the first embodiment of the present invention.

FIG. 7 is a graph showing variations in turnoff loss (Eoff) caused when the area of the gate-underlying p-type layer 14 varies in the MOSFET according to the first embodiment. In this graph, the horizontal axis indicates the ratio of the p-type layer 14 to be depleted to a region between p-type base layers 12 under the gate electrode 24, while the vertical axis indicates a turnoff loss in an inductive load.

As shown in FIG. 7, when the ratio is 30% or more, the MOSFET becomes effective in high-speed switching and it is estimated that the turnoff loss becomes smaller than that (1.35 mJ) of the prior art MOSFET. It is thus desirable that the ratio be larger than 30%.

Figure 8:
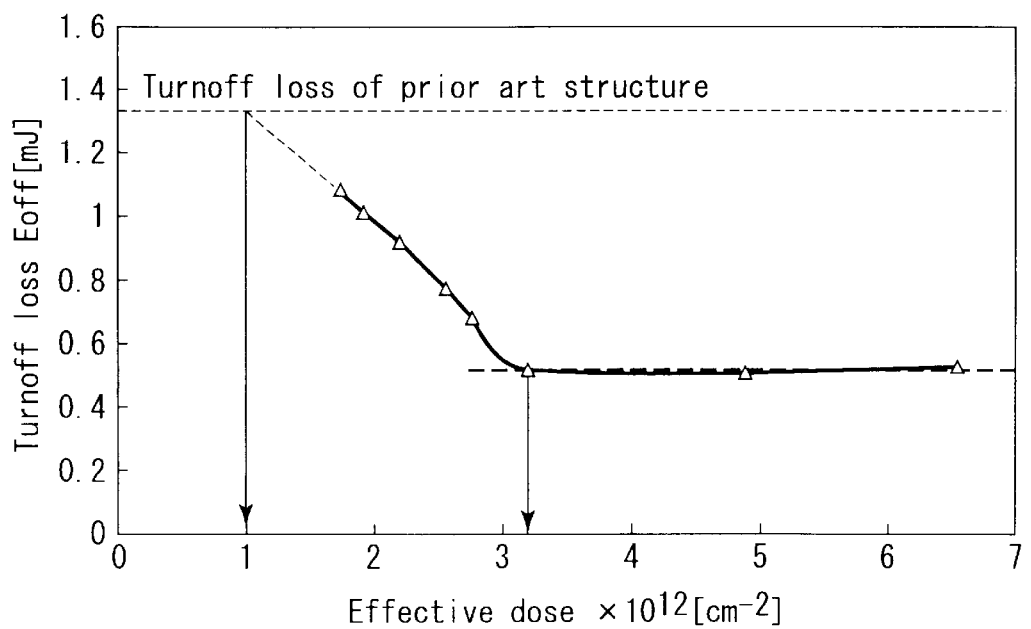
FIG. 8 is a graph showing variations in turnoff loss caused when a gate-underlying p-type layer varies in net dose in the MOSFET according to the first embodiment of the present invention.

FIG. 8 shows variations in turnoff loss caused when the gate-underlying p-type layer 14 varies in net dose (effective dose) in the MOSFET according to the first embodiment.

The net dose represents not the amount of impurity to be actually ion-implanted but the amount of impurity (concentration) that corresponds to the number of carriers existing in the p-type layer 14 and that is obtained by subtracting the amount of n-type impurity existing between p-type base layers 12 from the amount of p-type impurity.

If the net dose is small, the p-type layer 14 will be completely depleted at a low voltage; therefore, the degree of effectiveness of high-speed switching is low. When the net dose exceeds a given value, the p-type layer 14 is not depleted when a high voltage is applied and the capacitance does not increase. In this case, the switching speed can be increased, but the turnoff loss is fixed, thereby increasing switching noise as in the normal high-speed switching. It is thus desirable that the net dose of the p-type layer 14 be set at $$1 \times 10^{12} \text{ cm}^{-2} \text{ to } 3.2 \times 10^{12} \text{ cm}^{-2}.$$

Assume that dopant of the n-type low-resistance layer 11a is phosphorus (P) and that of the gate-underlying p-type layer 14 is boron (B) in order to actually manufacture a MOSFET. The layers 11a and 14 can be formed by diffusing the dopants at the same time from the viewpoint of a difference in diffusion constant.

Since the n-type low-resistance layer 11a and p-type layer 14 of high concentrations overlap each other, the net dose and the amount of impurity to be actually ion-implanted differ from each other. The amount of impurity to be ion-implanted has only to be controlled such that the net dose has the optimum value as shown in FIG. 8.

Figure 9:
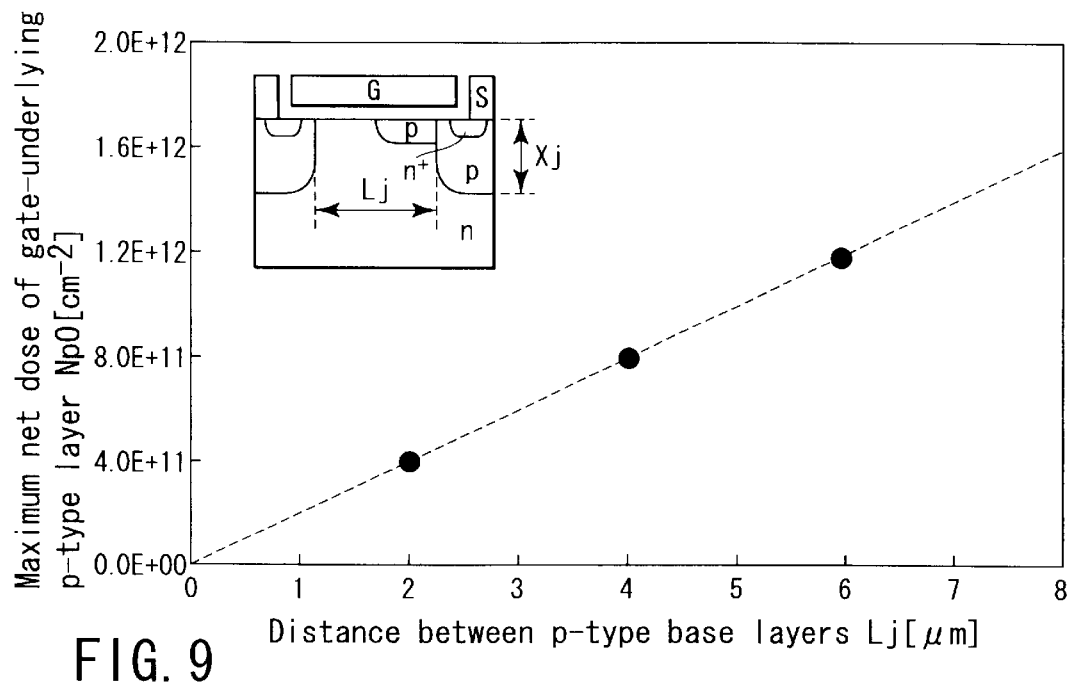
FIG. 9 is a graph showing a relationship between the distance between p-type base layers and the maximum net dose of the gate-underlying p-type layer in the MOSFET according to the first embodiment of the present invention.

FIG. 9 shows a relationship between the distance Lj between adjacent p-type base layers 12 and the maximum net dose Np0 of the gate-underlying p-type layer 14 that is effective in low noise in the MOSFET according to the first embodiment. In FIG. 9, the depth Xj of the p-type base layers 12 is 4 μm.

The maximum net dose Np0 is an upper limit at which the gate-underlying p-type layer 14 is depleted when a high voltage is applied. If the dose increases further, neither the layer 14 is depleted nor the gate capacitance is increased. Noise therefore increases. It is thus desirable that the net dose of the gate-underlying p-type layer 14 be not higher than the maximum net dose Np0.

As shown in FIG. 9, the maximum net dose Np0 is almost proportionate to the distance Lj between p-type base layers 12. It is thus desirable that the ratio (Np0/Lj) of the maximum net dose Np0 to the distance Lj between p-type base layers 12 be $2 \times 10^{15}$ cm$^{-3}$ or smaller.

If the p-type base layers 12 deepen, it is difficult to apply a drain voltage to the gate-underlying p-type layer 14 and thus difficult to deplete the layer 14. Therefore, the maximum net dose Np0 is inversely proportionate to the depth Xj of the p-type base layers 12.

If the depth Xj is 4 μm as shown in FIG. 9, it is desirable that the ratio (Np0/(Lj·Xj)) of the maximum net dose Np0 and the product of the depth Xj of the base layers 12 and distance Lj between them be $5 \times 10^{18}$ cm$^{-4}$ or smaller.

(Second Embodiment)

Figure 10:
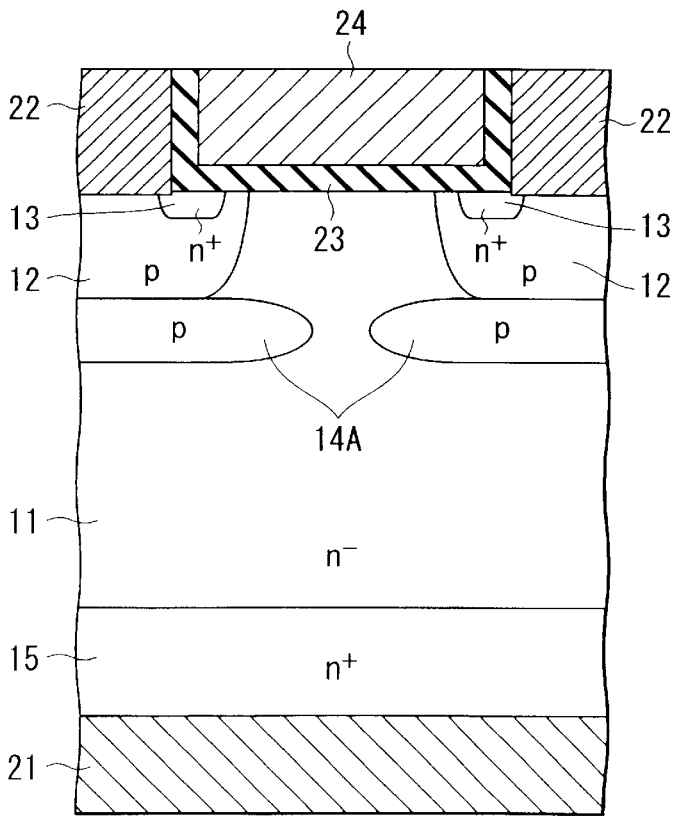
FIG. 10 is a cross-sectional view showing a structure of a main part of a power MOSFET according to a second embodiment of the present invention.

FIG. 10 shows an example of a structure of a power MOSFET according to a second embodiment of the present invention. In FIG. 10, the same components as those of the MOSFET shown in FIG. 1 are denoted by the same reference numerals and their detailed descriptions are omitted. Only the components different from those in FIG. 1 will be described. The formation of an n-type low-resistance layer is omitted from FIG. 10.

Referring to FIG. 10, p-type layers 14A serving as fifth semiconductor layers are buried in an n$^-$-type drift layer 11. The p-type layers 14A are arranged below their respective p-type base layers 12 adjacent to each other. The p-type layers 14A are connected to the p-type base layers 12, respectively. Each of the p-type layers 14A is formed like a strip in a first direction along the p-type base layers 12. The p-type layers 14A each have impurity concentration that is lower than that of each of the p-type base layers 12.

As in the MOSFET shown in FIG. 1, the p-type layers 14A are depleted by applying a high drain voltage. As the opposing area of a gate electrode 24 and a drain electrode 21 increases, the gate-to-drain capacitance increases. High-speed, low-noise switching characteristics can thus be achieved.

If the p-type layers 14A are formed between the gate electrode 24 and drain electrode 21, substantially the same advantages as those of the first embodiment can be obtained. Consequently, the p-type layers depleted by a high drain voltage are not always formed on the surface of an n$^-$-type drift layer (or an n-type low-resistance layer).

The manufacturing process of the MOSFET according to the second embodiment is slightly more complicated than that of the MOSFET according to the first embodiment. In other words, the manufacturing process is complicated by the step of forming the p-type layers 14A in the n$^-$-type drift layer 11. However, as an electric field concentrates near the bottoms of the p-type base layers 12 when a high voltage is applied, the breakdown voltage becomes high than that in the MOSFET shown in FIG. 1.

(Third Embodiment)

Figure 11:
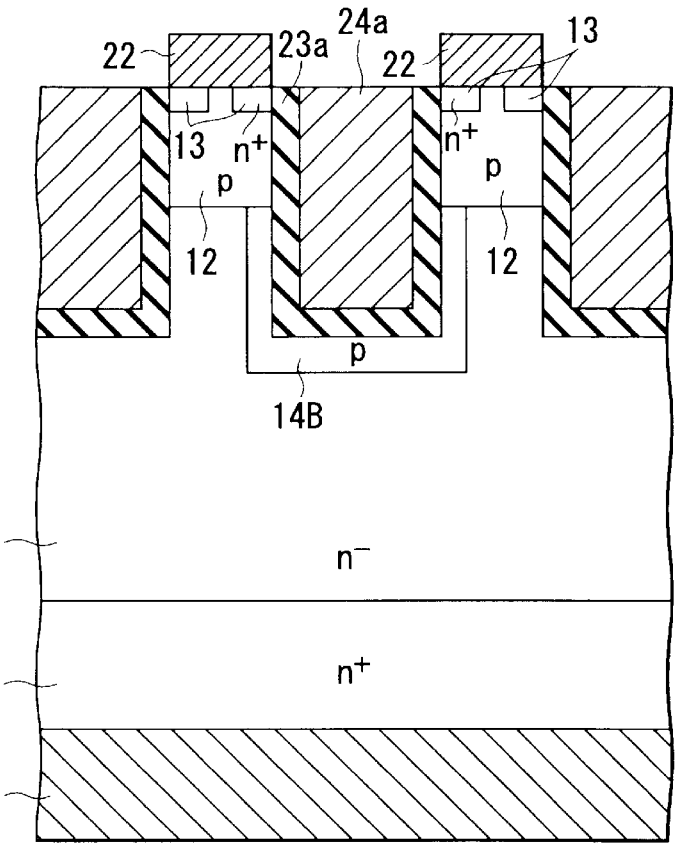
FIG. 11 is a cross-sectional view showing a structure of a main part of a power MOSFET according to a third embodiment of the present invention.

FIG. 11 shows an example of a structure of a power MOSFET according to a third embodiment of the present invention. In FIG. 11, the same components as those of the MOSFET shown in FIG. 1 are denoted by the same reference numerals and their detailed descriptions are omitted. Only the components different from those in FIG. 1 will be described. The formation of an n-type low-resistance layer is omitted from FIG. 11.

Referring to FIG. 11, a gate electrode 24a serving as a control electrode is buried in a surface area of an n$^-$-type drift layer 11 with a gate insulation film 23a interposed therebetween. In other words, a gate electrode 24a having a trench structure (trench gate) is formed like a strip between adjacent two p-type base layers 12. A p-type layer 14B serving as a fifth semiconductor layer is formed around the trench gate 24a. The p-type layer 14B is connected to one of the p-type base layers 12 and has impurity concentration that is lower than that of the p-type base layers 12.

In the second embodiment, the p-type layer 14B is not depleted when a low drain voltage is applied. The gate-to-drain capacitance is therefore decreased to allow a high-speed switching operation to be performed. The p-type layer 14B is depleted when a high drain voltage is applied. Thus, the apparent gate area increases, as does the gate-to-drain capacitance, with the result that noise is reduced. Substantially the same advantages as those of the MOSFET having a planar gate electrode shown in FIG. 1, that is, high-speed, low-noise switching characteristics can be obtained.

In the MOSFET according to the second embodiment, the number of trench gates 24a can be varied and so can be the ratio of the area of the p-type layer 14B to that of the trench gate 24a. It is thus possible to obtain the same advantages as those of the MOSFET shown in FIG. 1 in which the area ratio of the p-type layer is varied.

Figure 12:
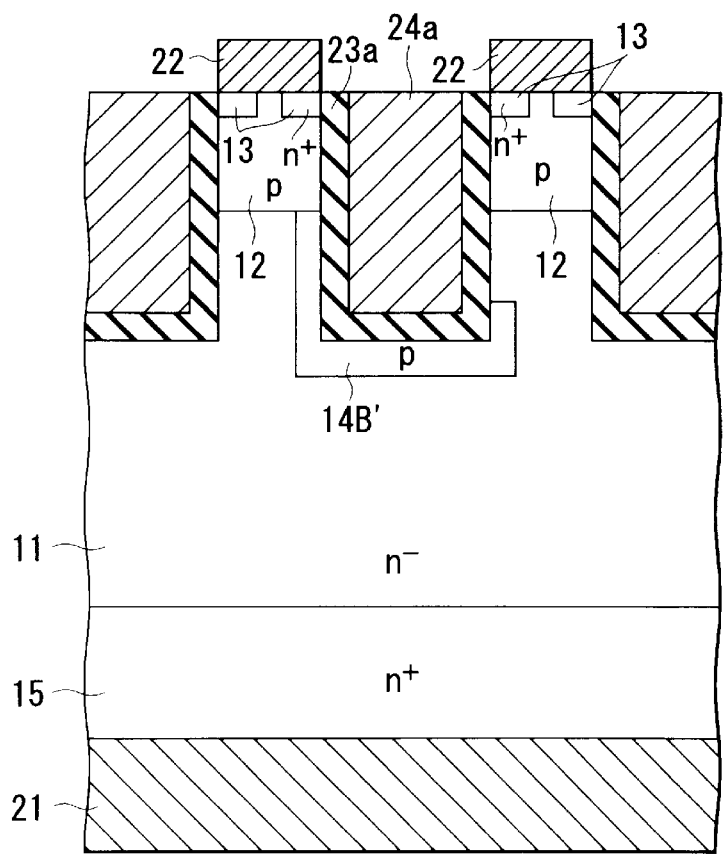
FIG. 12 is a cross-sectional view showing another structure of the main part of a power MOSFET according to the third embodiment of the present invention.

For example, a p-type layer 14B' can be formed so as to surround one sidewall of the trench gate 24a and the bottom thereof as shown in FIG. 12. In other words, a p-type layer 14B' can be formed on the trench gate 24a excluding part of the sidewall thereof. In this case, a channel through which no current flows completely need not be formed; therefore, low on-resistance can be achieved.

(Fourth Embodiment)

Figure 13:
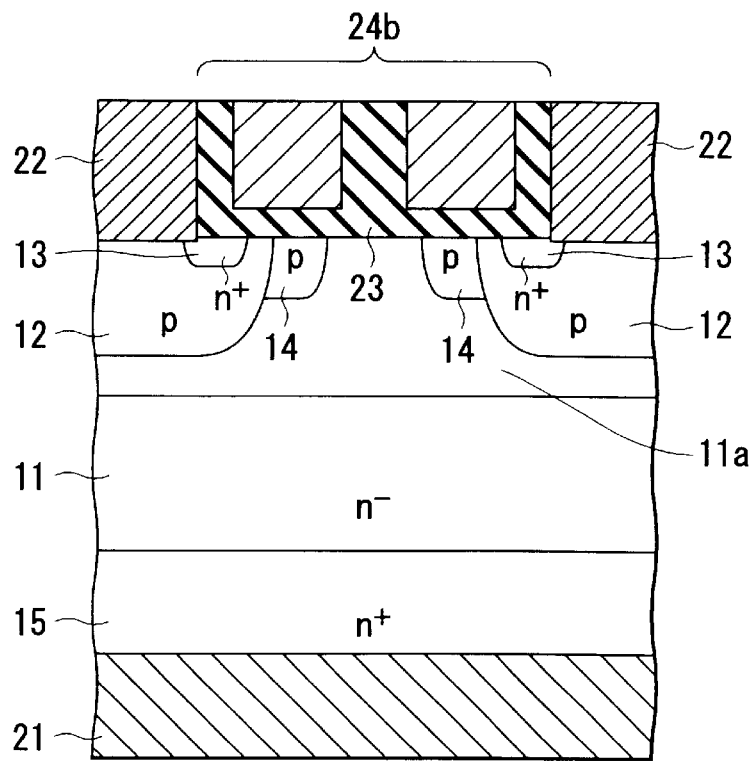
FIG. 13 is a cross-sectional view showing a structure of a main part of a power MOSFET according to a fourth embodiment of the present invention.

FIG. 13 shows an example of a structure of a power MOSFET according to a fourth embodiment of the present invention. In FIG. 13, the same components as those of the MOSFET shown in FIG. 1 are denoted by the same reference numerals and their detailed descriptions are omitted. Only the components different from those in FIG. 1 will be described. The MOSFET shown in FIG. 13 includes an n-type low-resistance layer.

Referring to FIG. 13, a gate electrode 24b serving as a control electrode has a split gate structure. Two gate-underlying p-type layers 14 each serving as a fifth semiconductor layer are formed in a surface area of an n-type low-resistance layer 11a. The two gate-underlying p-type layers 14 are connected to adjacent p-type base layers 12, respectively and have impurity concentration that is lower than that of the p-type base layers 12.

If a gate electrode has a split gate structure, the gate capacitance decreases to increase the speed of switching. High-speed switching characteristics can thus be achieved when the gate-underlying p-type layers 14 are formed.

As a process of manufacturing a MOSFET according to the fourth embodiment, a gate electrode 24b can be formed (split) after a gate-underlying p-type layer 14 is formed or after a gate-underlying p-type layer 14 is formed on the entire surface of an n-type low-resistance layer 11a. Using the gate electrode 24b as a mask, the n-type low-resistance layer 11a can be formed (the p-type layer 14 can be split).

Figure 14:
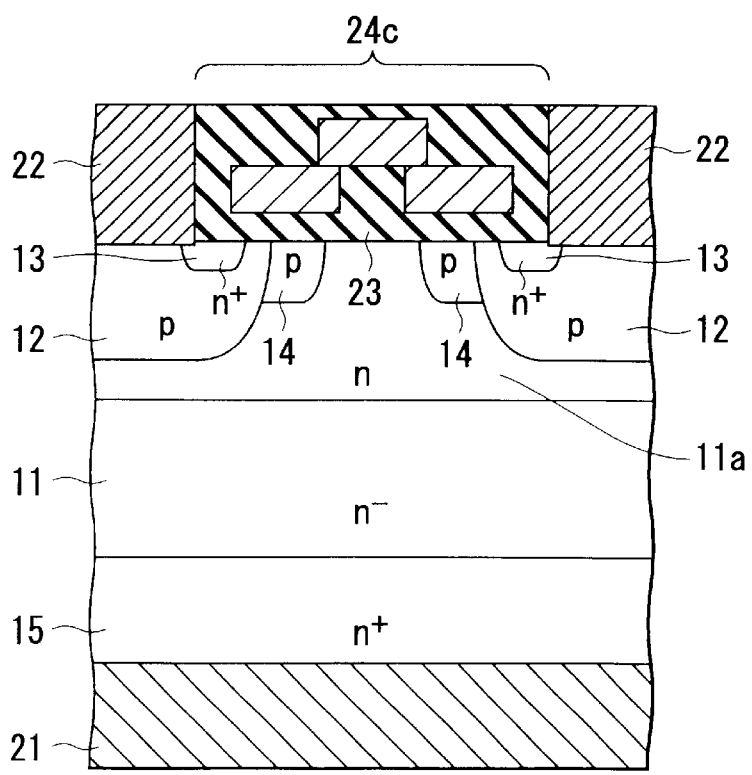
FIG. 14 is a cross-sectional view showing another structure of the main part of a power MOSFET according to the fourth embodiment of the present invention.

The gate structure of the gate electrode 24b is not limited to the above split gate structure. For example, a gate electrode (control electrode) 24c having a terrace gate structure can be used as shown in FIG. 14. In this case, too, substantially the same advantages as those in the split gate structure can be obtained.

(Fifth Embodiment)

Figure 15:
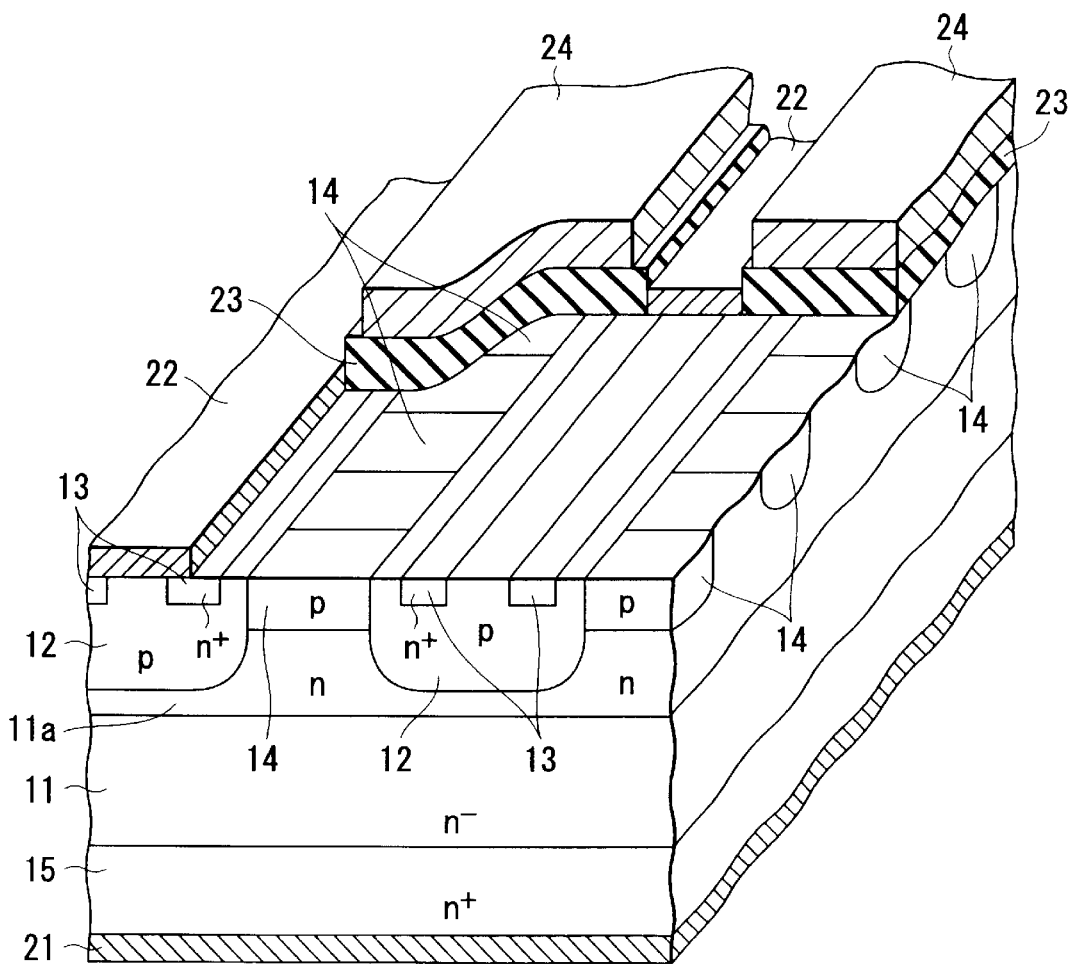
FIG. 15 is a partially cutaway perspective view showing a structure of a power MOSFET according to a fifth embodiment of the present invention.

FIG. 15 shows an example of a structure of a power MOSFET according to a fifth embodiment of the present invention. In FIG. 15, the same components as those of the MOSFET shown in FIG. 1 are denoted by the same reference numerals and their detailed descriptions are omitted. Only the components different from those in FIG. 1 will be described. The MOSFET shown in FIG. 15 includes an n-type low-resistance layer.

Referring to FIG. 15, a plurality of p-type base layers 12 serving as second semiconductor layers are each formed like a strip in a first direction perpendicular to the front of the MOSFET. A plurality of gate-underlying p-type layers 14 serving as fifth semiconductor layers are each formed like a strip in a second direction perpendicular to the p-type base layers 12.

Not only substantially the same advantages as those of the MOSFET shown in FIG. 1 can be obtained but other advantages can be expected from the MOSFET shown in FIG. 15. For example, a p-type layer 14 to be depleted can be formed without any influence of misalignment.

(Sixth Embodiment)

Figure 16:
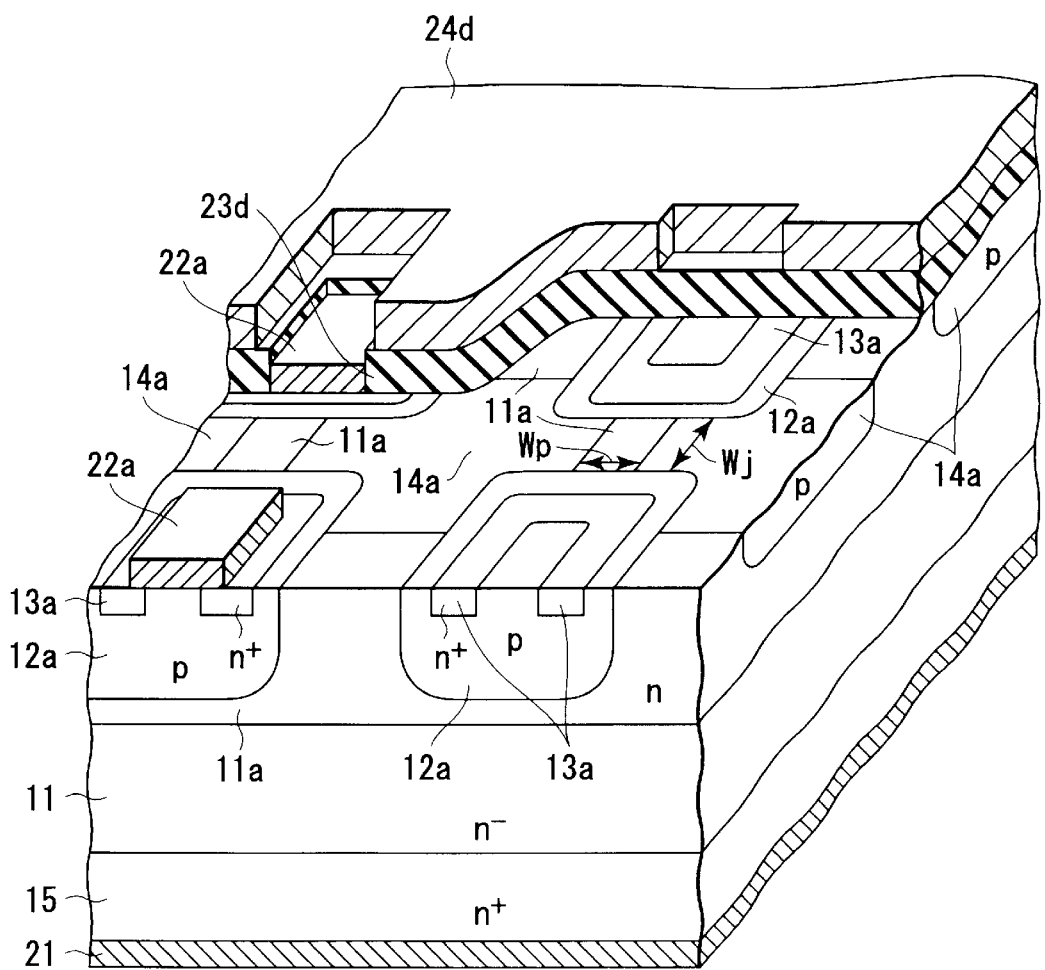
FIG. 16 is a partially cutaway perspective view showing a structure of a power MOSFET according to a sixth embodiment of the present invention.

FIG. 16 shows an example of a structure of a power MOSFET according to a sixth embodiment of the present invention. In FIG. 16, the same components as those of the MOSFET shown in FIG. 1 are denoted by the same reference numerals and their detailed descriptions are omitted. Only the components different from those in FIG. 1 will be described. The MOSFET shown in FIG. 16 includes an n-type low-resistance layer.

Referring to FIG. 16, a plurality of p-type base layers 12a serving as second semiconductor layers are arranged in a latticed manner (or staggered manner) in a surface area of an n-type low-resistance layer 11a. A plurality of gate-underlying p-type layers 14a serving as fifth semiconductor layers are each formed like a rectangle around adjacent four p-type base layers 12a.

A plurality of n⁺-type source layers 13a serving as third semiconductor layers are each formed like a ring in the surface area of each of the p-type base layers 12a. Rectangular source electrodes 22a serving as first main electrodes are provided in their respective positions that correspond to the p-type base layers 12a and n⁺-type source layers 13a. A gate electrode 24d serving as a control electrode is formed on the area excluding the source electrodes 22a with a gate insulation film 23d interposed therebetween.

Substantially the same advantages as those of the MOSFET shown in FIG. 1 can be obtained from the MOSFET shown in FIG. 16. Since, furthermore, an electric field is eased at a corner of each of the p-type base layers 12a, a breakdown voltage can be prevented from decreasing.

For example, an interval Wp between adjacent gate-underlying p-type layers 14a is made smaller than an interval Wj between adjacent p-type base layers 12a, as shown in FIG. 16. This is eventually equal to the decrease in the area of the p-type base layers 12a. Thus, an electric field generated at a junction between each p-type base layer 12a and each low-resistance layer 11a is eased. It is thus possible to prevent a breakdown voltage from decreasing. Such an advantage can be obtained from the structure shown in FIG. 15 in which the p-type base layers 12 are each shaped like a strip.

Figure 17:
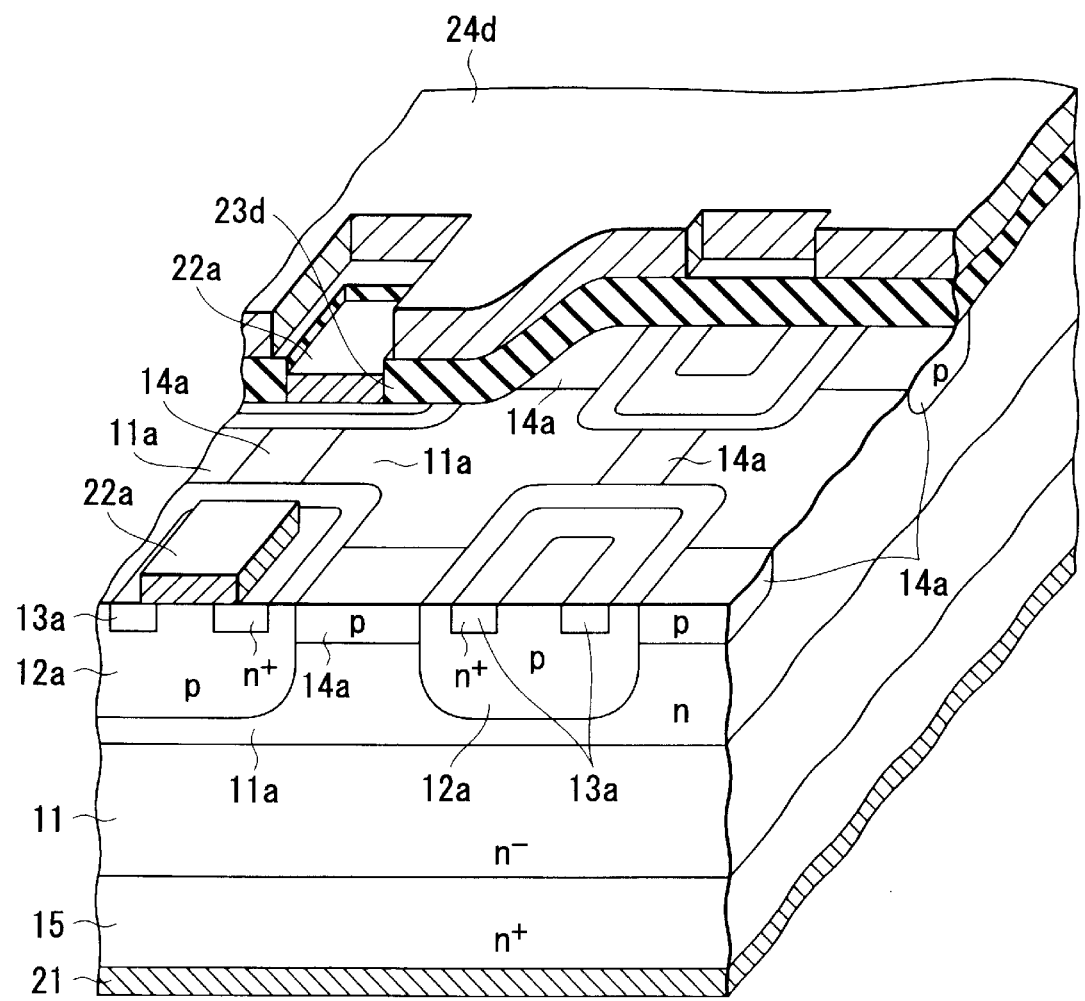
FIG. 17 is a partially cutaway perspective view showing another structure of the power MOSFET according to the sixth embodiment of the present invention.

FIG. 17 shows another example of the structure of the power MOSFET according to the sixth embodiment. In this example, the arrangement of gate-underlying p-type layers 14a and n-type low-resistance layers 11a is opposite to that in the structure of the power MOSFET shown in FIG. 16.

Referring to FIG. 17, a plurality of p-type base layers 12a serving as second semiconductor layers are arranged in a latticed manner (or staggered manner) in a surface area of an n-type low-resistance layer 11a. A plurality of gate-underlying p-type layers 14a serving as fifth semiconductor layers are each formed like a rectangle between adjacent two p-type base layers 12a.

Substantially the same advantages as those of the MOSFET shown in FIG. 16 can be obtained even from the structure shown in FIG. 17.

Figure 18:
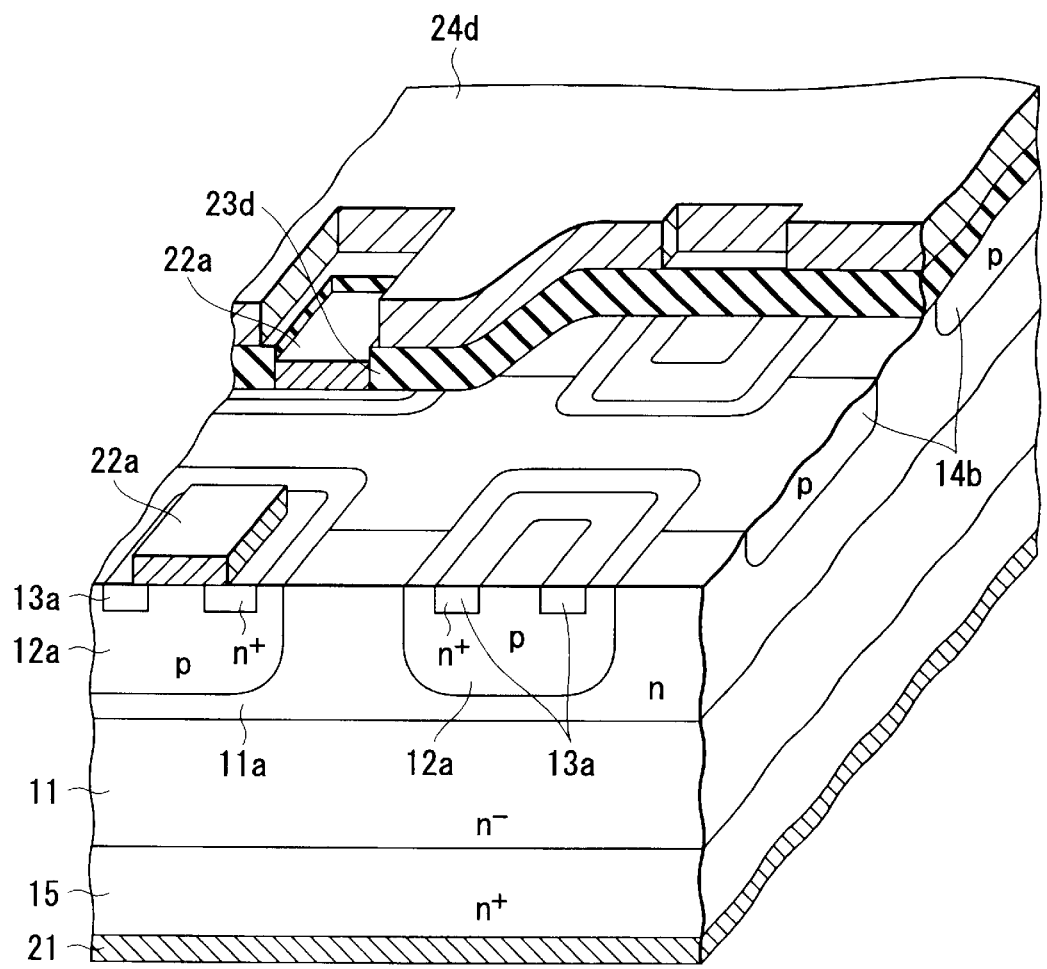
FIG. 18 is a partially cutaway perspective view showing still another structure of the power MOSFET according to the sixth embodiment of the present invention.

FIG. 18 shows still another example of the structure of the power MOSFET according to the sixth embodiment. In this example, a gate-underlying p-type layers are each shaped like a strip.

Referring to FIG. 18, a plurality of p-type base layers 12a serving as second semiconductor layers are arranged in a latticed manner (or staggered manner) in a surface area of an n-type low-resistance layer 11a. A plurality of gate-underlying p-type layers 14a serving as fifth semiconductor layers are each formed like a strip between adjacent p-type base layers 12a.

Substantially the same advantages as those of the MOSFET shown in FIG. 16 can be obtained even from the structure shown in FIG. 18.

Figure 19:
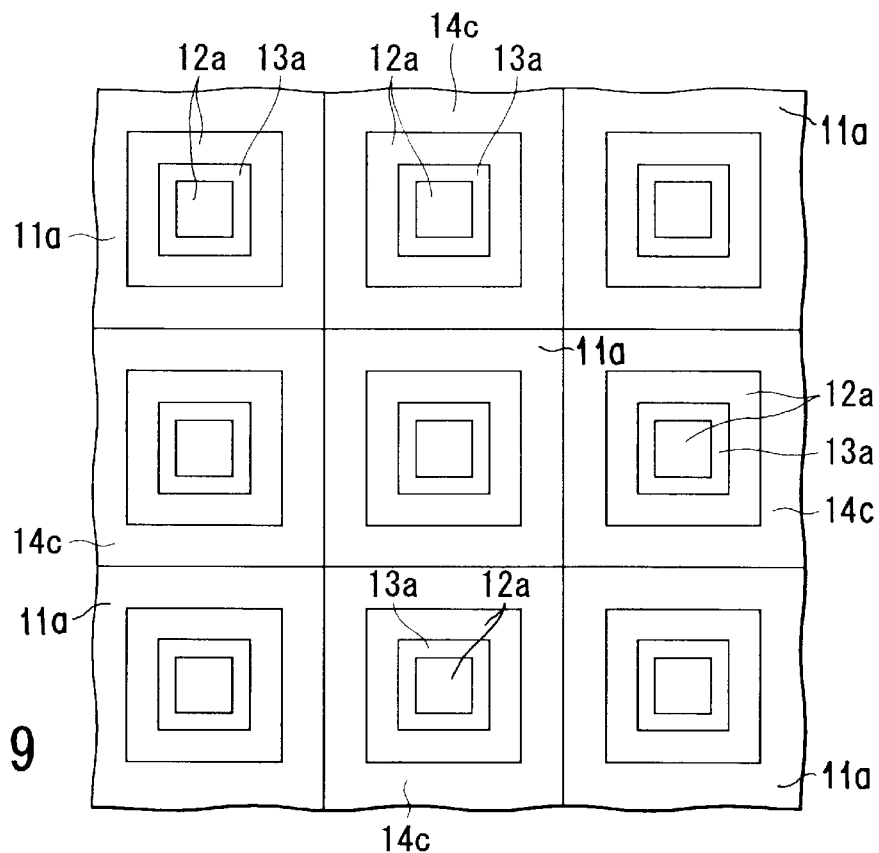
FIG. 19 is a plan view showing an example of layout of gate-underlying p-type layers in the power MOSFET according to the sixth embodiment of the present invention.
Figure 20:
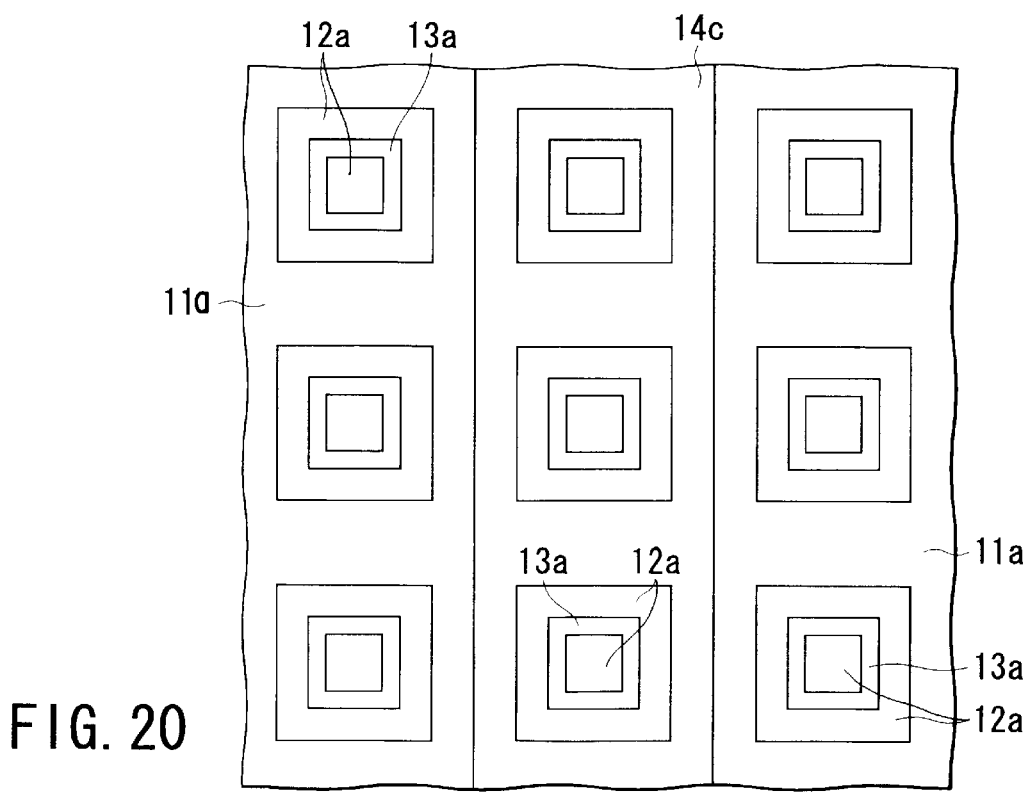
FIG. 20 is a plan view showing another example of layout of gate-underlying p-type layers in the power MOSFET according to the sixth embodiment of the present invention.
Figure 21:
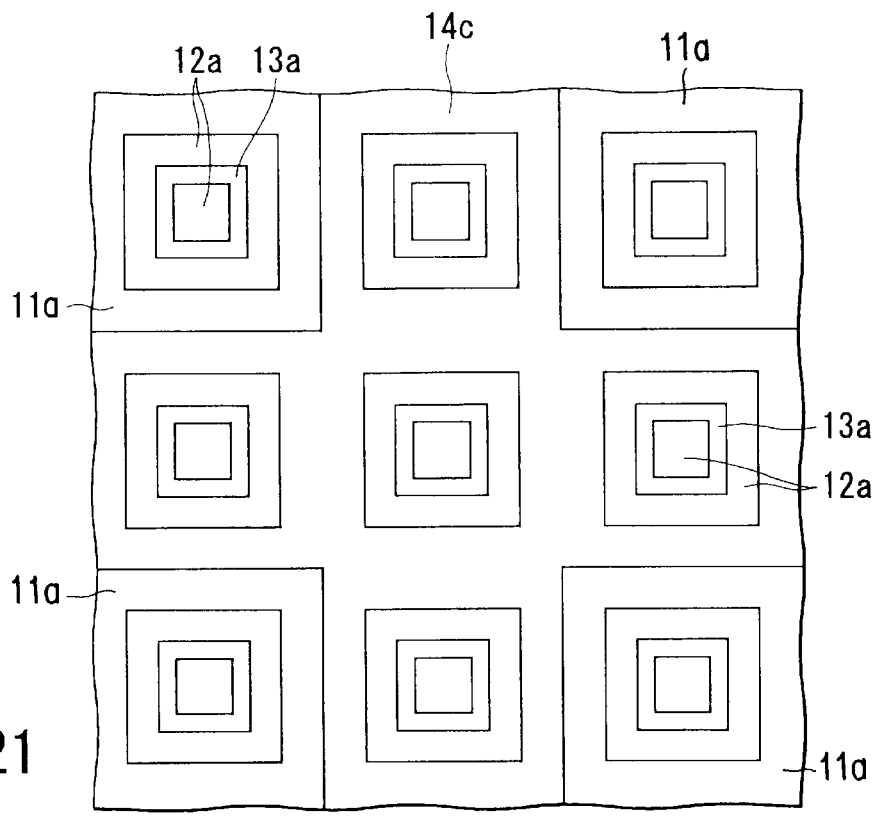
FIG. 21 is a plan view showing still another example of layout of gate-underlying p-type layers in the power MOSFET according to the sixth embodiment of the present invention.

FIGS. 19 to 21 each show an example of layout of gate-underlying p-type layers in the power MOSFET according to the sixth embodiment.

FIG. 19 shows an example of the layout of gate-underlying p-type layers when p-type base layers are arranged in a latticed manner (or staggered manner). In this example, a plurality of gate-underlying p-type layers 14c serving as fifth semiconductor layers are arranged in a staggered manner so as to surround some of p-type base layers 12a serving as second semiconductor layers.

FIG. 20 shows another example of the layout of gate-underlying p-type layers when p-type base layers are arranged in a latticed manner (or staggered manner). In this example, a plurality of gate-underlying p-type layers 14c serving as fifth semiconductor layers are arranged in one direction and each shaped like a strip so as to surround some of p-type base layers 12a serving as second semiconductor layers.

FIG. 21 shows still another example of the layout of gate-underlying p-type layers when p-type base layers are arranged in a latticed manner (or staggered manner). In this example, a plurality of gate-underlying p-type layers 14c serving as fifth semiconductor layers are arranged in two directions and each shaped like a strip so as to surround some of p-type base layers 12a serving as second semiconductor layers.

The MOSFET according to the sixth embodiment can easily be achieved with the structures shown in FIGS. 19 to 21.

(Seventh Embodiment)

Figure 22:
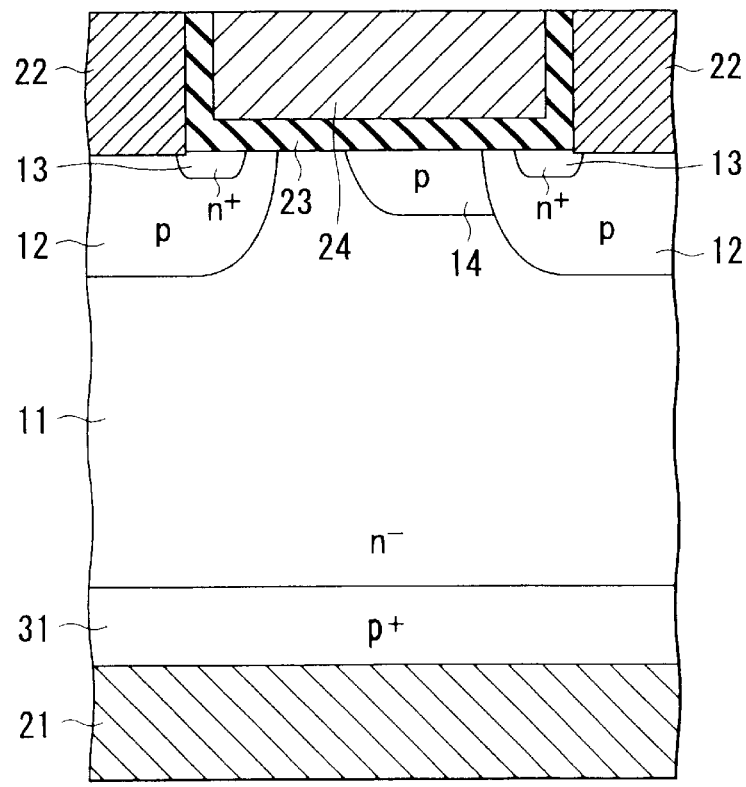
FIG. 22 is a cross-sectional view showing a structure of a main part of an IGBT according to a seventh embodiment of the present invention.

FIG. 22 shows an example of an IGBT according to a seventh embodiment of the present invention. In FIG. 22, the same components as those of the MOSFET shown in FIG. 1 are denoted by the same reference numerals and their detailed descriptions are omitted. Only the components different from those in FIG. 1 will be described. The formation of an n-type low-resistance layer is omitted from FIG. 22.

The IGBT (having a non-punch-through structure) shown in FIG. 22 has substantially the same structure as that of the MOSFET shown in FIG. 5 in which no n-type low-resistance layer is formed. A plurality of p-type base layers 12 serving as second semiconductor layers are selectively formed by diffusion on one surface (top) of an n⁻-type drift layer 11 serving as a first semiconductor layer. Each of the p-type base layers 12 is formed like a strip in a first direction that is perpendicular to the plan of FIG. 22. At least one n⁺-type source layer 13 serving as a third semiconductor layer is selectively formed by diffusion in a surface area of each of the p-type base layers 12.

A p-type layer 14 serving as a fifth semiconductor layer is selectively formed in a surface area of the n⁻-type drift layer 11 between adjacent two p-type base layers 12. In the seventh embodiment, the p-type layer 14 is formed like a strip in the first direction along the p-type base layers 12. The p-type layer 14 is connected to one of the two p-type base layers 12 and has impurity concentration that is lower than that of the layers 12.

A p⁺-type drain layer 31 serving as a fourth semiconductor layer is formed on the other surface (bottom) of the n⁻-type drift layer 11. A drain electrode 21 serving as a second main electrode contacts the entire surface of the p⁺-type drain layer 31.

A source electrode 22, which includes part of the n⁺-type source layers 13, is formed as a first main electrode on each of the p-type base layers 12. The source electrodes 22 are each formed like a strip in the first direction. A planar gate electrode 24 is formed as a control electrode through a gate insulation film 23 between source electrodes 22. In other words, the gate electrode 24 is formed within a region extending from the n⁺-type source layers 13 in one p-type base layer 12 to the n⁺-type source layers 13 in another p-type base layer 12 via the n⁻-type drift layer 11a and p-type layer 14. The gate insulation film 23 has a thickness of about 0.1 μm.

An n⁺-type drain layer 15 in the MOSFET is formed of a p⁺-type drain layer 31. Thus, the MOSFET operates as an IGBT.

If the present invention is a MOS gate element, the switching characteristic is determined almost uniquely by the capacitance that depends upon the MOS gate structure. The MOS gate structure according to the seventh embodiment is effective in the IGBT.

Figure 23:
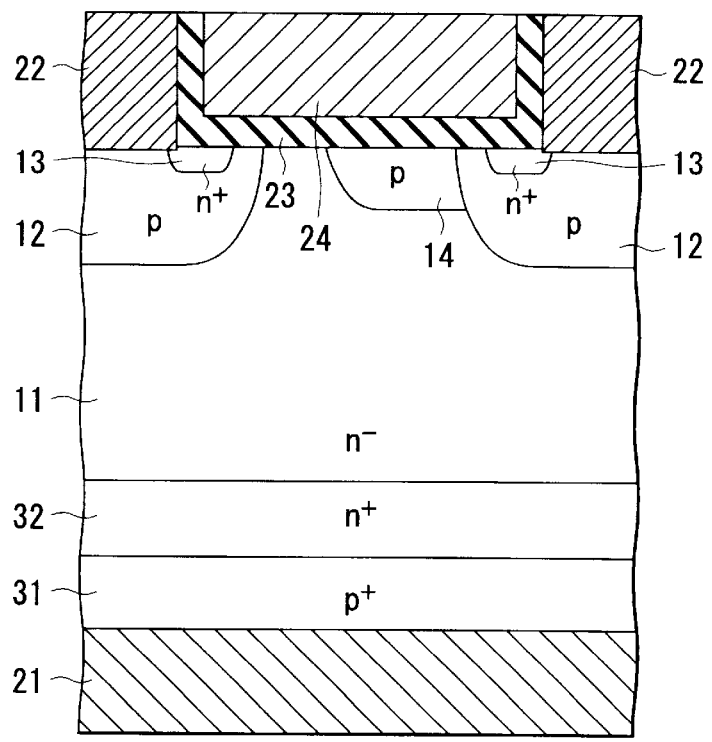
FIG. 23 is a cross-sectional view showing another structure of the main part of the IGBT according to the seventh embodiment of the present invention.

The IGBT is not limited to a non punch-through type but can be applied to a punch-through type as illustrated in FIG. 23. The punch-through type IGBT includes an n⁺-type buffer layer 32 serving as a sixth semiconductor layer between the n⁻-type drift layer 11 and p⁺-type drain layer 31.

Figure 24:
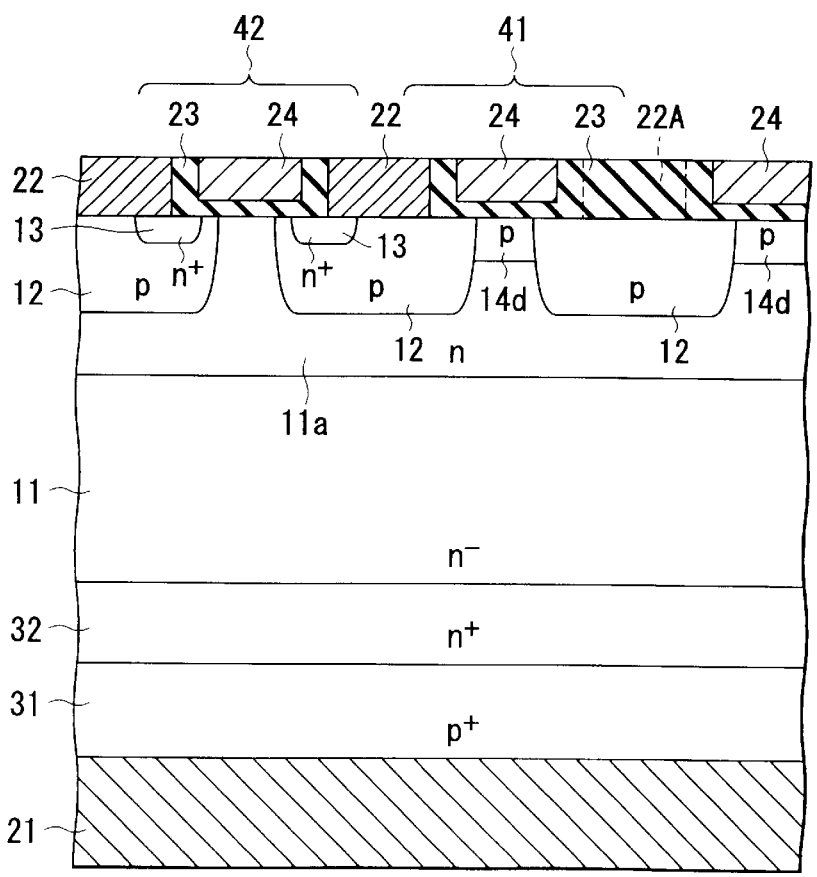
FIG. 24 is a cross-sectional view showing still another structure of the main part of the IGBT according to the seventh embodiment of the present invention.

FIG. 24 shows another example of the structure of the IGBT according to the seventh embodiment. In FIG. 24, the same components as those of the MOSFET shown in FIG. 23 are denoted by the same reference numerals and their detailed descriptions are omitted. Only the components different from those in FIG. 23 will be described. The IGBT shown in FIG. 24 includes an n-type low-resistance layer. The IGBT is of a punch-through type.

Some IGBTs include a dummy cell (second cell) 41 in which part of a source contact (source electrode 22A) is not formed, as illustrated in FIG. 24. The conductivity of the n⁻-type drift layer 11 can greatly be varied if no source contact is formed.

In the dummy cell 41 of the IGBT so configured, a gate-underlying p-type layer 14d is formed as a fifth semiconductor layer. The p-type layer 14d completely covers the surface area of the n-type low-resistance layer 11a. On the other hand, no gate-underlying p-type layer is formed in a normal cell (first cell) having a source contact (source electrode 22) on either side. When a low drain voltage is applied, the gate-to-drain capacitance decreases to increase switching speed. When a high drain voltage is applied, the gate-to-drain capacitance increases to reduce switching noise.

The seventh embodiment is not limited to an IGBT having a planar type MOS gate structure as shown in FIGS. 22 to 24 but can be applied to an IGBT having a trench type MOS gate structure.

(Eighth Embodiment)

Figure 25:
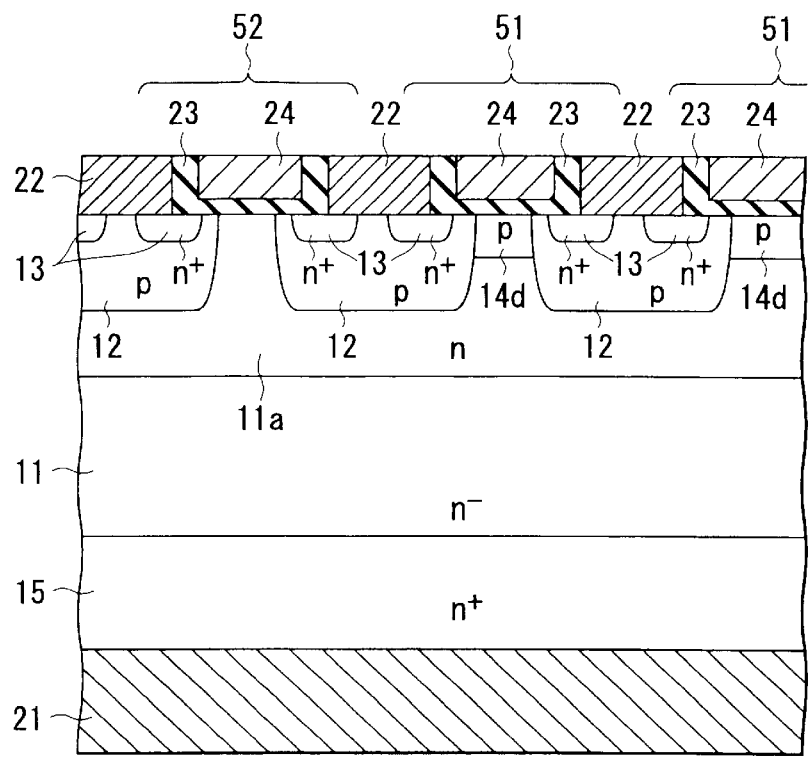
FIG. 25 is a cross-sectional view showing a structure of a main part of a power MOSFET according to an eighth embodiment of the present invention.

FIG. 25 shows an example of a structure of a power MOSFET according to an eighth embodiment of the present invention. In FIG. 25, the same components as those of the IGBT shown in FIG. 24 are denoted by the same reference numerals and their detailed descriptions are omitted. Only the components different from those in FIG. 24 will be described. The MOSFET shown in FIG. 25 includes an n-type low-resistance layer.

As shown in FIG. 25, the MOSFET has a cell structure in which MOS cells (second cells) 51 each including a gate-underlying p-type layer 14d as a fifth semiconductor layer and MOS cells (first cells) 52 including no gate-underlying p-type layer are mixed. The gate-underlying p-type layer 14d is formed so as to completely cover the surface area of an n-type low-resistance layer 11a.

The density (number) of the MOS cells (second cells) 51 is varied. It is thus possible to obtain the same advantages as those of the MOSFET in which the area ratio of the gate-underlying p-type layer 14d is varied. The ratio of the number of cells 51 to the total number of cells 51 and 52 in the entire device corresponds to the ratio of the gate-underlying p-type layer 14 shown in FIG. 7.

The manufacturing process of the MOSFET shown in FIG. 25 is simpler than that of the IGBT (shown in FIG. 24) in which no source contact is formed; therefore, it is advantageous in manufacturing.

Assume that a gate electrode 24 of the MOS cell 52 including no gate-underlying p-type layer has a split gate structure and a gate electrode 24 of the MOS cell 51 including a gate-underlying p-type layer 14d has a normal structure. When a low voltage is applied, the capacitance of the MOS cell 52 depends upon the area of the gate electrode 24 of the MOS cell 52 and thus the gate-to-drain capacitance decreases and the switching speed increases. On the other hand, when a high voltage is applied, the area of the gate electrode 24 of the MOS cell 51 increases and low-noise switching can be achieved.

The gate-underlying p-type layer 14d need not always be formed so as to completely cover the surface area of the n-type low-resistance layer 11a. Even though the p-type layer 14d partly covers the surface area of the layer 11a, the same advantages can be obtained. In this case, too, it is important to design a device based on the ratio of the gate area of the entire device to the area of the gate-underlying layer (e.g., the surface area of the n-type low-resistance layer 11a). It is desirable that a net dose have a value as shown in FIG. 8.

Figure 26:
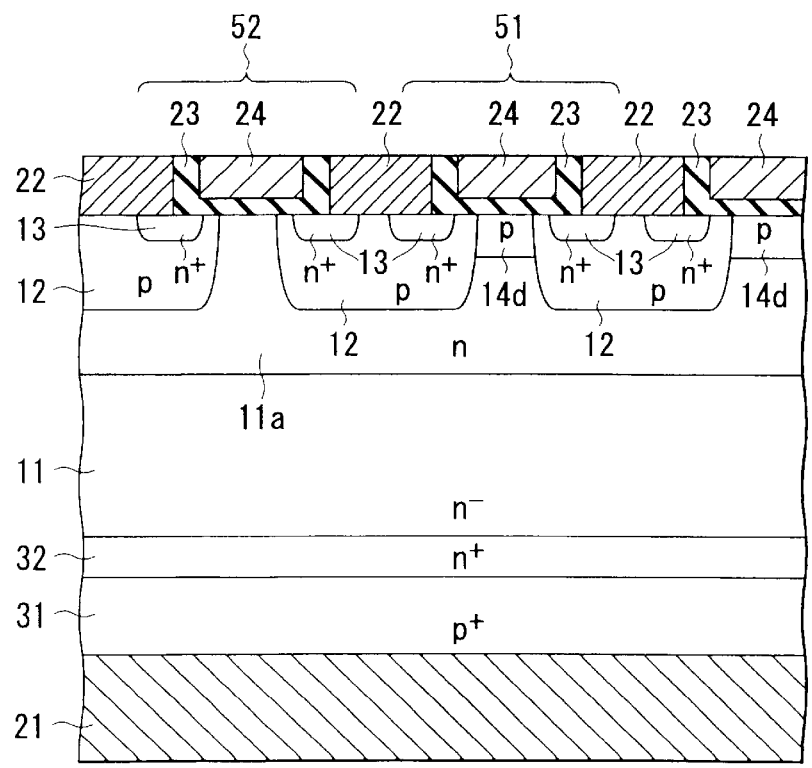
FIG. 26 is a cross-sectional view showing a structure of a main part of an IGBT according to an eighth embodiment of the present invention.

The eighth embodiment is not limited to the MOSFET but can be applied to an IGBT having a punch-through structure (or an IGBT having a non-punch-through structure, not shown) as shown in FIG. 26.

(Ninth Embodiment)

Figure 27:
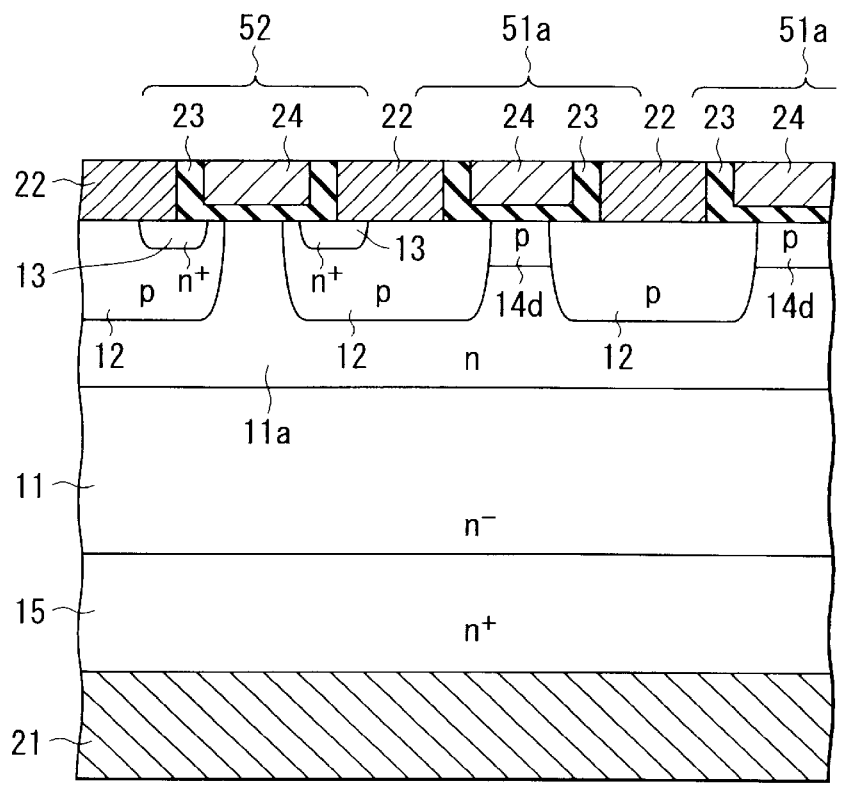
FIG. 27 is a cross-sectional view showing a structure of a main part of a power MOSFET according to a ninth embodiment of the present invention.

FIG. 27 shows a structure of a power MOSFET according to a ninth embodiment of the present invention. In FIG. 27, the same components as those of the MOSFET shown in FIG. 25 are denoted by the same reference numerals and their detailed descriptions are omitted. Only the components different from those in FIG. 25 will be described.

The MOSFET shown in FIG. 27 comprises MOS cells (first cells) 51a each having a gate-underlying p-type layer 14d as a fifth semiconductor layer. None of the MOS cells 51a include an n⁺-type source layer 13 serving as a third semiconductor layer.

The MOSFET so configured allows a breakdown voltage to increase. Even though a voltage is applied to a gate electrode 24, the MOS cells 51a do not operate because they do not have a path over which electrons flow. In other words, the MOS cells 51a only serve to increase gate-to-drain capacitance when a high drain voltage is applied. The MOS cells 51a do not therefore exert an influence upon on-resistance even though they do not have an n⁺-type source layer.

The MOS cells 51a have no parasitic bipolar transistors because they have no n⁺-type source layers. Even though an avalanche breakdown occurs when a high voltage is applied, holes generated can quickly be discharged. Thus, high-speed, low-noise switching characteristics can be achieved and avalanche tolerance can be improved.

Figure 28:
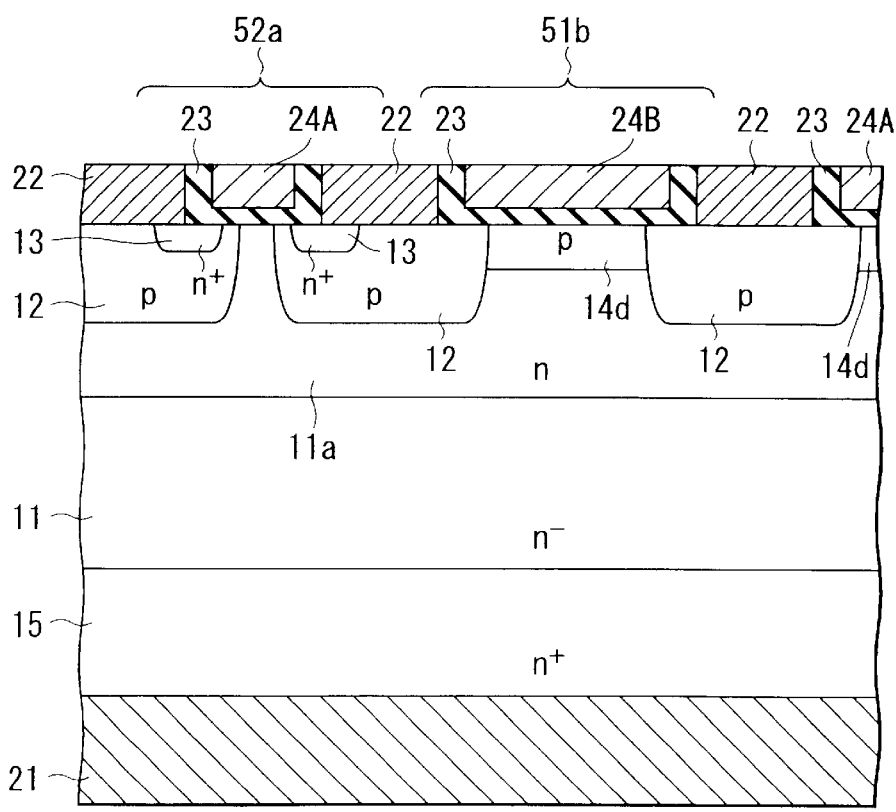
FIG. 28 is a cross-sectional view showing another structure of the main part of the power MOSFET according to the ninth embodiment of the present invention.

In the MOSFET shown in FIG. 27, the gate length of the MOS cell 52 and that of the MOS cell 51a are equal to each other. In contrast, as shown in FIG. 28, a gate electrode 24B of the MOS cell 51b is lengthened and a gate electrode 24A of the MOS cell 52a is shortened. The advantage of high-speed and low-noise switching is therefore enhanced. In other words, only the gate capacitance of the MOS cell 52a corresponds to that of the entire device when a low voltage is applied. High-speed switching can be achieved by shortening the gate length of the MOS cell 52a. The gate-underlying p-type layer 14d is depleted when a high voltage is applied. The gate capacitance of the MOS cell 51b is therefore added to that of the MOS cell 52a. If the gate length of the MOS cell 51b is increased, the amount by which the gate capacitance increases can be increased, with the result that switching noise can greatly be reduced.

(Tenth Embodiment)

The amount of impurity of the gate-underlying p-type layer will now be described in more detail. The tenth embodiment will be described taking the MOSFET according to the first embodiment shown in FIG. 1 as an example.

In the MOSFET according to the first embodiment, the gate-to-drain capacitance varies as the gate-underlying p-type layer 14 is depleted, which is effective in increasing the speed of the MOSFET and reducing noise. The layer 14 therefore requires an amount of impurity to such an extent that it is depleted when a high drain voltage is applied. If the amount of impurity is set at not smaller than a certain value, the layer 14 is not depleted, thereby obtaining no advantages of high-speed switching and low noise. The amount of impurity of the layer 14 has a maximum value corresponding to a limit at the time of the depletion.

The largest amount of impurity of the gate-underlying p-type layer 14 depends upon the degree of depletion of the layer 14. The degree of depletion varies with the strength of an electric field applied to the layer 14. In other words, the largest amount of impurity of the layer 14 depends upon the dimensions and concentrations of respective components of the MOSFET. More specifically, it depends upon the dimensions of the layer 14, the interval (distance) between the p-type base layers 12, the concentration of the n-type low-resistance layer 11a, the depth of each of the p-type base layers 12, etc. It is thus important to determine the amount of impurity of the layer 14 in consideration of the dimensions and concentrations of respective components of the MOSFET. The n-type low-resistance layer 11a is formed to have an impurity concentration that is higher than that of the n⁻-type drift layer 11.

In the MOSFET shown in FIG. 1, the gate-underlying p-type layer 14 is formed flush with the n-type low-resistance layer 11a. Thus, the amount of impurity of the layer 14 has to be considered in terms of a net dose. The net dose represents an amount that is obtained by subtracting the amount of n-type impurity from that of p-type impurity corresponding to the number of holes.

Hereinafter, the amount of impurity of the gate-underlying p-type layer 14 corresponds to the net dose of the layer 14. The concentration ($cm^{-2}$) per area, which is obtained by integrating the impurity concentration in the depth direction, is used as a unit of the amount of impurity.

Figure 29:
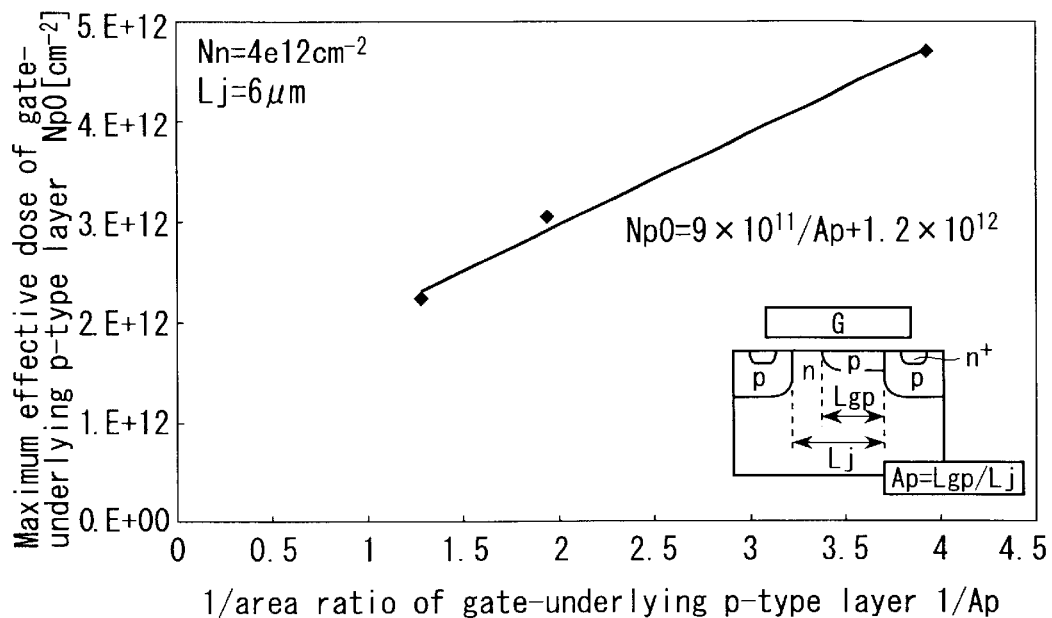
FIG. 29 is a graph showing a relationship between the area ratio of a gate-underlying p-type layer and the maximum net dose thereof in a MOSFET according to a tenth embodiment of the present invention, which has the same structure as that of the MOSFET shown in FIG. 1.

FIG. 29 shows a relationship between the dimension (area ratio Ap) of the gate-underlying p-type layer 14 and the maximum net dose Np0 of the layer 14 in a MOSFET having the same structure as that of the MOSFET according to the first embodiment. In this case, the dose (Nn) of the n-type low-resistance layer 11a is set at $4 \times 10^{12}$ $cm^{-2}$ and the interval (Lj) between the p-type base layers 12 is set at 6 μm.

The area ratio Ap (=Ap1/(Ap1+Ap2)) of the gate-underlying p-type layer 14 is the ratio of the area (Ap1) of the layer 14 to the area (Ap1+Ap2) of a region between the p-type base layers 12. When the gate electrode 24, p-type base layers 12, n⁺-type source layers 13, and layer 14 are arranged in a striped manner as shown in FIG. 1, the area of the region between the p-type base layers 12 is roughly proportional to the interval Lj between them. Similarly, the area of the layer 14 is roughly proportional to the length Lgp of the layer 14. The area ratio Ap of the layer 14 can thus be represented by the ratio (Ap=Lgp/Lj) of the interval Lj between the p-type base layers 12 to the length Lgp of the layer 14.

As shown in FIG. 29, the maximum net dose Np0 of the gate-underlying p-type layer 14 is roughly proportional to the inverse of the area ratio Ap of the layer 14. Even though the area of the layer 14 varies, the total net dose Np of the layer 14, which allows the layer 14 to be depleted, does not vary too greatly. The net dose Np corresponds to the amount of impurity per area. As the area of the layer 14 increases, the net dose Np thereof decreases.

The relationship between the inverse (1/Ap) of the area ratio Ap of the gate-underlying p-type layer 14 and the maximum net dose Np0 is given by the following primary approximate expression (1):

$$Np0 = 9 \times 10^{11}/Ap + 1.2 \times 10^{12} \text{ cm}^{-2} \quad (1)$$

It is thus desirable to set the net dose Np of the layer 14 smaller than the maximum net dose Np0.

The net dose Np of the gate-underlying p-type layer 14 and the interval Lj between the p-type base layers 12 are roughly proportional to each other as shown in FIG. 9, for example. The reason is as follows. As the interval Lj is narrowed, the electric line of force generated from the drain is cut off by the p-type base layers 12, with the result that layer 14 becomes difficult to deplete and the maximum net dose Np0 decreases.

If the above expression (1) is modified by the above proportional relationship, the following expression (2) is derived:

$$Np0/Lj=1.7\times10^{15}/Ap+2\times10^{15} \text{ cm}^{-3} \qquad (2)$$

It is thus desirable to set the net dose Np of the layer 14 smaller than the maximum net dose Np0.

Figure 30:
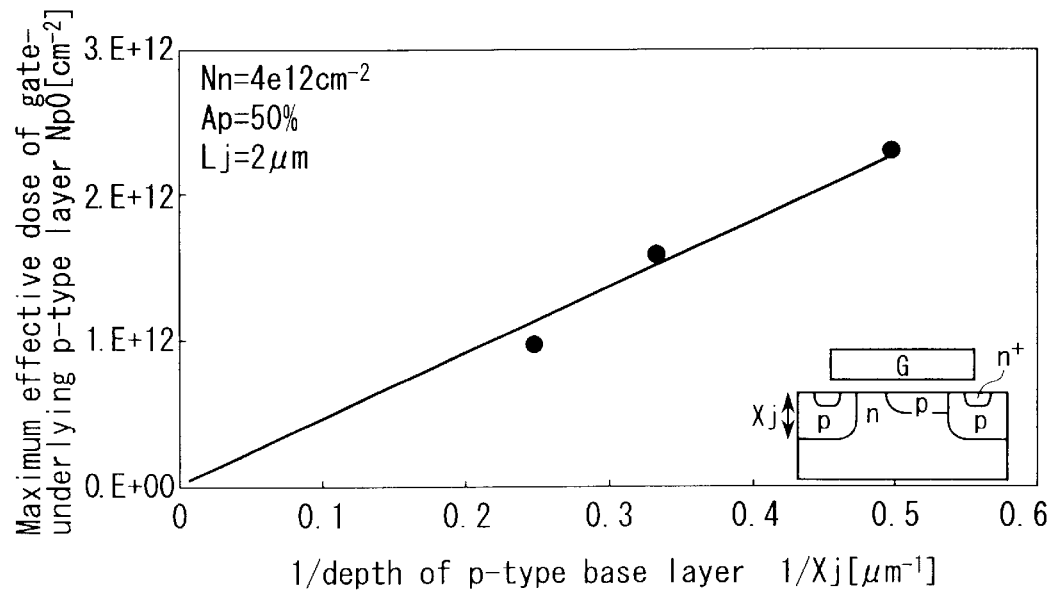
FIG. 30 is a graph showing a relationship between the depth of the p-type base layer and the maximum net dose of the gate-underlying p-type layer in the MOSFET according to the tenth embodiment of the present invention.

FIG. 30 shows a relationship between the depth Xj of each of the p-type base layers 12 and the maximum net dose Np0 of the gate-underlying p-type layer 14 in the MOSFET according to the tenth embodiment. In this MOSFET, the dose (Nn) of the n-type low-resistance layer 11a is set at $4\times10^{12}$ cm$^{-2}$, the area ratio (Ap) of the layer 14 is set at 50% and the interval (Lj) between the p-type base layers 12 is set at 2 μm.

Referring to FIG. 30, the maximum net dose Np0 of the gate-underlying p-type layer 14 is roughly inversely proportional to the depth Xj of each of the p-type base layers 12. In other words, the maximum net dose Np0 is roughly proportional to the inverse of the depth Xj. The reason is as follows. As the depth Xj increases, the electric line of force generated from the drain is cut off by the p-type base layers 12, with the result that the layer 14 becomes difficult to deplete and the maximum net dose Np0 decreases.

If the above expression (1) is modified by the above inversely proportional relationship, the following expression (3) is derived:

$$Np0\cdot Xj=3.6\times10^{8}/Ap+4.8\times10^{8} \text{ cm}^{-1} \qquad (3)$$

It is thus desirable to set the net dose Np of the layer 14 smaller than the maximum net dose Np0.

As shown in FIG. 9, the maximum net dose Np0 of the layer 14 is roughly proportional to the interval Lj between the p-type base layers 12. If the above expression (3) is modified by this proportional relationship, the following expression (4) is given:

$$Np0\cdot Xj/Lj=6\times10^{11}/Ap+8\times10^{11} \text{ cm}^{-2} \qquad (4)$$

It is thus desirable to set the net dose Np of the layer 14 smaller than the maximum net dose Np0.

Figure 31:
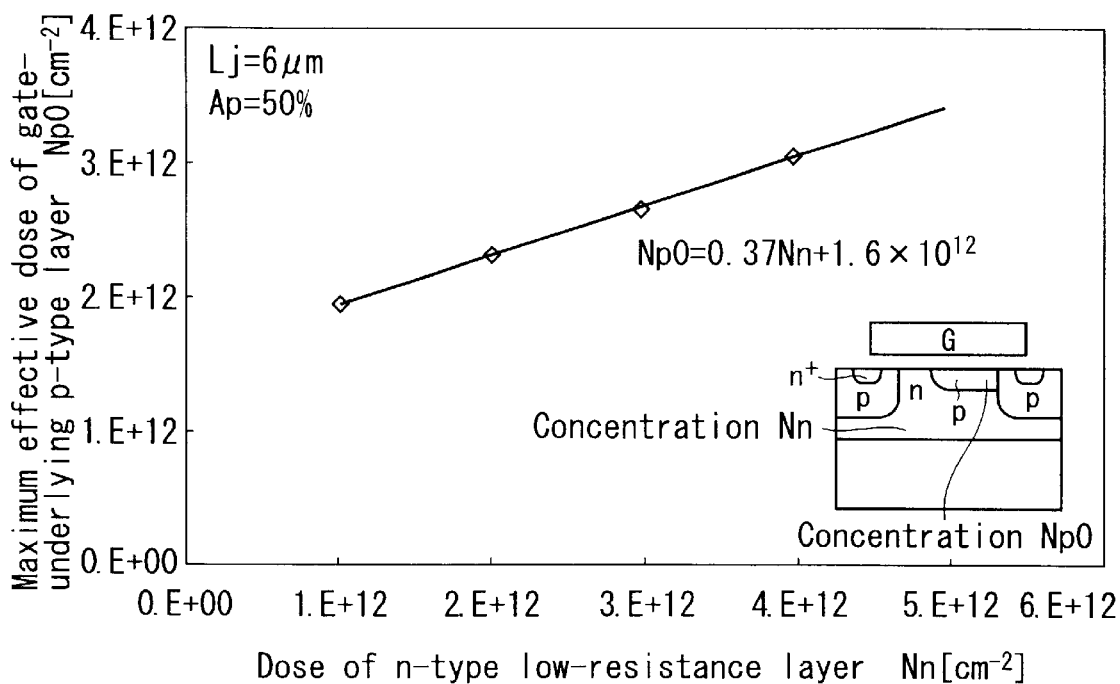
FIG. 31 is a graph showing a relationship between the dose of the n-type low-resistance layer and the maximum net dose of the gate-underlying p-type layer in the MOSFET according to the tenth embodiment of the present invention.

FIG. 31 shows a relationship between the dose Nn of the n-type low-resistance layer 11a and the maximum net dose Np0 of the gate-underlying p-type layer 14 in the MOSFET according to the tenth embodiment. In this MOSFET, the area ratio (Ap) of the layer 14 is set at 50% and the interval (Lj) between the p-type base layers 12 is set at 6 μm.

Referring to FIG. 31, the maximum net dose Np0 of the layer 14 is roughly proportional to the dose Nn of the n-type low-resistance layer 11a. As the layer 11a increases in concentration, the layer 14 becomes easy to deplete and accordingly the maximum net dose Np0 increases.

The relationship between the dose Nn of the n-type low-resistance layer 11a and the maximum net dose Np0 of the gate-underlying p-type layer 14 is given by the following primary approximate expression (5):

$$Np0=0.37Nn+1.6\times10^{12} \text{ cm}^{-2} \qquad (5)$$

The expression (5) is combined with the above expression (1) and altered to the following expression (6) including the area ratio Ap of the layer 14:

$$Np0=8.4\times10^{11}/Ap+0.34Nn+0.015Nn/Ap-1.2\times10^{11} \text{ cm}^{-2} \qquad (6)$$

It is thus desirable to set the net dose Np of the layer 14 smaller than the maximum net dose Np0.

As shown in FIG. 9, the maximum net dose Np0 of the layer 14 is roughly proportional to the interval Lj between the p-type base layers 12. If the above expression (6) is modified by this proportional relationship, the following expression (7) is derived:

$$Np/Lj=1.4\times10^{15}/Ap+570Nn+25Nn/Ap-2\times10^{14} \text{ cm}^{-3} \qquad (7)$$

It is thus desirable to set the net dose Np of the layer 14 smaller than the maximum net dose Np0.

Referring to FIG. 30, the maximum net dose Np0 of the gate-underlying p-type layer 14 is roughly inversely proportional to the depth Xj of each of the p-type base layers 12. If the above expression (7) is modified by the inversely proportional relationship, the following expression (8) is given:

$$Np\cdot Xj/Lj=5.6\times10^{11}/Ap+0.228Nn+0.01Nn/Ap-8\times10^{10} \text{ cm}^{-2} \qquad (8)$$

It is thus desirable to set the net dose Np of the layer 14 smaller than the maximum net dose Np0.

On the other hand, when the net dose Np of the gate-underlying p-type layer 14 is so small that the layer 14 is completely depleted by a low drain voltage, no advantage of insertion of the layer 14 is obtained. In other words, if the net dose Np is too small, the same switching loss as that of the prior art MOSFET is caused as shown in FIG. 8. It is thus necessary to set the net dose Np of the layer 14 equal to an amount of impurity by which the layer 14 is depleted when a somewhat high drain voltage is applied. The amount of impurity of the layer 14 therefore has a minimum value favorable for the depletion.

If the minimum net dose of the gate-underlying p-type layer 14 is equal to an amount of impurity that causes the same switching loss as that of the prior art MOSFET, it is about one-quarter to one-third the maximum net dose (see FIG. 8, for example).

As in the case of the maximum net dose, the minimum net dose of the gate-underlying p-type layer 14 depends upon the degree of depletion of the layer 14. In other words, the minimum net dose of the layer 14 depends upon the dimensions and concentrations of respective components of the MOSFET. It is thus important to determine the amount of impurity of the layer 14 in consideration of the dimensions and concentrations of respective components of the MOSFET.

Figure 32:
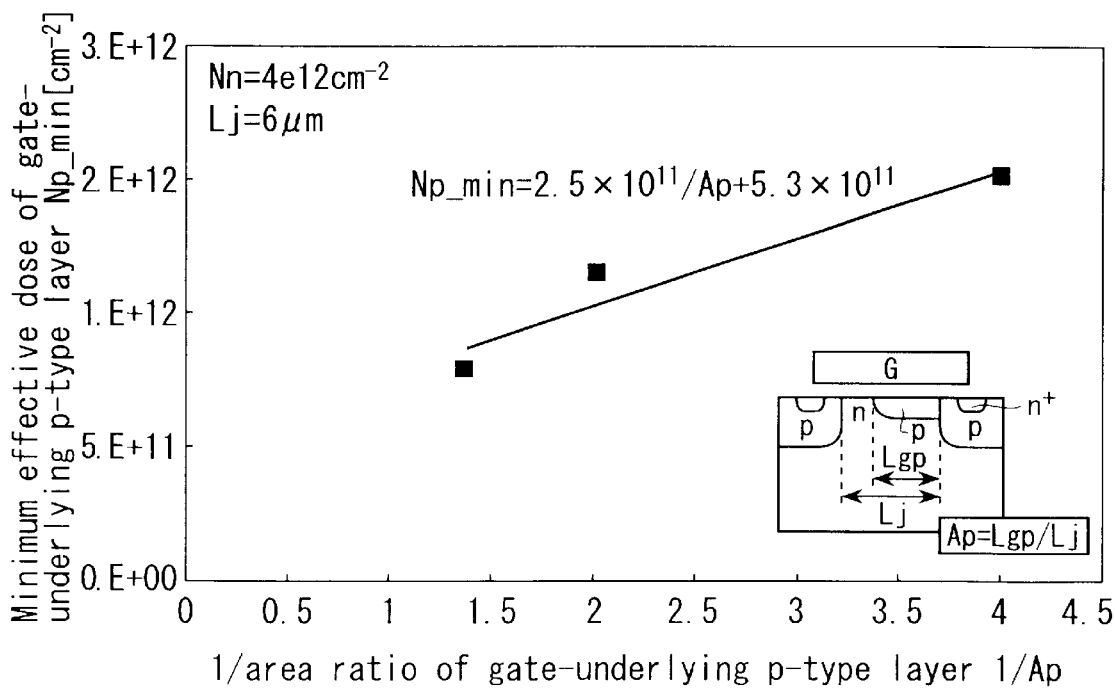
FIG. 32 is a graph showing a relationship between the area ratio of the gate-underlying p-type layer and the minimum net dose thereof in the MOSFET according to the tenth embodiment of the present invention.

FIG. 32 shows a relationship between the dimension (area ratio Ap) of the gate-underlying p-type layer 14 and the minimum net dose Np__min of the layer 14 in the MOSFET according to the tenth embodiment. In this MOSFET, the dose (Nn) of the n-type low-resistance layer 11a is set at $4\times10^{12}$ cm$^{-2}$ and the interval (Lj) between the p-type base layers 12 is set at 6 μm.

Referring to FIG. 32, the minimum net dose Np__min of the gate-underlying p-type layer 14 is roughly proportional to the inverse of the area ratio Ap of the layer 14. As in the case of the maximum net dose Np0, the relationship between the inverse (1/Ap) of the area ratio Ap of the layer 14 and the minimum net dose Np__min is given by the following primary approximate expression (9):

$$Np\_min=2.5\times10^{11}/Ap+5.3\times10^{11} \text{ cm}^{-2} \qquad (9)$$

It is thus desirable to set the net dose Np of the layer 14 larger than the minimum net dose Np__min.

Figure 33:
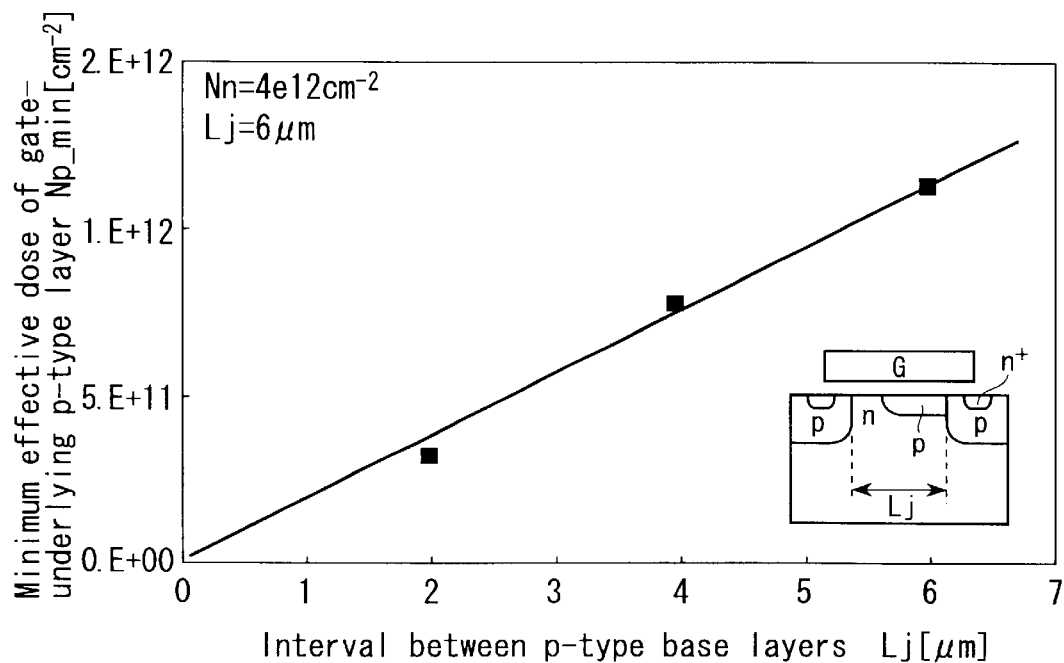
FIG. 33 is a graph showing a relationship between the interval between the p-type base layers and the minimum net dose of the gate-underlying p-type layer in the MOSFET according to the tenth embodiment of the present invention.

FIG. 33 shows a relationship between the interval Lj between the p-type base layers 12 and the minimum net dose Np__min of the gate-underlying p-type layer 14 in the MOSFET according to the tenth embodiment. In this MOSFET, the dose (Nn) of the n-type low-resistance layer 11a is set at $4\times10^{12}$ cm$^{-2}$ and the area ratio Ap of the layer 14 is set at 50%.

As in the case of the maximum net dose Np0, the minimum net dose Np__min of the layer 14 is roughly proportional to the interval Lj between the p-type base layers 12. If the above expression (9) is modified by this proportional relationship, the following expression (10) is derived:

$$\text{Np\_min}/\text{Lj}=4.2\times10^{14}/\text{Ap}+8.8\times10^{14}\ cm^{-3} \quad (10)$$

It is thus desirable to set the net dose Np of the layer 14 larger than the minimum net dose Np_min.

Figure 34:
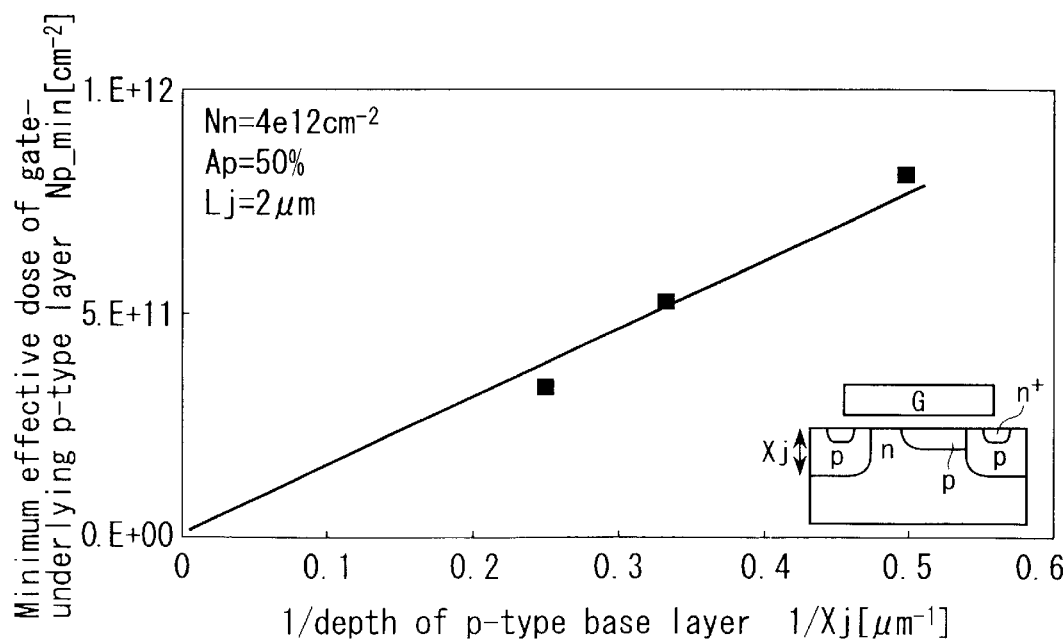
FIG. 34 is a graph showing a relationship between the depth of the p-type base layer and the minimum net dose of the gate-underlying p-type layer in the MOSFET according to the tenth embodiment of the present invention.

FIG. 34 shows a relationship between the depth Xj of each of the p-type base layers 12 and the minimum net dose Np_min of the gate-underlying p-type layer 14 in the MOSFET according to the tenth embodiment. In this MOSFET, the dose (Nn) of the n-type low-resistance layer 11a is set at $4\times10^{12}$ cm$^{-2}$, the area ratio Ap of the layer 14 is set at 50% and the interval Lj between the p-type base layers 12 is set at 2 μm.

As in the case of the maximum net dose Np0, the minimum net dose Np_min of the gate-underlying p-type layer 14 is roughly inversely proportional to the depth Xj (or roughly proportional to the inverse of the depth Xj). If the above expression (9) is modified by this inversely proportional relationship, the following expression (11) is given:

$$\text{Np\_min}\cdot\text{Xj}=1\times10^{8}/\text{Ap}+2.1\times10^{8}\ cm^{-1} \quad (11)$$

It is thus desirable to set the net dose Np of the layer 14 larger than the minimum net dose Np_min.

Referring to FIG. 33, the minimum net dose Np_min of the layer 14 is roughly proportional to the interval Lj between the p-type base layers 12. If the above expression (11) is modified by this proportional relationship, the following expression (12) is derived:

$$\text{Np\_min}\cdot\text{Xj}/\text{Lj}=1.7\times10^{11}/\text{Ap}+3.5\times10^{11}\ cm^{-2} \quad (12)$$

It is thus desirable to set the net dose Np of the layer 14 larger than the minimum net dose Np_min.

Figure 35:
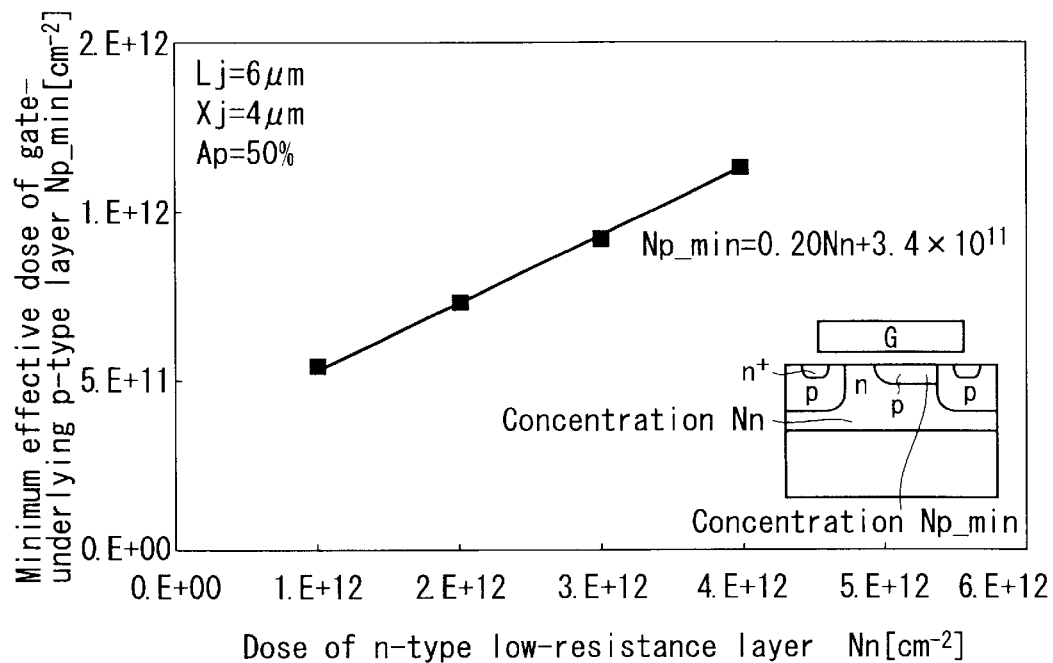
FIG. 35 is a graph showing a relationship between the dose of the n-type low-resistance layer and the minimum net dose of the gate-underlying p-type layer in the MOSFET according to the tenth embodiment of the present invention.

FIG. 35 shows a relationship between the dose Nn of the n-type low-resistance layer 11 and the minimum net dose Np_min of the gate-underlying p-type layer 14 in the MOSFET according to the tenth embodiment. In this MOSFET, the depth Xj of each of the p-type base layers 12 is set at 4 μm, the area ratio Ap of the layer 14 is set at 50% and the interval Lj between the p-type base layers 12 is set at 6 μm.

As shown in FIG. 35, the minimum net dose Np_min of the layer 14 is roughly proportional to the dose Nn of the n-type low-resistance layer 11a. As the n-type low-resistance layer 11a increases in concentration, the layer 14 becomes easy to deplete and accordingly the minimum net dose Np_min increases.

The relationship between the dose Nn of the n-type low-resistance layer 11a and the minimum net dose Np_min of the gate-underlying p-type layer 14 is given by the following primary approximate expression (13):

$$\text{Np\_min}=0.2\text{Nn}+3.4\times10^{11}\ cm^{-2} \quad (13)$$

The expression (13) is combined with the above expression (9) and altered to the following expression (14) including the area ratio Ap of the layer 14:

$$\text{Np\_min}=-4\times10^{10}/\text{Ap}+0.0375\text{Nn}+0.075\text{Nn}/\text{Ap}+4\times10^{11}\ cm^{-2} \quad (14)$$

It is thus desirable to set the net dose Np of the layer 14 larger than the minimum net dose Np_min.

Referring to FIG. 33, the minimum net dose Np_min of the layer 14 is roughly proportional to the interval Lj between the p-type base layers 12. If the above expression (14) is modified by this proportional relationship, the following expression (15) is derived:

$$\text{Np}/\text{Lj}=-6.7\times10^{13}/\text{Ap}+62.5\text{Nn}+125\text{Nn}/\text{Ap}+6.7\times10^{14}\ cm^{-3} \quad (15)$$

It is thus desirable to set the net dose Np of the layer 14 larger than the minimum net dose Np_min.

As shown in FIG. 34, the minimum net dose Np_min of the gate-underlying p-type layer 14 is roughly inversely proportional to the depth Xj of each of the p-type base layers 12. If the above expression (15) is modified by the inversely proportional relationship, the following expression (16) is given:

$$\text{Np}\cdot\text{Xj}/\text{Lj}=-2.7\times10^{10}/\text{Ap}+0.025\text{Nn}+0.05\text{Nn}/\text{Ap}+2.7\times10^{11}\ cm^{-2} \quad (16)$$

It is thus desirable to set the net dose Np of the layer 14 larger than the minimum net dose Np_min.

(Eleventh Embodiment)

Figure 36:
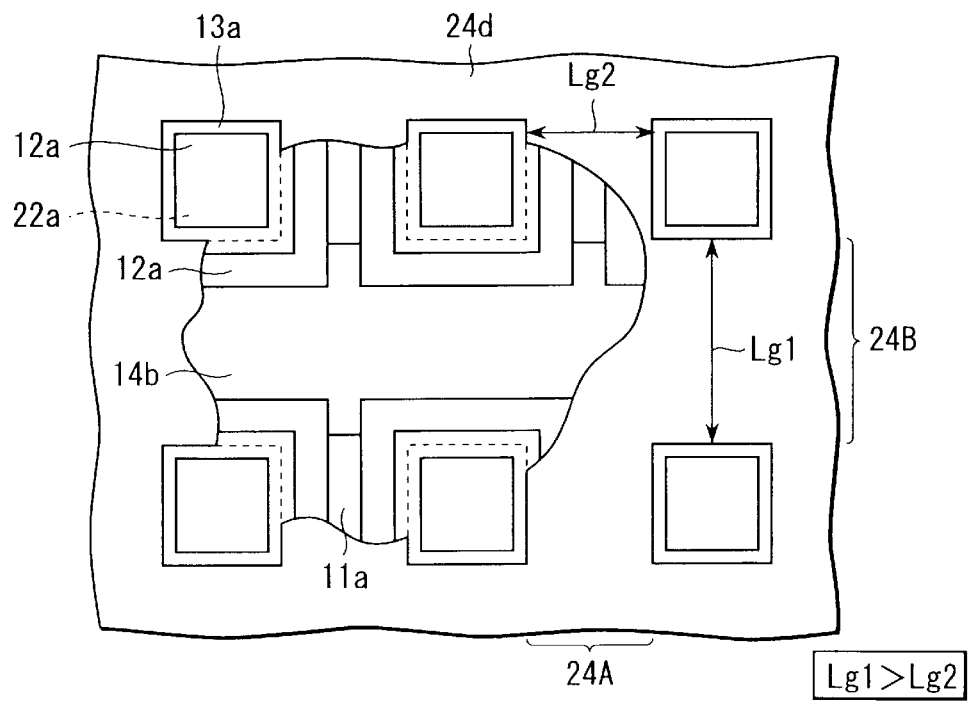
FIG. 36 is a partly-broken plan view showing a gate electrode as an example of the structure of a power MOSFET according to an eleventh embodiment of the present invention.

FIG. 36 shows an example of the structure of a power MOSFET according to an eleventh embodiment of the present invention. In FIG. 36, the same components as those of the MOSFET shown in FIG. 18 are denoted by the same reference numerals and their detailed descriptions are omitted. Only the components different from those in FIG. 18 will be described.

In the power MOSFET shown in FIG. 36, a gate electrode 24d is made up of first and second gate electrodes 24A and 24B whose gate lengths differ from each other.

More specifically, a plurality of p-type base layers 12a serving as second semiconductor layers are arranged in a latticed manner (or staggered manner) in a surface area of an n-type low-resistance layer 11a. A gate electrode 24d serving as a control electrode includes at least one first gate electrode (second control electrode) 24A and at least one second gate electrode (first control electrode) 24B, these gate electrodes 24A and 24B being arranged in a latticed manner. The first gate electrode 24A has, for example, a first gate length (second electrode length) Lg2. The second gate electrode 24B has, for example, a second gate length (first electrode length) Lg1 that is greater than the first gate length Lg2. A plurality of gate-underlying p-type layers 14b serving as fifth semiconductor layers are formed in a striped manner only in the portion corresponding to the second gate electrode 24B between adjacent p-type base layers 12a.

The gate-to-drain capacitance obtained when a low drain voltage is applied depends upon the capacitance of the electrode whose gate length is short. In this case, the gate-to-drain capacitance is small and high-speed switching can be achieved.

In contrast, the gate-to-drain capacitance obtained when a high drain voltage is applied greatly increases. This is because a gate-underlying p-type layer 14b corresponding to the electrode whose gate length is long is depleted and thus noise can be reduced.

In the power MOSFET shown in FIG. 36, the areas of the gate-underlying p-type layers can be caused to differ from one another.

Figure 37:
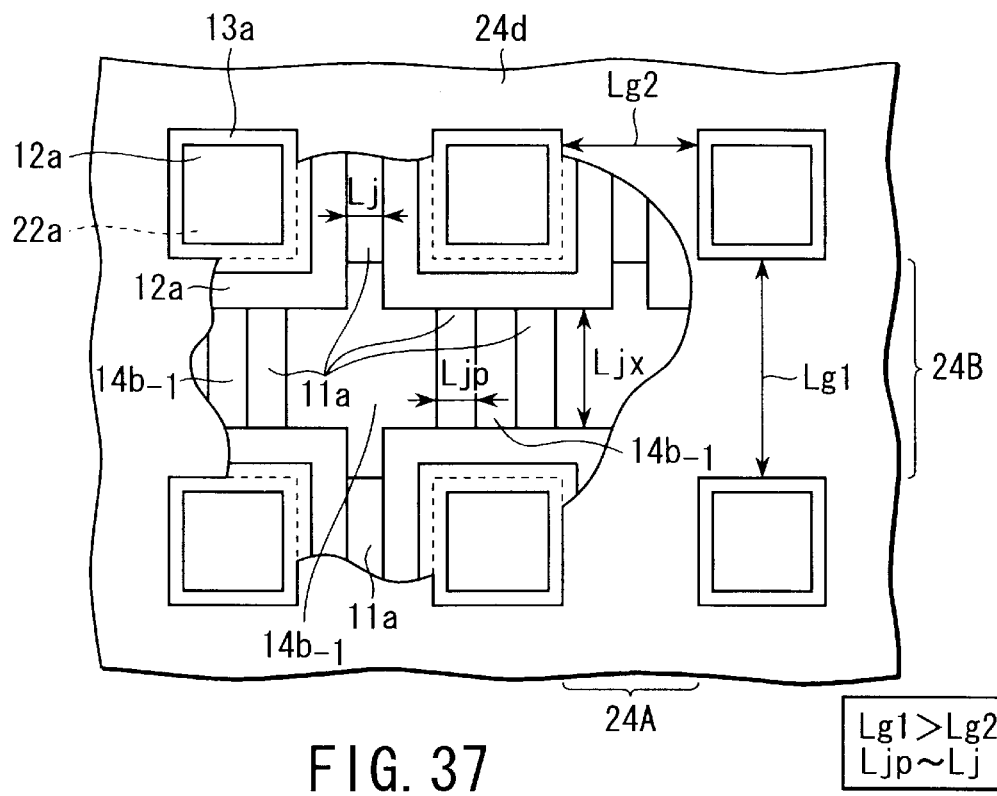
FIG. 37 is a partly-broken plan view showing a gate electrode as another example of the structure of a power MOSFET according to an eleventh embodiment of the present invention.

As illustrated in FIG. 37, some gate-underlying p-type layers 14b_1 are selectively formed in the portion corresponding to the second gate electrode 24B between adjacent p-type base layers 12a. Thus, a change in the gate-to-drain capacitance can easily be controlled by causing the areas of the gate-underlying p-type layers 14b_1 to differ from one another.

The interval Ljp between adjacent gate-underlying p-type layers 14b_1 is set to a value (Ljp~Lj) that is almost equal to the interval Lj between the p-type base layers 12a corresponding to the first gate electrode 24A. It is thus possible to prevent a breakdown voltage from dropping due to an increase of the interval Ljx between the p-type base layers 12a, which corresponds to the second gate electrode 24B.

Figure 38:
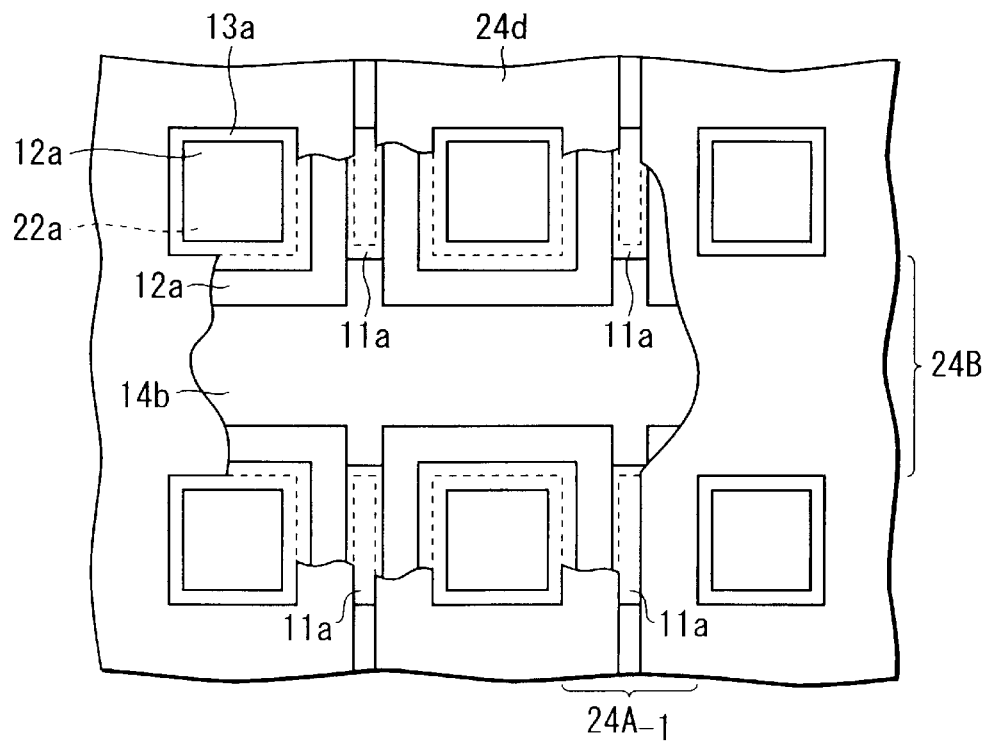
FIG. 38 is a partly-broken plan view showing a gate electrode as still another example of the structure of a power MOSFET according to an eleventh embodiment of the present invention.

FIG. 38 illustrates an example of the structure of the power MOSFET shown in FIG. 36, in which part of the gate electrode 24d has a split gate structure.

Of gate electrodes 24d serving as control electrodes, a first gate electrode $24A_{-1}$ whose gate length is short is configured to have a split gate structure. Thus, the gate-to-drain capacitance obtained when a low drain voltage is applied, which depends upon the capacitance of the electrode whose gate length is short, can be reduced further and high-speed switching can be achieved.

Not only the split gate structure but also a terrace gate structure as shown in FIG. 14 can be adopted. If the first gate electrode having a short gate length is formed to have a terrace gate structure, the same advantages as those of the split gate structure can be obtained.

Figure 39:
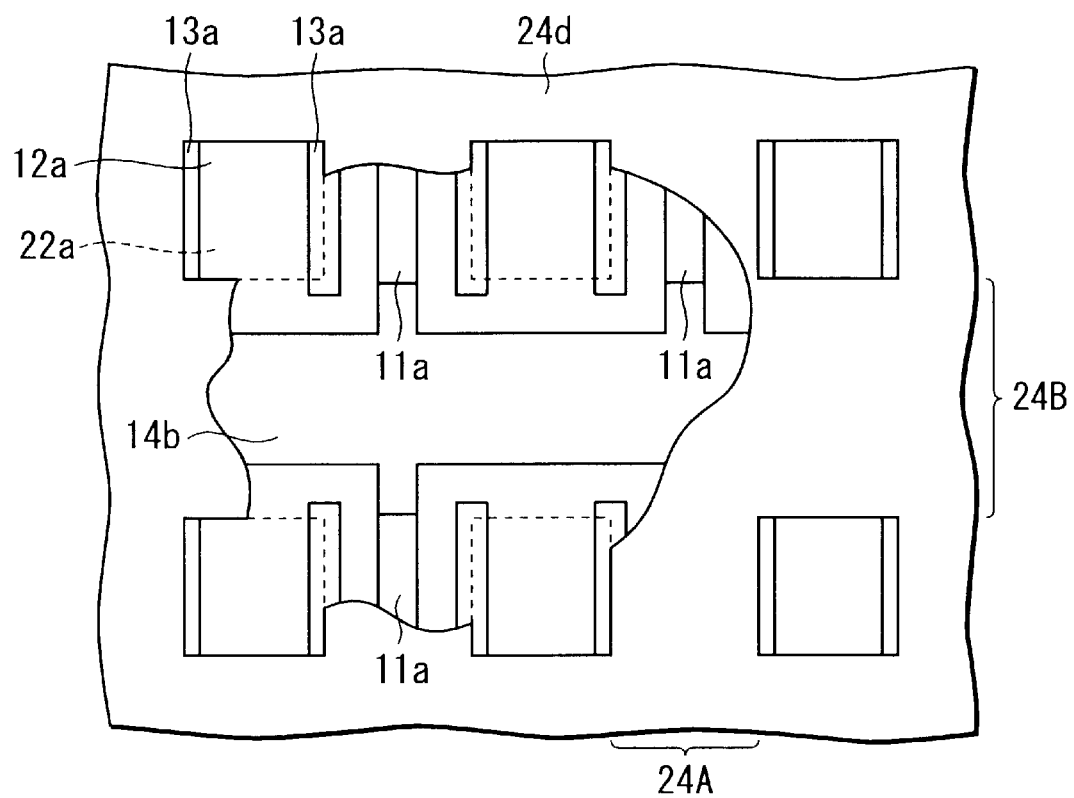
FIG. 39 is a partly-broken plan view showing a gate electrode as yet another example of the structure of a power MOSFET according to an eleventh embodiment of the present invention.

FIG. 39 illustrates an example of the structure of the power MOSFET shown in FIG. 36, in which $n^+$-type source layers 13a are selectively formed.

The $n^+$-type source layers 13a, which serve as third semiconductor layers, are each formed only in the surface area of the p-type base layer 12a serving as a second semiconductor layer, which corresponds to the first gate electrode 24A whose gate length is short. In other words, none of the $n^+$-type source layers 13a are formed in the surface area of the p-type base layer 12a, which corresponds to the second gate electrode 24B of the gate electrodes 24d, the gate length of the second gate electrode 24B being long.

Current hardly flows through the gate electrode whose gate length is long even though a voltage is applied to the gate electrode 24d to form an inversion channel. This is because the channel in the gate electrode having a long gate length is long and the resistance thereof is high. Consequently, the on-resistance of the MOSFET does not increase even though no $n^+$-type source layer 13a is formed in the surface area of the p-type base layer 12a corresponding to the second gate electrode 24B.

Furthermore, the area of the $n^+$-type source layers 13a can be decreased and thus a parasitic bipolar transistor can be prevented from operating. Accordingly, a safe-operating area of the MOSFET can be enlarged.

In the MOSFET so configured, too, the first gate electrode 24A whose gate length is short can be formed to have a split gate structure as shown in FIG. 38 or a terrace gate structure as shown in FIG. 14, with the result that high-speed switching can be achieved.

(Twelfth Embodiment)

Figure 40A:
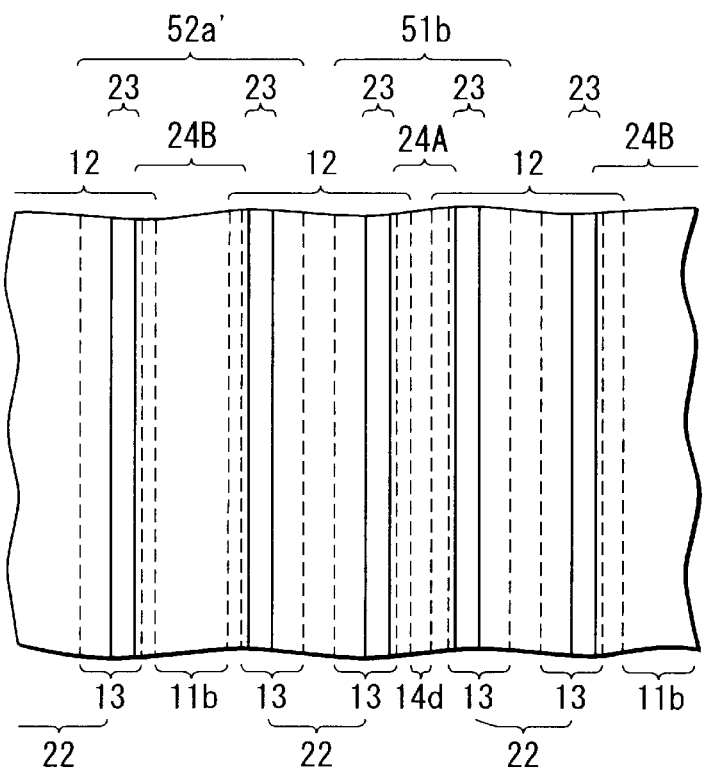
FIGS. 40A and 40B are views illustrating an example of the structure of a power MOSFET according to a twelfth embodiment of the present invention.
Figure 40B:
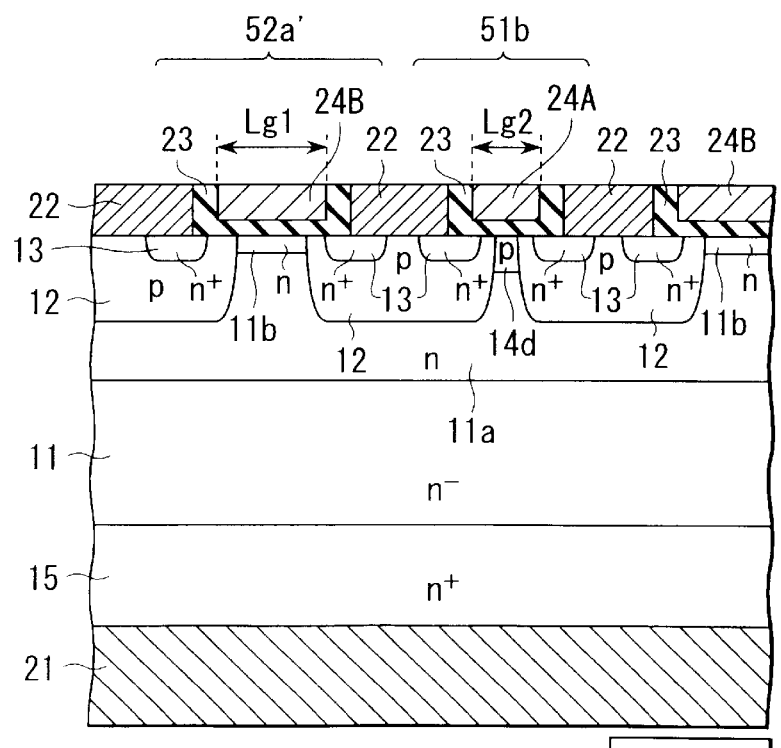

FIGS. 40A and 40B illustrate an example of the structure of a power MOSFET according to a twelfth embodiment of the present invention. FIG. 40A is a plan view of the structure and FIG. 40B is a cross-sectional view thereof. In FIGS. 40A and 40B, the same components as those of the MOSFET shown in FIG. 28 are denoted by the same reference numerals and their detailed descriptions are omitted. Only the components different from those in FIG. 28 will be described.

In the example illustrated in FIGS. 40A and 40B, a gate-underlying p-type layer 14d, which is formed under a first gate electrode 24A having a gate length Lg2, can be formed in self-alignment, and the first and second gate electrodes 24A and 24B are arranged in a striped manner.

More specifically, a MOS cell 52a' serving as a first cell includes a second gate electrode (first control electrode) 24B having a gate length Lg1. The MOS cell 52a' also includes an $n^+$-type source layer 13 serving as a third semiconductor layer and formed in the surface area of a p-type base layer 12 serving as a second semiconductor layer. A low-concentration n-type layer 11b serving as a seventh semiconductor layer is provided between adjacent p-type base layers 12. The layer 11b has impurity concentration that is lower than that of an n-type low-resistance layer 11a.

On the other hand, a MOS cell 51b serving as a second cell includes a first gate electrode (second control electrode) 24A having a gate length Lg2 that is shorter than the gate length Lg1 of the second gate electrode 24B. The MOS cell 51b also includes an $n^+$-type source layer 13 in the surface area of each of p-type base layers 12. A gate-underlying p-type layer 14d serving as a fifth semiconductor layer is provided between adjacent p-type base layers 12.

In the MOSFET including two different MOS cells 51b and 52a' having gate electrodes 24A and 24B having different gate lengths Lg2 and Lg1, the gate-underlying p-type layer 14d can be formed in self-alignment.

FIGS. 41A to 41E show a process of manufacturing the MOSFET illustrated in FIGS. 40A and 40B.

Figure 41A:
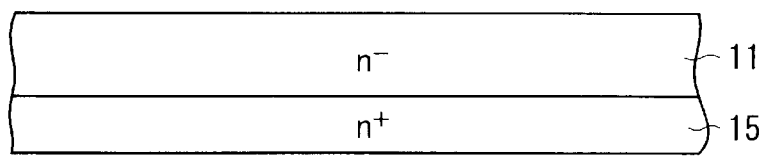
FIGS. 41A to 41E are cross-sectional views showing a process of manufacturing the power MOSFET illustrated in FIGS. 40A and 40B.
Figure 41B:
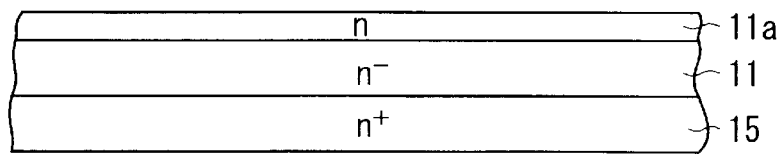
Figure 41C:
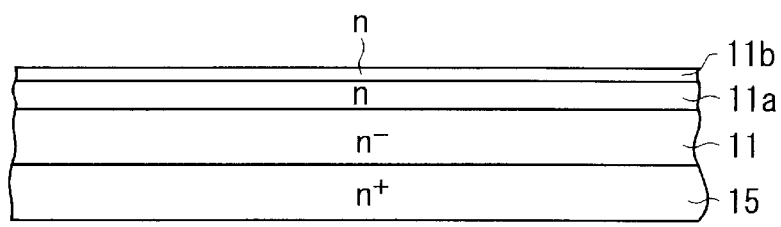

First, ions are implanted and diffused into a substrate having an $n^-$-type drift layer 11 and an $n^+$-type drain layer 15 (see FIG. 41A). An n-type low-resistance layer 11a is formed in the surface area of the $n^-$-type drift layer 11 (see FIG. 41B).

Then, p-type dopant such as boron is ion-implanted into the surface of the n-type low-resistance layer 11a to anneal the resultant structure. Thus, a low-concentration n-type layer 11b is formed in the surface area of the n-type low-resistance layer 11a (see FIG. 41C).

Figure 41D:
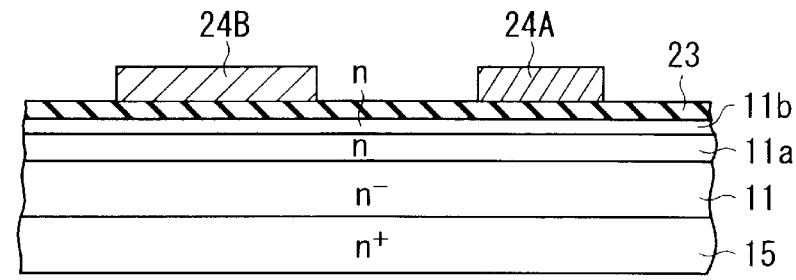
Figure 41E:
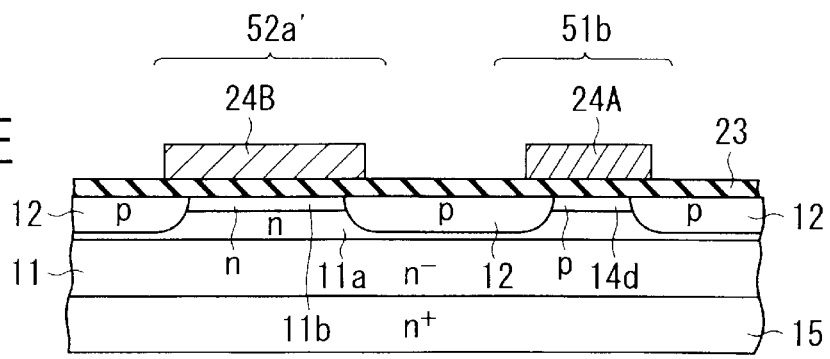

Then, first and second gate electrodes 24A and 24B are formed by patterning on the surface of the low-concentration n-type layer 11b with a gate insulation film 23 interposed therebetween (see FIG. 41D). After that, p-type base layers 12 are formed by implantation and diffusion of ions (see FIG. 41E).

Since the low-concentration n-type layer 11b exists immediately under the first and second gate electrodes 24A and 24B, the same advantage can be obtained as when dopant diffuses into the p-type base layers 12 in the horizontal direction. In other words, the dopant of the p-type base layers 12 extends in the horizontal direction only near the surface of the n-type low-resistance layer 11a and extends almost equally from both sides of each of the gate electrodes 24A and 24B. If, therefore, the gate length is short, a p-type layer is completely formed between adjacent p-type base layers 12 by the dopant of the layers 12. As a result, a gate-underlying p-type layer 14d is selectively formed only under the first gate electrode 24A having a short gate length.

If the gate length is long, no p-type layer is completely formed between adjacent p-type base layers 12 and, in other words, the gate-underlying p-type layer 14d is not formed adequately under the second gate electrode 24B having a long gate length. The gate-underlying p-type layer 14d can be formed in self-alignment only under the first gate electrode 24A. It is thus possible to reduce the number of lithographic steps of forming the gate-underlying p-type layer 14d.

When the gate-underlying p-type layer 14d is formed by diffusing dopant from the p-type base layers 12 in the horizontal direction, it is desirable that an interval between the p-type base layers 12 in the MOS cell 51b be narrow in order to complete a p-type layer between the p-type base layers 12. In contrast, it is desirable that an interval between the p-type base layers 12 in the MOS cell 52a' be broad. In order to reliably form these two MOS cells 51b and 52a' having different patterns, it is desirable to vary an interval between p-type base layers 12 more than twice as much.

In the MOSFET so configured by the above process, the gate-to-drain capacitance obtained when a low drain voltage is applied depends upon the capacitance of the MOS cell 52a' having a low-concentration n-type layer 11b. The gate-to-drain capacitance obtained when a high drain voltage is applied is increased by adding the capacitance of the MOS cell 51b including the gate-underlying p-type layer 14d to that of the MOS cell 52a'. Accordingly, noise can be reduced.

In the MOSFET so configured, moreover, the proportion of the MOS cell 51b to the number of cells of the entire MOSFET or the proportion of the area of the gate-underlying p-type layer 14d to the area of the region formed under the gates of the MOSFET (e.g., the surface area of the low-concentration n-type layer 11b) increases. Consequently, the advantage of decreasing in noise can be improved further. Incidentally, it is desirable that the proportion of the MOS cell 51b or the proportion of the area of the gate-underlying p-type layer 14d be 30% or more.

The gate-underlying p-type layer 14d formed in the MOS cell 51b need not completely cover the undersurface of the gate electrode 24A. If a p-type layer to be depleted has only to be formed, the gate-to-drain capacitance increases as the drain voltage rises. The same advantage as when the p-type layer is completed between the p-type base layers 12 or the advantage of decreasing in noise can be obtained.

It is also desirable that the net dose of the gate-underlying p-type layer 14d be set at a value as described above.

In the power MOSFET illustrated in FIGS. 40A and 40B, $n^+$-type source layers 13 can be formed selectively.

Figure 42A:
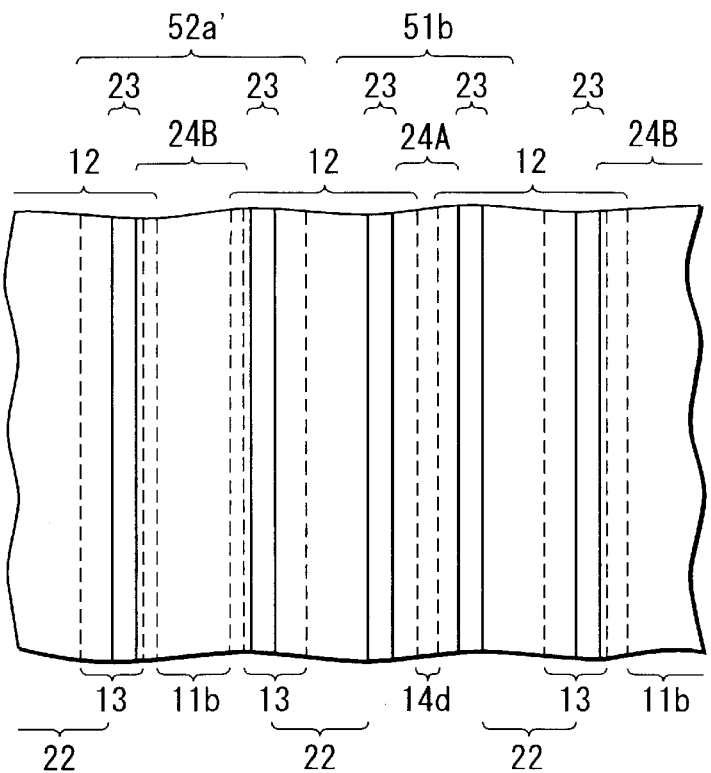
FIGS. 42A and 42B are views illustrating another example of the structure of the power MOSFET according to the twelfth embodiment of the present invention.
Figure 42B:
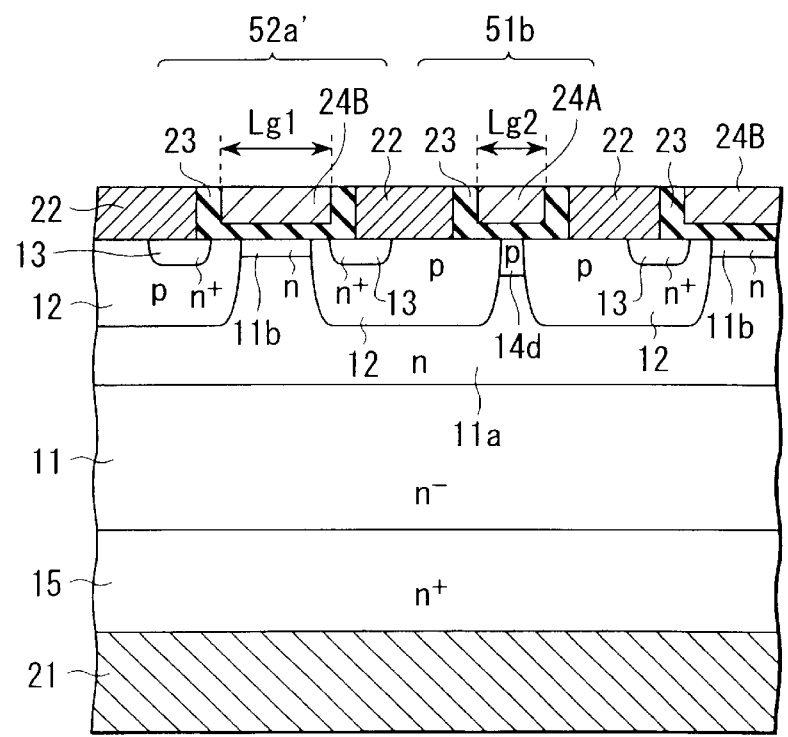

More specifically, in the power MOSFET shown in FIGS. 42A and 42B, the $n^+$-type source layers 13 serving as third semiconductor layers are each formed only in the surface area of the p-type base layer 12 serving as a second semiconductor layer, which corresponds to the second gate electrode 24B whose gate length is long. In other words, no $n^+$-type source layer 13 is formed in the surface area of the p-type base layer 12, which corresponds to the first gate electrode 24A whose gate length is short. FIG. 42A is a plan view of the power MOSFET and FIG. 42B is a cross-sectional view thereof.

In the MOS cell 51b, the gate-underlying p-type layer 14d completely covers the undersurface of the first gate electrode 24A. No current therefore flows through the MOS cell 51b. Even though no $n^+$-type source layer 13 is formed in the surface area of the p-type base layer 12 corresponding to the first gate electrode 24A, no influence is exerted upon the on-resistance of the MOSFET.

Furthermore, a parasitic bipolar transistor can be prevented from operating. Accordingly, a safe-operating area of the MOSFET can be enlarged.

Figure 43:
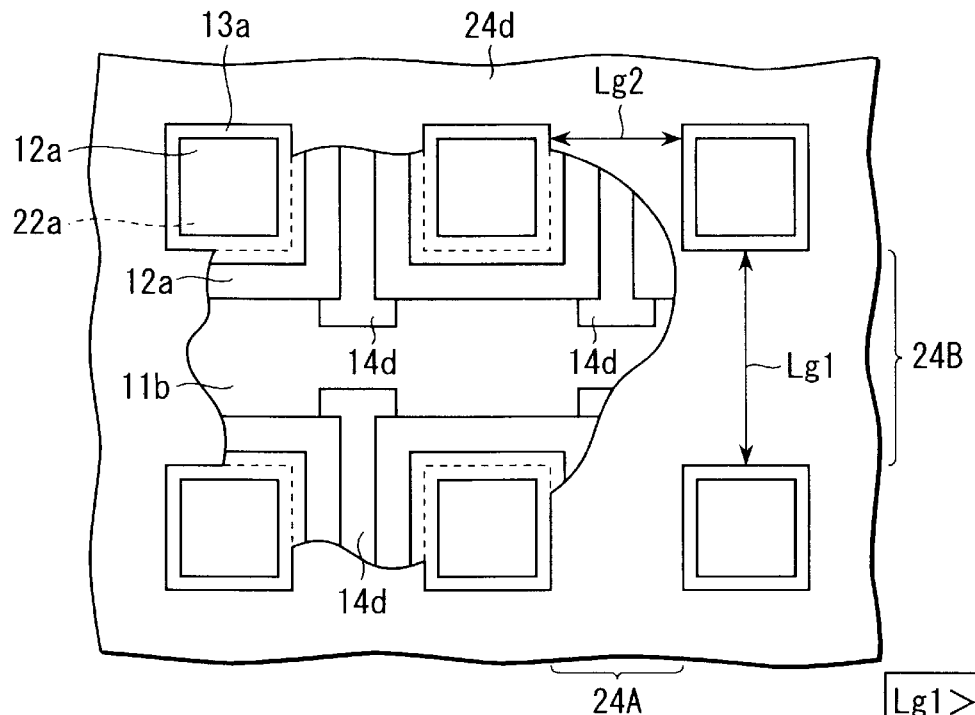
FIG. 43 is a partly-broken plan view showing a gate electrode as still another example of the structure of the power MOSFET according to the twelfth embodiment of the present invention.

FIG. 43 shows another example of the structure of the power MOSFET according to the twelfth embodiment of the present invention. In this example, the gate-underlying p-type layer can be formed in self-alignment, and the first and second gate electrodes 24A and 24B having different gate lengths are arranged in a latticed manner.

More specifically, a plurality of p-type base layers 12a serving as second semiconductor layers are arranged in a latticed manner (or staggered manner) in a surface area of an n-type low-resistance layer 11a. An $n^+$-type source layer 13a serving as a third semiconductor layer is formed in the surface area of each of the p-type base layers 12a. A gate electrode 24d serving as a control electrode includes at least one first gate electrode (second control electrode) 24A and at least one second gate electrode (first control electrode) 24B, these gate electrodes 24A and 24B being arranged in a latticed manner. The first gate electrode 24A has, for example, a first gate length (second electrode length) Lg2.

The second gate electrode 24B has, for example, a second gate length (first electrode length) Lg1 that is greater than the first gate length Lg2.

A plurality of gate-underlying p-type layers 14d serving as fifth semiconductor layers are each formed in self-alignment only in the portion corresponding to the first gate electrode 24A between adjacent p-type base layers 12a. A low-concentration n-type layer 11b serving as a seventh semiconductor layer is formed in the portion corresponding to the second gate electrode 24B between adjacent p-type base layers 12a.

In the above configuration, too, the gate-underlying p-type layers 14d can be formed in self-alignment. Costs for manufacturing the MOSFET can thus be lowered.

Figure 44:
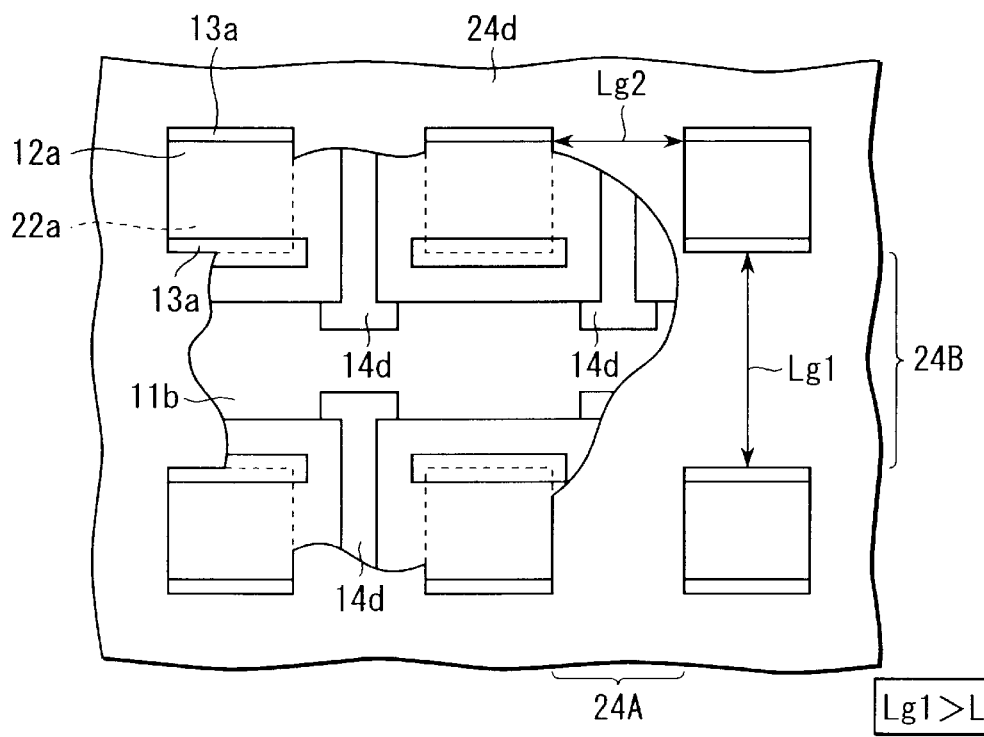
FIG. 44 is a partly-broken plan view showing a gate electrode as still another example of the structure of the power MOSFET according to the twelfth embodiment of the present invention.

FIG. 44 illustrates another example of the structure of the power MOSFET shown in FIG. 43. In this example, the $n^+$-type source layers 13a are selectively formed.

More specifically, the $n^+$-type source layers 13a serving as third semiconductor layers, are each formed only in the surface area of the p-type base layer 12a serving as a second semiconductor layer, which corresponds to the second gate electrode 24B whose gate length is long. In other words, no $n^+$-type source layer 13a is formed in the surface area of the p-type base layer 12a, which corresponds to the first gate electrode 24A of the gate electrodes 24d serving as control electrodes, the gate length of the gate electrode 24A being short.

The gate-underlying p-type layer 14d completely covers part of the first gate electrode 24A between adjacent p-type base layers 12a. No current therefore flows through this part. Even though no $n^+$-type source layer 13a is formed in the surface area of the p-type base layer 12a corresponding to the first gate electrode 24A, no influence is exerted upon the on-resistance of the MOSFET.

Furthermore, a parasitic bipolar transistor can be prevented from operating. Accordingly, a safe-operating area of the MOSFET can be enlarged.

Figure 45A:
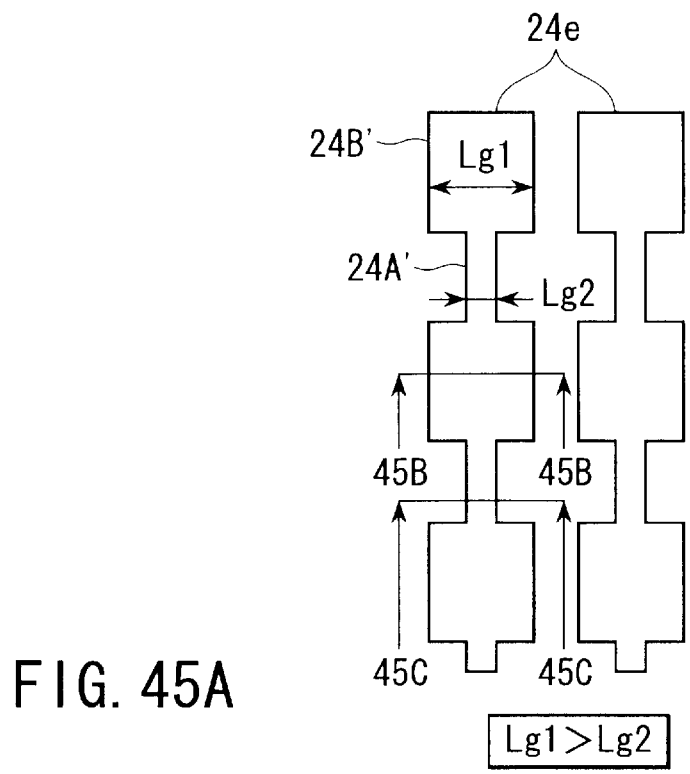
FIGS. 45A to 45C are views showing still another example of the structure of the power MOSFET according to the twelfth embodiment, in which gate electrodes are arranged in a striped manner.
Figures 45B, 45C:
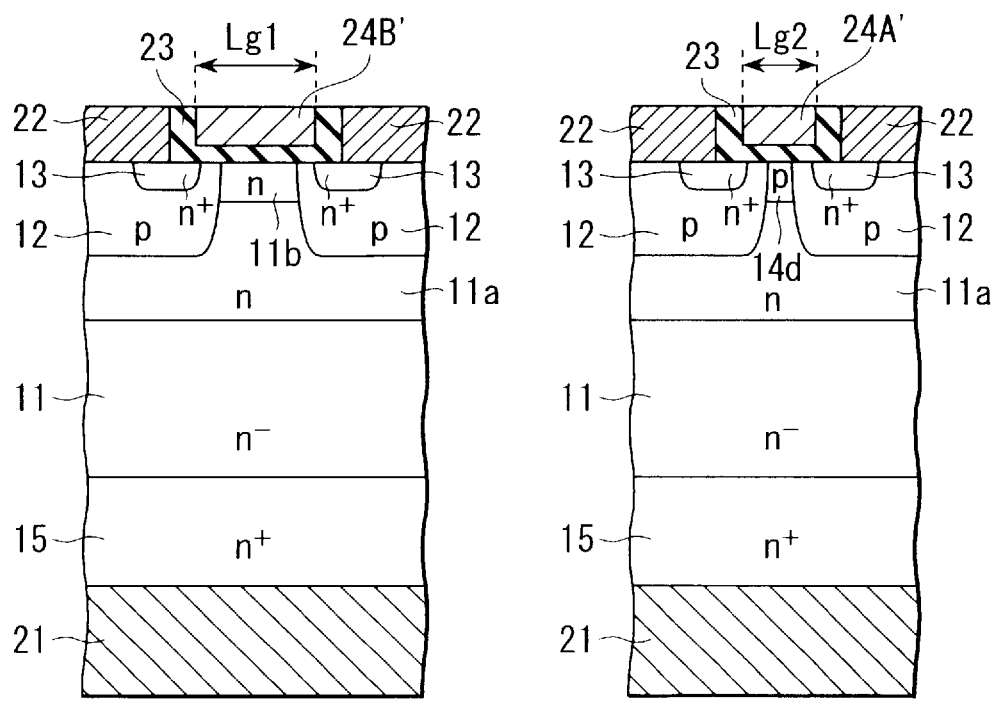

FIGS. 45A to 45C show another example of the structure of the power MOSFET according to the twelfth embodiment. In this example, gate electrodes are arranged in a striped manner. FIG. 45A is a plan view showing a gate pattern of the power MOSFET, FIG. 45B is a cross-sectional view taken along line 45B–45B of FIG. 45A and FIG. 45C is a cross-sectional view taken along line 45C–45C of FIG. 45A.

A plurality of gate electrodes 24e serving as control electrodes are arranged in a striped manner. Each of the gate electrodes 24e includes at least one first gate electrode section (second control electrode section) 24A' having a first gate length (second electrode length) Lg2 and at least one second gate electrode section (first control electrode section) 24B' having a second gate length (first electrode length) Lg1 that is longer than the first gate length Lg2.

Figure 46A:
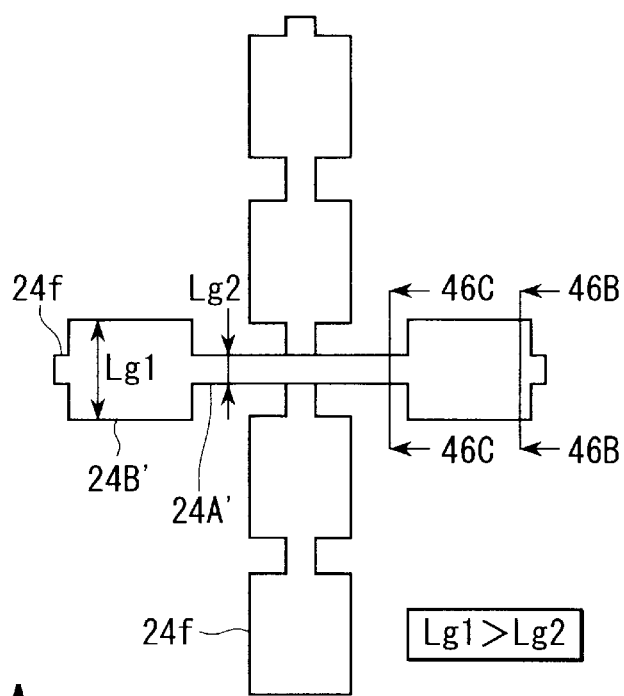
FIGS. 46A to 46C are views showing still another example of the structure of the power MOSFET according to the twelfth embodiment, in which gate electrodes are arranged in a latticed manner.
Figure 46B:
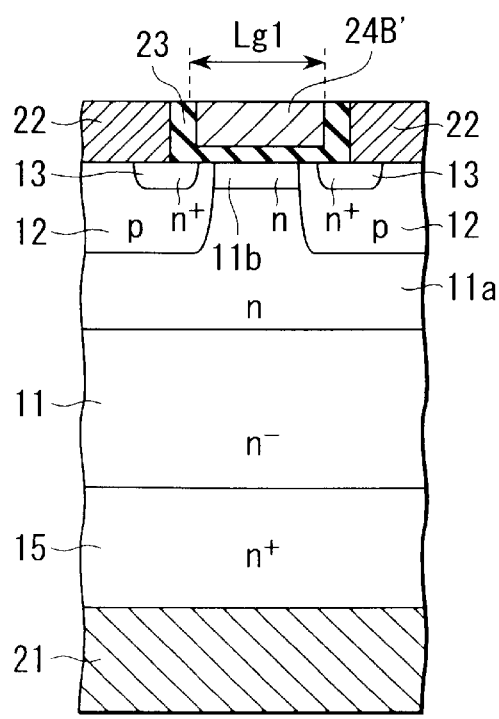
Figure 46C:
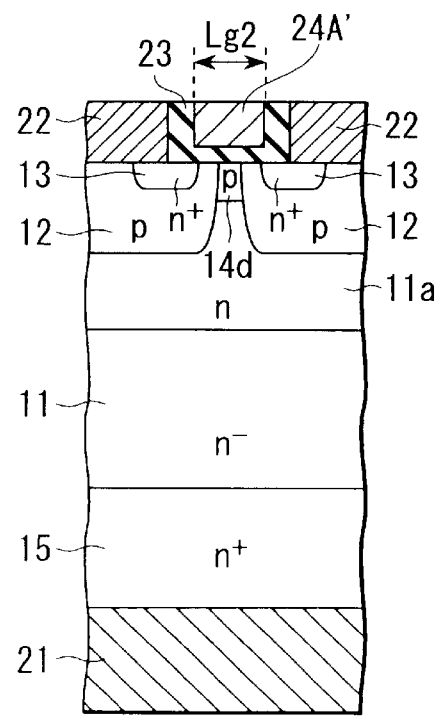

FIGS. 46A to 46C show another example of the structure of the power MOSFET according to the twelfth embodiment. In this example, gate electrodes are arranged in a latticed manner. FIG. 46A is a plan view showing a gate pattern of the power MOSFET, FIG. 46B is a cross-sectional view taken along line 46B–46B of FIG. 46A and FIG. 46C is a cross-sectional view taken along line 46C–46C of FIG. 46A.

A plurality of gate electrodes 24f, which serve as control electrodes, each include at least one first gate electrode section (second control electrode section) 24A' having a first gate length (second electrode length) Lg2 and at least one second gate electrode section (first control electrode section) 24B' having a second gate length (first electrode length) Lg1 that is longer than the first gate length Lg2. The gate electrodes 24f and the above first gate electrode sections 24A' are arranged in a latticed manner.

Figure 47A:
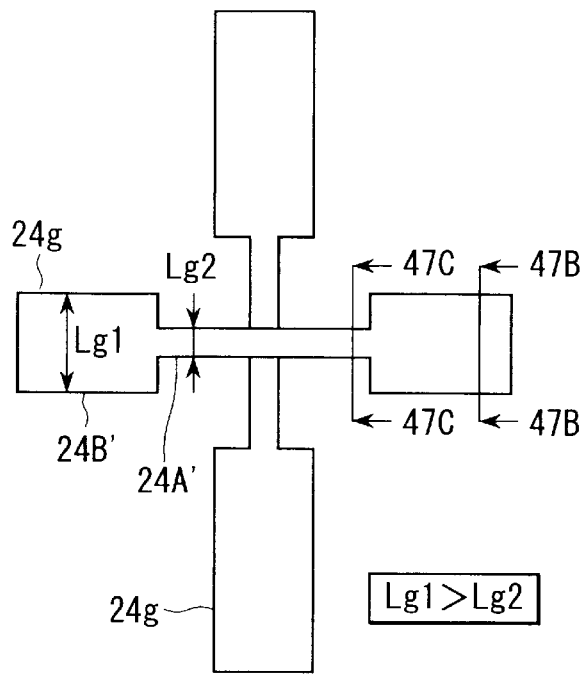
FIGS. 47A to 47C are views showing yet another example of the structure of the power MOSFET according to the twelfth embodiment, in which gate electrodes are arranged in a latticed manner.
Figures 47B, 47C:
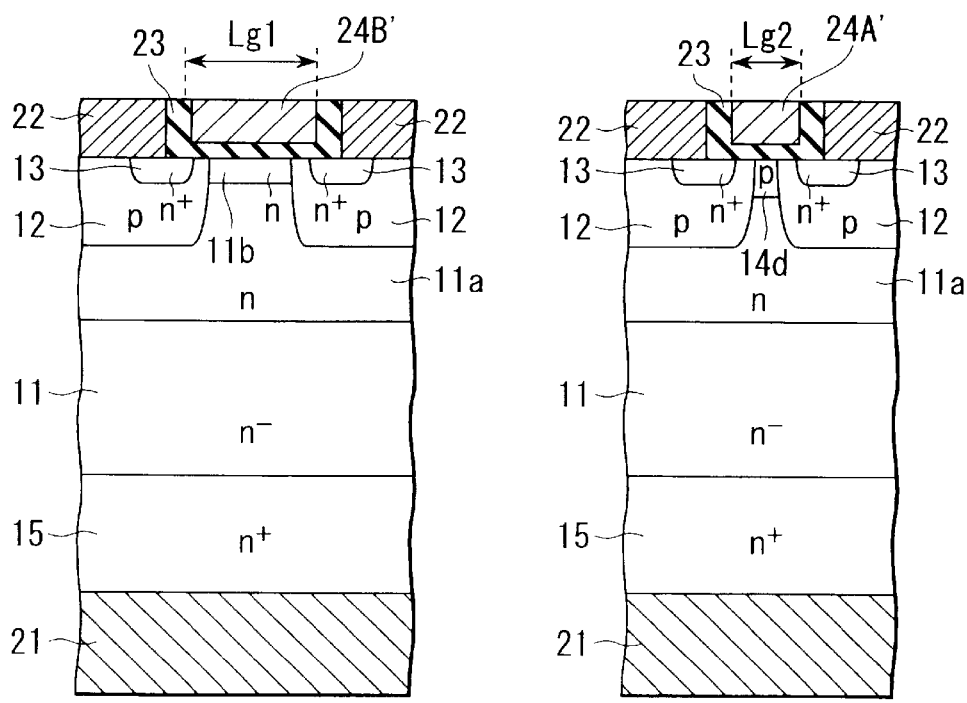

FIGS. 47A to 47C show still another example of the structure of the power MOSFET according to the twelfth embodiment. In this example, too, gate electrodes are arranged in a latticed manner. FIG. 47A is a plan view showing a gate pattern of the power MOSFET, FIG. 47B is a cross-sectional view taken along line 47B–47B of FIG. 47A and FIG. 47C is a cross-sectional view taken along line 47C–47C of FIG. 47A.

A plurality of gate electrodes 24g, which serve as control electrodes, each include at least one first gate electrode section (second control electrode section) 24A' having a first gate length (second electrode length) Lg2 and at least one second gate electrode section (first control electrode section) 24B' having a second gate length (first electrode length) Lg1 that is longer than the first gate length Lg2. The gate electrodes 24g and the above first gate electrode sections 24A' are arranged in a latticed manner.

As shown in FIGS. 45A to 47C, the gate length of each of the gate electrodes 24e, 24f and 24g is locally varied. In this case, the area of the gate-underlying p-type layer 14d can freely be varied by varying the proportion of the gate width of the first gate electrode section 24A' whose gate length is short.

In each of the MOSFETs shown in FIGS. 45A to 47C, the n⁺-type source layer 13 need not be formed in the surface area of the p-type base layer 12 corresponding to the first gate electrode section 24A' whose gate length is short, as in the power MOSFETs shown in FIGS. 42A and 42B and FIG. 44.

(Thirteenth Embodiment)

Figure 48:
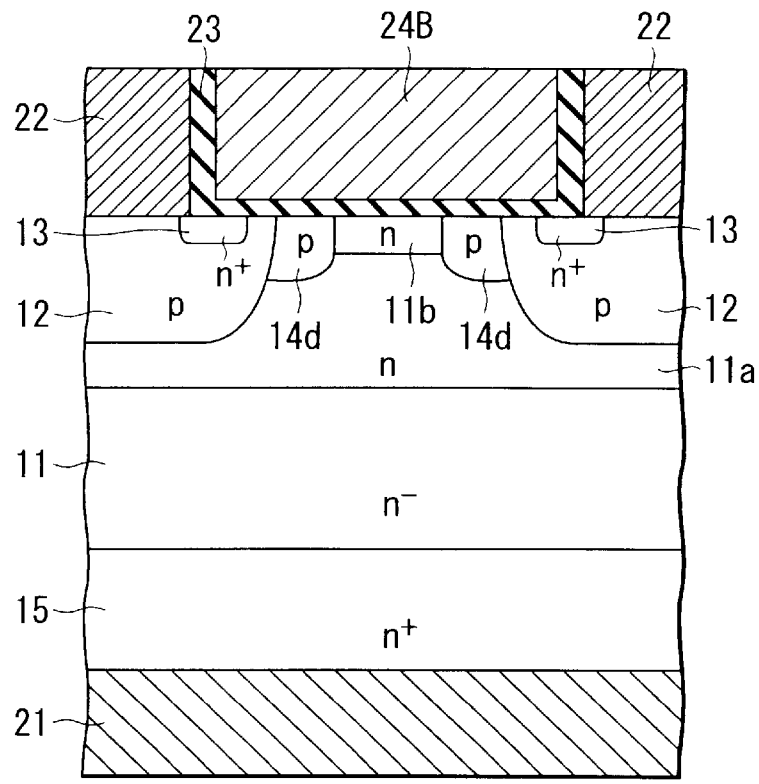
FIG. 48 is a cross-sectional view illustrating an example of the structure of a power MOSFET according to a thirteenth embodiment of the present invention.

FIG. 48 illustrates an example of the structure of a power MOSFET according to a thirteenth embodiment of the present invention. In FIG. 48, the same components as those of the MOSFET shown in FIGS. 40A and 40B are denoted by the same reference numerals and their detailed descriptions are omitted. Only the components different from those in FIGS. 40A and 40B will be described.

In the power MOSFET illustrated in FIG. 48, a gate-underlying p-type layer 14d can be formed in self-alignment. The layer 14d is formed under a second gate electrode 24B whose gate length is somewhat long.

A plurality of p-type base layers 12 serving as second semiconductor layers are selectively arranged in the surface area of an n-type low-resistance layer 11a. An n⁺-type source layer 13 serving as a third semiconductor layer is formed in each of the p-type base layers 12. A low-concentration n-type layer 11b serving as a seventh semiconductor layer is provided in the surface area of the n-type low-resistance layer 11a between adjacent p-type base layers 12.

Of control electrodes, for example, the gate electrode 24B has a somewhat long gate length (e.g., Lg1).

In the power MOSFET shown in FIG. 48, a plurality of gate-underlying p-type layers 14d serving as fifth semiconductor layers are each formed between adjacent p-type base layers 12 in self-alignment (by diffusing p-type dopant in the horizontal direction). The layers 14d are connected to their respective p-type base layers 12. Further, each of the layers 14d does not completely cover an area formed between adjacent p-type base layers 12.

As described above, in the power MOSFET shown in FIG. 48, the p-type layer 14d can be formed under the gate electrode 24B having a somewhat long gate length so as not to completely cover an area formed between adjacent p-type base layers 12. As a result, the gate-to-drain capacitance increases as the drain voltage rises. Therefore, the same advantage as when a p-type layer is completed between adjacent p-type base layers 12 or the advantage of decreasing in noise can be obtained.

If the dose of p-type dopant increases, the gate-underlying p-type layers 14d become easy to form. However, the resistivity of the low-concentration n-type layer 11b increases and so does the on-resistance of the MOSFET.

It is thus necessary to set the dose of dopant for forming the gate-underlying p-type layers 14d and low-concentration n-type layer 11b and the gate length of the gate electrode 24B (the interval between adjacent p-type base layers 12) to the optimum values. In other words, the interval between adjacent p-type base layers 12 is caused to roughly correspond to the depth of each of the p-type base layers 12. It is desirable to narrow an interval between adjacent gate-underlying p-type layers 14d almost in half.

The above thirteenth embodiment can be applied not only to the MOSFET shown in FIGS. 40A and 40B but also to a MOSFET as shown in, e.g., FIGS. 42A and 42B wherein no n⁺-type source layer 13 is formed in the surface area of the p-type base layer 12 corresponding to the first gate electrode 24A whose gate length is short.

In the MOSFETs shown in FIGS. 43 and 44 wherein the p-type base layers 12a are arranged in a latticed manner, the p-type layer 14d can be formed between adjacent p-type base layers 12a under the gate electrode 24A having a short gate length so as to completely cover an area formed between the p-type base layers 12a and it can be formed between adjacent p-type base layers 12a under the gate electrode 24B having a long gate length so as not to completely cover an area formed between the p-type base layers 12a.

Moreover, the twelfth embodiment is not limited to the MOSFET including two MOS cells whose gate electrodes have different gate lengths but applicable to, for example, a MOSFET including only one MOS cell having a somewhat long gate length.

(Fourteenth Embodiment)

Figure 49:
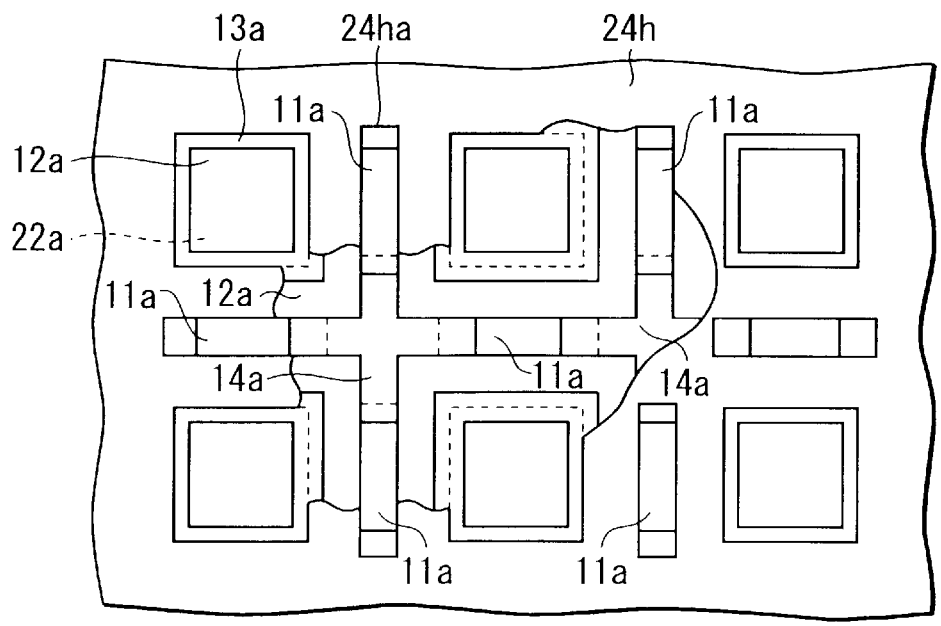
FIG. 49 is a partly-broken plan view showing a gate electrode as an example of the structure of a power MOSFET according to a fourteenth embodiment of the present invention.

FIG. 49 illustrates an example of the structure of a power MOSFET according to a fourteenth embodiment of the present invention. In FIG. 49, the same components as those of the MOSFET shown in FIG. 1 are denoted by the same reference numerals and their detailed descriptions are omitted. Only the components different from those in FIG. 1 will be described.

Referring to FIG. 49, a plurality of p-type base layers 12a serving as second semiconductor layers are arranged in a latticed manner (or staggered manner) in a surface area of an n-type low-resistance layer 11a. A plurality of gate-underlying p-type layers 14a serving as fifth semiconductor layers are each formed among adjacent four p-type base layers 12a.

A plurality of n⁺-type source layers 13a serving as third semiconductor layers are each formed like a ring in the surface area of each of the p-type base layers 12a. A rectangular source electrode 22a serving as a first main electrode is provided in part corresponding to each of the p-type base layers 12a and n⁺-type source layers 13a.

Gate electrodes 24h serving as control electrodes are arranged in a latticed manner in part excluding the source electrodes 22a. The gate electrodes 24h each have a split gate structure in which an opening 24ha is formed in part corresponding to an n-type low-resistance layer 11a between gate-underlying p-type layers 14a.

With the MOSFET according to the fourteenth embodiment, the gate-to-drain capacitance can be reduced when a low drain voltage is applied. High-speed switching can thus be achieved.

Not only the split gate structure but also a terrace gate structure as shown in FIG. 14 can be adopted in the gate electrodes of the MOSFET according to the fourteenth embodiment. Even though the terrace gate structure is adopted, the same advantages can be obtained.

(Fifteenth Embodiment)

Figure 50:
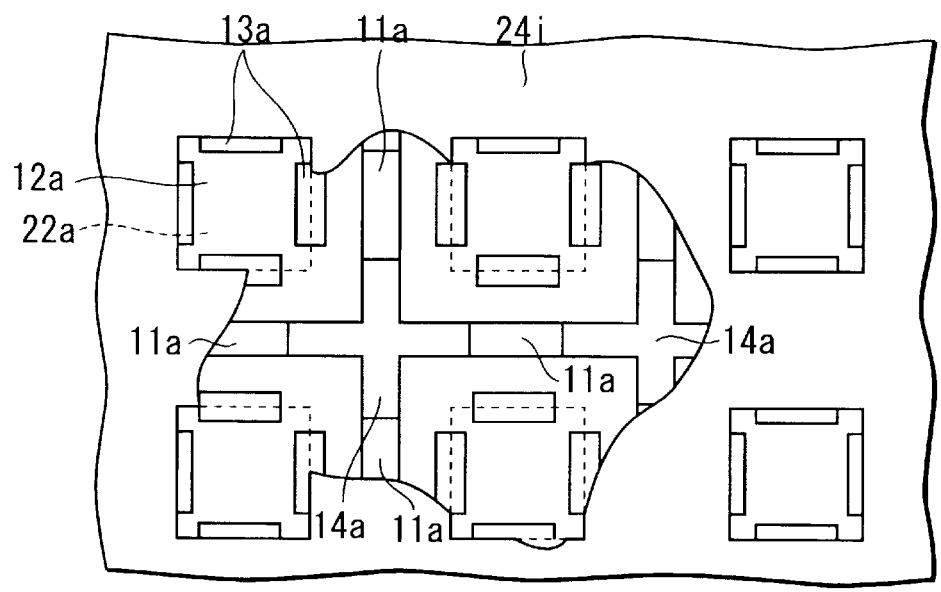
FIG. 50 is a partly-broken plan view showing a gate electrode as an example of the structure of a power MOSFET according to a fifteenth embodiment of the present invention.

FIG. 50 illustrates an example of the structure of a power MOSFET according to a fifteenth embodiment of the present invention. In FIG. 50, the same components as those of the MOSFET shown in FIG. 1 are denoted by the same reference numerals and their detailed descriptions are omitted. Only the components different from those in FIG. 1 will be described.

Referring to FIG. 50, a plurality of p-type base layers 12a serving as second semiconductor layers are arranged in a latticed manner (or staggered manner) in a surface area of an n-type low-resistance layer 11a. A plurality of gate-underlying p-type layers 14a serving as fifth semiconductor layers are each formed among adjacent four p-type base layers 12a.

A plurality of $n^+$-type source layers 13a serving as third semiconductor layers are selectively formed in the surface area of each of the p-type base layers 12a. For example, each of the $n^+$-type source layers 13a is provided only in the surface area of a corresponding p-type base layer 12a excluding part corresponding to a gate-underlying p-type layer 14a. In other words, no $n^+$-type source layers 13a are formed on the surface of a p-type base layer 12a or at the corners thereof, which correspond to the gate-underlying p-type layers 14a.

A rectangular source electrode 22a serving as a first main electrode is provided in part corresponding to each of the p-type base layers 12a and $n^+$-type source layers 13a. Gate electrodes 24i serving as control electrodes are arranged in a latticed manner in part excluding the source electrodes 22a.

In the MOSFET according to the fifteenth embodiment, a parasitic bipolar transistor can be prevented from operating without varying on-resistance. A safe-operating area of the MOSFET can thus be enlarged.

In the MOSFET so configured, a split gate structure as shown in FIG. 49 or a terrace gate structure as shown in FIG. 14 can be adopted in the gate electrodes 24i. Adopting such a structure, the MOSFET operates at high speed and has a large safe-operating area.

(Sixteenth Embodiment)

Figure 51:
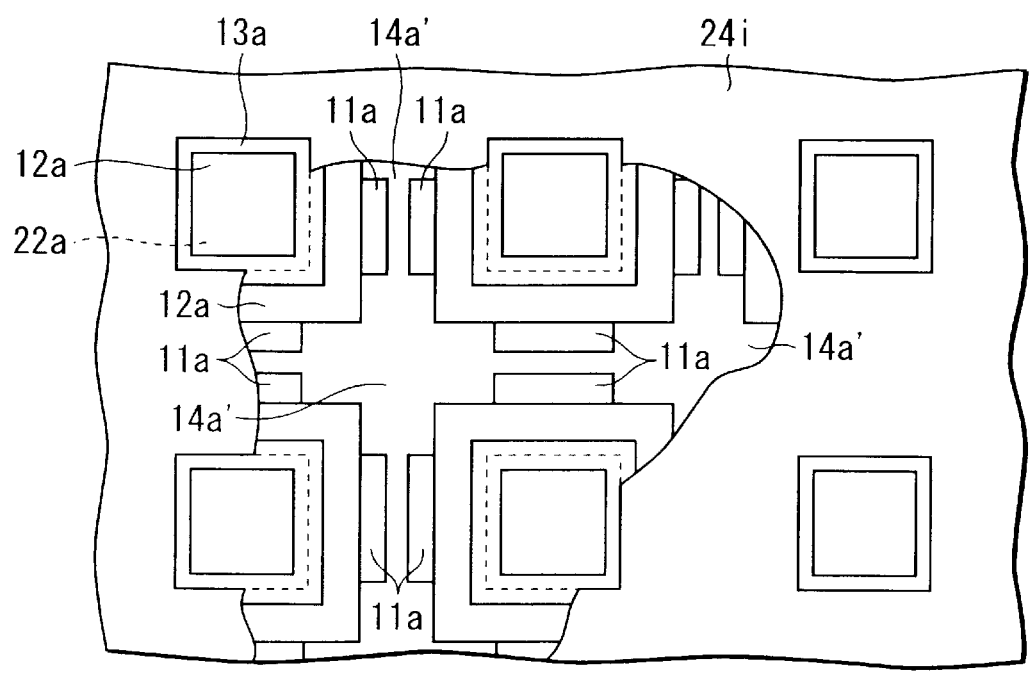
FIG. 51 is a partly-broken plan view showing a gate electrode as an example of the structure of a power MOSFET according to a sixteenth embodiment of the present invention.

FIG. 51 illustrates an example of the structure of a power MOSFET according to a sixteenth embodiment of the present invention. In FIG. 51, the same components as those of the MOSFET shown in FIG. 49 are denoted by the same reference numerals and their detailed descriptions are omitted. Only the components different from those in FIG. 49 will be described.

In the example illustrated in FIG. 51, a plurality of gate-underlying p-type layers are connected to one another.

More specifically, a plurality of p-type base layers 12a serving as second semiconductor layers are arranged in a latticed manner (or staggered manner) in a surface area of an n-type low-resistance layer 11a. A plurality of gate-underlying p-type layers 14a' serving as fifth semiconductor layers are each formed among adjacent four p-type base layers 12a. The layers 14a' are also each arranged between adjacent two p-type base layers 12a and locally connected to one another. A plurality of $n^+$-type source layers 13a serving as third semiconductor layers are each formed like a ring in the surface area of each of the p-type base layers 12a.

A rectangular source electrode 22a serving as a first main electrode is provided in part corresponding to each of the p-type base layers 12a and $n^+$-type source layers 13a. Gate electrodes 24i serving as control electrodes are arranged in a latticed manner in part excluding the source electrodes 22a.

In the power MOSFET so configured, the gate-underlying p-type layers 14a' can be formed without losing a MOS channel. Consequently, on-resistance can be prevented from increasing.

Figure 52:
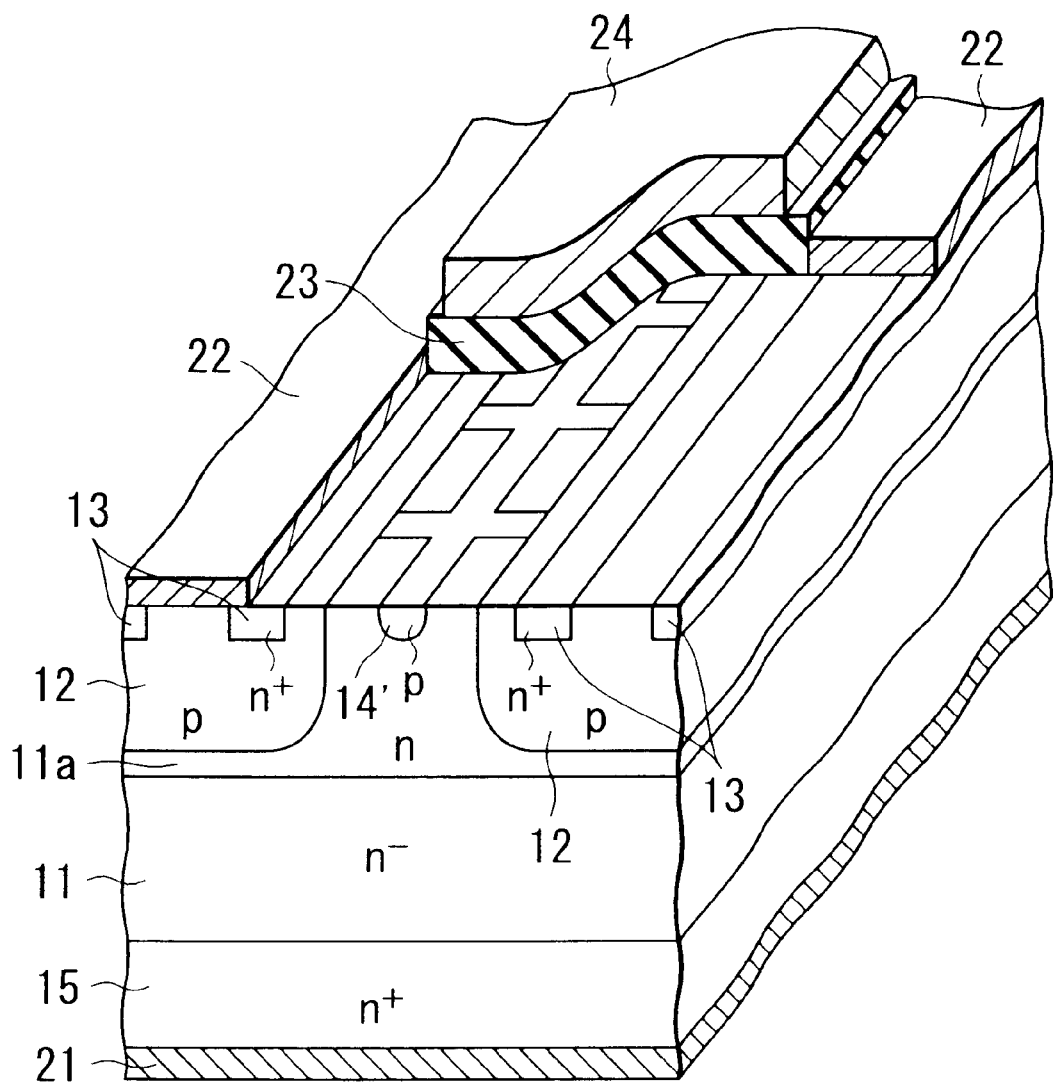
FIG. 52 is a partly-broken sectional view showing another example of the structure of the power MOSFET according to the sixteenth embodiment of the present invention.

The sixteenth embodiment can be applied to a MOSFET that is so configured that a plurality of gate electrodes are arranged in a striped manner as shown in FIG. 52.

More specifically, a plurality of p-type base layers 12 serving as second semiconductor layers are arranged in a striped manner in a surface area of an n-type low-resistance layer 11a. A plurality of gate-underlying p-type layers 14a' serving as fifth semiconductor layers are each formed between adjacent two p-type base layers 12. Each gate-underlying p-type layer 14a' formed between adjacent two p-type base layers 12 is locally connected to these p-type base layers 12. At least one $n^+$-type source layer 13 serving as a third semiconductor layer is formed like a strip in the surface area of each of the p-type base layers 12.

A strip-shaped source electrode 22 serving as a first main electrode is provided in part corresponding to each of the p-type base layers 12a and $n^+$-type source layer 13. Gate electrodes 24 serving as control electrodes are formed in a striped manner in part excluding the source electrodes 22.

In the power MOSFET so configured, too, the area of the gate-underlying p-type layers 14a' connected to a MOS channel can be reduced to prevent the effective gate width of the MOS channel from decreasing. Consequently, on-resistance can be prevented from increasing.

The sixteenth embodiment can also be applied to a MOSFET that is configured to have gate electrodes whose gate lengths differ from each other as shown in, for example, the eleventh and twelfth embodiments.

In the foregoing embodiments, the first conductivity type is an n type and the second conductivity type is a p type. However, the present invention is not limited to this. In each of the embodiments, the first conductivity type can be an n type and the second conductivity type can be a p type.

In the foregoing embodiments, silicon is used. The present invention is not limited to the use of silicon but can be applied to a device using silicon carbide (SiC), gallium nitride (GaN), a compound semiconductor such as aluminum nitride (AlN), and diamond.

In the foregoing embodiments, the present invention is applied to a MOSFET having a super-junction structure and a vertical switching element. However, it is not limited to this. For example, it can be applied to a horizontal MOSFET, IGBT, etc. if they are MOS or MIS gate elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An insulated gate semiconductor device comprising:
   a first semiconductor layer of a first conductivity type;
   a plurality of second semiconductor layers of a second conductivity type selectively formed in a surface area of the first semiconductor layer;

at least one third semiconductor layer of the first conductivity type formed in a surface area of each of the second semiconductor layers;

a plurality of first main electrodes connected to the second semiconductor layers and the third semiconductor layer, respectively;

a fourth semiconductor layer formed on a bottom of the first semiconductor layer;

a second main electrode connected to the fourth semiconductor layer;

a control electrode formed on a surface of each of the second semiconductor layers, the third semiconductor layer, and the first semiconductor layer with a gate insulation film interposed therebetween; and at least one fifth semiconductor layer of the second conductivity type locally provided in part of a region of the first semiconductor layer and connected to at least one of the plurality of second semiconductor layers, the fifth semiconductor layer having impurity concentration that is lower than that of the second semiconductor layers.

2. The insulated gate semiconductor device according to claim 1, wherein the fifth semiconductor layer is provided in the surface area of the first semiconductor layer and between the second semiconductor layers.

3. The insulated gate semiconductor device according to claim 2, wherein the second semiconductor layers are each formed like a strip and the fifth semiconductor layer is provided in a first direction along the second semiconductor layers.

4. The insulated gate semiconductor device according to claim 2, wherein the second semiconductor layers are each formed like a strip and the fifth semiconductor layer is provided in a second direction perpendicular to the first direction.

5. The insulated gate semiconductor device according to claim 1, wherein the fifth semiconductor layer is buried in the first semiconductor layer.

6. The insulated gate semiconductor device according to claim 1, wherein the control electrode has a planar structure.

7. The insulated gate semiconductor device according to claim 6, wherein the control electrode has a split gate structure.

8. The insulated gate semiconductor device according to claim 6, wherein the control electrode has a terrace gate structure.

9. The insulated gate semiconductor device according to claim 1, wherein the control electrode has a trench structure.

10. The insulated gate semiconductor device according to claim 1, wherein the control electrode has a trench structure and the fifth semiconductor layer is provided along a bottom of the control electrode and at least one side of the control electrode.

11. The insulated gate semiconductor device according to claim 1, wherein the second semiconductor layers are arranged in a latticed manner and the fifth semiconductor layer is formed like a rectangle between the second semiconductor layers.

12. The insulated gate semiconductor device according to claim 11, wherein the fifth semiconductor layer is provided between adjacent two second semiconductor layers of the second conductivity type.

13. The insulated gate semiconductor device according to claim 11, wherein the fifth semiconductor layer is provided between adjacent four second semiconductor layers of the second conductivity type.

14. The insulated gate semiconductor device according to claim 13, wherein an interval between adjacent fifth semiconductor layers of the second conductivity type is shorter than an interval between adjacent second semiconductor layers of the second conductivity type.

15. The insulated gate semiconductor device according to claim 1, wherein the second semiconductor layers are arranged in a latticed manner and the fifth semiconductor layer is formed like a strip between second semiconductor layers of the second conductivity type.

16. The insulated gate semiconductor device according to claim 1, wherein the second semiconductor layers are arranged in a latticed manner and the fifth semiconductor layer is formed so as to surround some of the second semiconductor layers of the second conductivity type.

17. The insulated gate semiconductor device according to claim 16, wherein the fifth semiconductor layers of the second conductivity type are arranged in a staggered manner.

18. The insulated gate semiconductor device according to claim 16, wherein the fifth semiconductor layers of the second conductivity type are arranged like a strip.

19. The insulated gate semiconductor device according to claim 18, wherein the fifth semiconductor layers of the second conductivity type are arranged in one direction.

20. The insulated gate semiconductor device according to claim 18, wherein the fifth semiconductor layers of the second conductivity type are arranged in two directions.

21. The insulated gate semiconductor device according to claim 1, wherein the fourth semiconductor layer is a semiconductor layer of the first conductivity type.

22. The insulated gate semiconductor device according to claim 1, wherein the fourth semiconductor layer is a semiconductor layer of the second conductivity type.

23. The insulated gate semiconductor device according to claim 22, further comprising a sixth semiconductor layer of the first conductivity type provided between the fourth semiconductor layer and the first semiconductor layer.

24. The insulated gate semiconductor device according to claim 1, wherein a surface area of the fifth semiconductor layer is 30% or more and less than 100% of a surface area of the first semiconductor layer between adjacent second semiconductor layers of the second conductivity type.

25. The insulated gate semiconductor device according to claim 1, wherein the fifth semiconductor layer has an effective impurity dose ranging from $1\times10^{12}$ cm$^{-2}$ to $3.2\times10^{12}$ cm$^{-2}$.

26. The insulated gate semiconductor device according to claim 1, wherein a ratio (Np/Lj) of an effective impurity dose (Np) of the fifth semiconductor layer to a distance (Lj) between adjacent second semiconductor layers of the second conductivity type is smaller than $2\times10^{15}$ cm$^{-3}$.

27. The insulated gate semiconductor device according to claim 1, wherein a ratio (Np/(Lj·Xj)) of an effective impurity dose (Np) of the fifth semiconductor layer to a product of a distance (Lj) between adjacent second semiconductor layers of the second conductivity type and a depth (Xj) of the second semiconductor layers is smaller than $5\times11^{18}$ cm$^{-4}$.

28. An insulated gate semiconductor device comprising:
a first semiconductor layer of a first conductivity type;
a plurality of second semiconductor layers of a second conductivity type selectively formed in a surface area of the first semiconductor layer;
at least one third semiconductor layer of the first conductivity type formed in a surface area of each of the second semiconductor layers;
a plurality of first main electrodes connected to the second semiconductor layers and the third semiconductor layer, respectively;

a fourth semiconductor layer formed on a bottom of the first semiconductor layer;

a second main electrode connected to the fourth semiconductor layer;

a control electrode formed on a surface of each of the second semiconductor layers, the third semiconductor layer, and the first semiconductor layer with a gate insulation film interposed therebetween; and at least one fifth semiconductor layer of the second conductivity type provided in the first semiconductor layer and connected to at least one of the plurality of second semiconductor layers, the fifth semiconductor layer having impurity concentration that is lower than that of the second semiconductor layers, wherein capacitance between the control electrode and the second main electrode decreases when a voltage applied to the second main electrode is low and the capacitance remains constant or increases when the voltage is high.

29. An insulated gate semiconductor device comprising:

a first semiconductor layer of a first conductivity type;

a plurality of second semiconductor layers of a second conductivity type selectively formed in a surface area of the first semiconductor layer;

at least one third semiconductor layer of the first conductivity type formed in a surface area of each of the second semiconductor layers;

a plurality of first main electrodes connected to the second semiconductor layers and the third semiconductor layer, respectively;

a fourth semiconductor layer formed on a bottom of the first semiconductor layer;

a second main electrode connected to the fourth semiconductor layer;

a control electrode formed on a surface of each of the second semiconductor layers, the third semiconductor layer, and the first semiconductor layer with a gate insulation film interposed therebetween; and at least one fifth semiconductor layer of the second conductivity type provided in the first semiconductor layer and connected to at least one of the plurality of second semiconductor layers, the fifth semiconductor layer having impurity concentration that is lower than that of the second semiconductor layers, wherein capacitance between the control electrode and the second main electrode starts to increase when a voltage applied to the second main electrode is one-third to two-thirds of a rated voltage.

30. An insulated gate semiconductor device comprising:

a first semiconductor layer of a first conductivity type;

a plurality of second semiconductor layers of a second conductivity type selectively formed in a surface area of the first semiconductor layer;

at least one third semiconductor layer of the first conductivity type formed in a surface area of each of the second semiconductor layers;

a plurality of first main electrodes connected to the second semiconductor layers and the third semiconductor layer, respectively;

a fourth semiconductor layer formed on a bottom of the first semiconductor layer;

a second main electrode connected to the fourth semiconductor layer;

a control electrode formed on a surface of each of the second semiconductor layers, the third semiconductor layer, and the first semiconductor layer with a gate insulation film interposed therebetween; and at least one fifth semiconductor layer of the second conductivity type provided in the first semiconductor layer and connected to at least one of the plurality of second semiconductor layers, the fifth semiconductor layer having impurity concentration that is lower than that of the second semiconductor layers, wherein the fifth semiconductor layer of the second conductivity type is completely depleted when a voltage applied to the second main electrode is one-third to two-thirds of a rated voltage.

31. An insulated gate semiconductor device comprising:

a first cell at least including a plurality of second semiconductor layers of a second conductivity type selectively formed in a surface area of a first semiconductor layer of a first conductivity type, at least a third semiconductor layer of the first conductivity type formed in a surface area of each of the second semiconductor layers of the second conductivity type, and a plurality of first main electrodes connected to the second semiconductor layers and the third semiconductor layer;

a fourth semiconductor layer formed on a bottom of the first semiconductor layer; and a second cell at least including a plurality of second semiconductor layers of the second conductivity type selectively formed in the surface area of the first semiconductor layer of the first conductivity type, and a fifth semiconductor layer of the second conductivity type provided between adjacent semiconductor layers of the plurality of second semiconductor layers of the second conductivity type, the fifth semiconductor layer having impurity concentration that is lower than that of the second semiconductor layers, wherein a length of a control electrode or an interval between the adjacent semiconductor layers of the second cell is greater than a length of a control electrode or an interval between the adjacent second semiconductor layers in the first cell.

32. The insulated gate semiconductor device according to claim 31, wherein the fifth semiconductor layer of the second cell is provided so as to completely cover the surface area of the first semiconductor layer.

33. The insulated gate semiconductor device according to claim 31, wherein the second cell further includes a first main electrode connected to the second semiconductor layers of the second conductivity type.

34. The insulated gate semiconductor device according to claim 1, further comprising a low-resistance layer of the first conductivity type, which is provided between adjacent second semiconductor layers of the second conductivity type and has impurity concentration that is higher than that of the first semiconductor layer of the first conductivity type, and wherein a relationship between an effective impurity dose (Np) of said at least one fifth semiconductor layer of the second conductivity type and a ratio (Ap=Ap1/(Ap1+Ap2)) of a surface area (Ap1) of said at least one fifth semiconductor layer to a sum (Ap1+Ap2) of the surface area (Ap1) of said at least one fifth semiconductor layer and a surface area (Ap2) of the low-resistance layer of the first conductivity type is expressed as follows:

$0<Np<9\times10^1/Ap+1.2\times10^{12}$ cm$^{-2}$.

35. The insulated gate semiconductor device according to claim 34, wherein the relationship is expressed as follows:

$Np>2.5\times10^{11}/Ap+5.3\times10^{11}$ cm$^{-2}$.

36. The insulated gate semiconductor device according to claim 1, further comprising a low-resistance layer of the first conductivity type, which is provided between adjacent second semiconductor layers of the second conductivity type and has impurity concentration that is higher than that of the first semiconductor layer of the first conductivity type, and
wherein a relationship among an effective impurity dose (Np) of said at least one fifth semiconductor layer of the second conductivity type, a ratio (Ap=Ap1/(Ap1+Ap2)) of a surface area (Ap1) of said at least one fifth semiconductor layer to a sum (Ap1+Ap2) of the surface area (Ap1) of said at least one fifth semiconductor layer and a surface area (Ap2) of the low-resistance layer, and an interval (Lj) between adjacent second semiconductor layers of the second conductivity type is expressed as follows:

$0<Np/Lj<1.7\times10^{15}/Ap+2\times10^{15}$ cm$^{-3}$.

37. The insulated gate semiconductor device according to claim 36, wherein the relationship is expressed as follows:

$Np/Lj>4.2\times10^{14}/Ap+8.8\times10^{14}$ cm$^{-3}$.

38. The insulated gate semiconductor device according to claim 1, further comprising a low-resistance layer of the first conductivity type, which is provided between adjacent second semiconductor layers of the second conductivity type and has impurity concentration that is higher than that of the first semiconductor layer of the first conductivity type, and
wherein a relationship among an effective impurity dose (Np) of said at least one fifth semiconductor layer of the second conductivity type, a ratio (Ap=Ap1/(Ap1+Ap2)) of a surface area (Ap1) of said at least one fifth semiconductor layer to a sum (Ap1+Ap2) of the surface area (Ap1) of said at least one fifth semiconductor layer and a surface area (Ap2) of the low-resistance layer, and a depth (Xj) of a junction between adjacent second semiconductor layers of the second conductivity type is expressed as follows:

$0<Np\cdot Xj<3.6\times10^{8}/Ap+4.8\times10^{8}$ cm$^{-1}$.

39. The insulated gate semiconductor device according to claim 38, wherein the relationship is expressed as follows:

$Np\cdot Xj>1\times10^{8}/Ap+2.1\times10^{8}$ cm$^{-1}$.

40. The insulated gate semiconductor device according to claim 1, further comprising a low-resistance layer of the first conductivity type, which is provided between adjacent second semiconductor layers of the second conductivity type and has impurity concentration that is higher than that of the first semiconductor layer of the first conductivity type, and
wherein a relationship among an effective impurity dose (Np) of said at least one fifth semiconductor layer of the second conductivity type, a ratio (Ap=Ap1/(Ap1+Ap2)) of a surface area (Ap1) of said at least one fifth semiconductor layer to a sum (Ap1+Ap2) of the surface area (Ap1) of said at least one fifth semiconductor layer and a surface area (Ap2) of the low-resistance layer, an interval (Lj) between adjacent second semiconductor layers of the second conductivity type, and a depth (Xj) of a junction between adjacent second semiconductor layers of the second conductivity type is expressed as follows:

$0<Np\cdot Xj/Lj$ 21 $6\times10^{11}/Ap+8\times10^{11}$ cm$^{-2}$.

41. The insulated gate semiconductor device according to claim 40, wherein the relationship is expressed as follows:

$Np\cdot Xj/Lj>1.7\times10^{11}/Ap+3.5\times10^{11}$ cm$^{-2}$.

42. The insulated gate semiconductor device according to claim 1, further comprising a low-resistance layer of the first conductivity type, which is provided between adjacent second semiconductor layers of the second conductivity type and has impurity concentration that is higher than that of the first semiconductor layer of the first conductivity type, and
wherein a relationship among an effective impurity dose (Np) of said at least one fifth semiconductor layer of the second conductivity type, an effective impurity dose (Nn) of the low-resistance layer, and a ratio (Ap=Ap1/(Ap1+Ap2)) of a surface area (Ap1) of said at least one fifth semiconductor layer to a sum (Ap1+Ap2) of the surface area (Ap1) of said at least one fifth semiconductor layer and a surface area (Ap2) of the low-resistance layer is expressed as follows:

$0<Np<8.4\times10^{11}/Ap+0.34Nn+0.015Nn/Ap-1.2\times10^{11}$ cm$^{-2}$.

43. The insulated gate semiconductor device according to claim 42, wherein the relationship is expressed as follows:

$Np>-4\times10^{10}/Ap+0.0375Nn+0.075Nn/Ap+4\times10^{11}$ cm$^{-2}$.

44. The insulated gate semiconductor device according to claim 1, further comprising a low-resistance layer of the first conductivity type, which is provided between adjacent second semiconductor layers of the second conductivity type and has impurity concentration that is higher than that of the first semiconductor layer of the first conductivity type, and
wherein a relationship among an effective impurity dose (Np) of said at least one fifth semiconductor layer of the second conductivity type, an effective impurity dose (Nn) of the low-resistance layer, a ratio (Ap=Ap1/(Ap1+Ap2)) of a surface area (Ap1) of said at least one fifth semiconductor layer to a sum (Ap1+Ap2) of the surface area (Ap1) of said at least one fifth semiconductor layer and a surface area (Ap2) of the low-resistance layer, and an interval (Lj) between adjacent second semiconductor layers of the second conductivity type is expressed as follows:

$0<Np/Lj<1.4\times10^{15}/Ap+570Nn+25Nn/Ap-2\times10^{14}$ cm$^{-3}$.

45. The insulated gate semiconductor device according to claim 44, wherein the relationship is expressed as follows:

$Np/Lj>-6.7\times10^{13}/Ap+62.5Nn+125Nn/Ap+6.7\times10^{14}$ cm$^{-3}$.

46. The insulated gate semiconductor device according to claim 1, further comprising a low-resistance layer of the first conductivity type, which is provided between adjacent second semiconductor layers of the second conductivity type and has impurity concentration that is higher than that of the first semiconductor layer of the first conductivity type, and
wherein a relationship among an effective impurity dose (Np) of said at least one fifth semiconductor layer of the second conductivity type, an effective impurity dose (Nn) of the low-resistance layer, a ratio (Ap=Ap1/(Ap1+Ap2)) of a surface area (Ap1) of said at least one fifth semiconductor layer to a sum (Ap1+Ap2) of the surface area (Ap1) of said at least one fifth semiconductor layer and a surface area (Ap2) of the low-resistance layer, an interval (Lj) between adjacent second semiconductor layers of the second conductivity type, and a depth (Xj) of a junction between adjacent second semiconductor layers of the second conductivity type is expressed as follows:

$$0 < Np \cdot Xj/Lj < 5.6 \times 10^{11}/Ap + 0.228Nn + 0.01Nn/Ap - 8 \times 10^{10} \text{ cm}^{-2}.$$

47. The insulated gate semiconductor device according to claim 46, wherein the relationship is expressed as follows:

$$Np \cdot Xj/Lj > -2.7 \times 10^{10}/Ap + 0.025Nn + 0.05Nn/Ap + 2.7 \times 10^{11} \text{ cm}^{-2}.$$

48. The insulated gate semiconductor device according to claim 1, wherein the plurality of second semiconductor layers are arranged in a latticed manner, and the control electrode is provided between adjacent second semiconductor layers.

49. The insulated gate semiconductor device according to claim 48, wherein the control electrode includes at least one first control electrode having a first electrode length and at least one second control electrode having a second electrode length.

50. The insulated gate semiconductor device according to claim 1, wherein the control electrode includes at least one first control electrode having a first electrode length and at least one second control electrode having a second electrode length, and said at least one fifth semiconductor layer of the second conductivity type is provided only between adjacent second semiconductor layers corresponding to said at least one first control electrode.

51. The insulated gate semiconductor device according to claim 50, wherein the first electrode length of the first control electrode is longer than the second electrode length of the second control electrode.

52. The insulated gate semiconductor device according to claim 50, wherein said at least one fifth semiconductor layer of the second conductivity type is selectively provided between adjacent second semiconductor layers corresponding thereto.

53. The insulated gate semiconductor device according to claim 49, wherein said at least one second control electrode has one of a split gate structure and a terrace gate structure.

54. The insulated gate semiconductor device according to claim 1, wherein the control electrode includes at least one first control electrode having a first electrode length and at least one second control electrode having a second electrode length, said at least one fifth semiconductor layer of the second conductivity type is provided only between adjacent second semiconductor layers corresponding to said at least one first control electrode, and said at least one third semiconductor layer of the first conductivity type is provided only in a surface area of each of the plurality of second semiconductor layers corresponding to said at least one second control electrode.

55. The insulated gate semiconductor device according to claim 1, wherein the control electrode includes at least one first control electrode having a first electrode length and at least one second control electrode having a second electrode length, and said at least one fifth semiconductor layer of the second conductivity type is provided only between adjacent second semiconductor layers corresponding to said at least one second control electrode.

56. The insulated gate semiconductor device according to claim 54, further comprising:
a low-resistance layer of the first conductivity type, which is provided between adjacent second semiconductor layers of the second conductivity type and has impurity concentration that is higher than that of the first semiconductor layer of the first conductivity type; and
a seventh semiconductor layer of the first conductivity type provided between adjacent second semiconductor layers corresponding to said at least one first control electrode, the seventh semiconductor layer having impurity concentration that is lower than that of the low-resistance layer, and
wherein the control electrode includes at least one first control electrode having a first electrode length and at least one second control electrode having a second electrode length, and said at least one fifth semiconductor layer of the second conductivity type is provided only between adjacent second semiconductor layers corresponding to said at least one second control electrode.

57. The insulated gate semiconductor device according to claim 54, wherein the control electrode includes at least one first control electrode having a first electrode length and at least one second control electrode having a second electrode length, said at least one fifth semiconductor layer of the second conductivity type is provided only between adjacent second semiconductor layers corresponding to said at least one second control electrode, and said at least one third semiconductor layer of the first conductivity type is provided only in a surface area of each of the plurality of second semiconductor layers corresponding to said at least one first control electrode.

58. The insulated gate semiconductor device according to claim 49, wherein the control electrode includes at least one first control electrode having a first electrode length and at least one second control electrode having a second electrode length, the first and second control electrodes being arranged in a striped manner.

59. The insulated gate semiconductor device according to claim 49, wherein the control electrode includes at least one first control electrode having a first electrode length and at least one second control electrode having a second electrode length, the first and second control electrodes being arranged in a latticed manner.

60. The insulated gate semiconductor device according to claim 48, wherein the control electrode includes a plurality of control electrodes including at least one first control electrode section having a first electrode length and at least one second control electrode section having a second electrode length.

61. The insulated gate semiconductor device according to claim 60, wherein the plurality of control electrodes are arranged in a striped manner.

62. The insulated gate semiconductor device according to claim 60, wherein the plurality, of control electrodes are arranged in a latticed manner.

63. The insulated gate semiconductor device according to claim 62, wherein the plurality of control electrodes include at least one first control electrode section having a first electrode length and at least one second control electrode section having a second electrode length, and said at least one second control electrode section is formed in a latticed manner.

64. An insulated gate semiconductor device comprising:
a first cell including a plurality of second semiconductor layers of a second conductivity type selectively formed in a surface area of a first semiconductor layer of a first conductivity type, at least one third semiconductor layer of the first conductivity type formed in a surface area of each of the second semiconductor layers, and a plurality of first main electrodes connected to the plurality of second semiconductor layers and said at least one third semiconductor layer; and a second cell including a plurality of second semiconductor layers of the second conductivity type selectively formed in the surface area of the first semiconductor layer of the first conductivity type and a fifth semiconductor layer of the second conductivity type provided between adjacent second semiconductor layers of the second conductivity type and having impurity concentration that is lower than that of the plurality of second semiconductor layers, wherein the first semiconductor layer includes a low-resistance layer of the first conductivity type having impurity concentration that is higher than that of the first semiconductor layer; and the first cell further includes a seventh semiconductor layer of the first conductivity type provided between adjacent second semiconductor layers and having impurity concentration that is lower than that of the low-resistance layer.

65. The insulated gate semiconductor device according to claim 64, wherein a control electrode length of the second cell or an interval between adjacent second semiconductor layers thereof is shorter than a control electrode length of the first cell or an interval between adjacent second semiconductor layers thereof.

66. The insulated gate semiconductor device according to claim 65, wherein the first cell further includes a fifth semiconductor layer of the second conductivity type provided between adjacent second semiconductor layers and having impurity concentration that is lower than that of the second semiconductor layers.

67. The insulated gate semiconductor device according to claim 64, wherein the second cell further includes a first main electrode connected to the plurality of second semiconductor layers or at least one third semiconductor layer of the first conductivity type formed in a surface area of each of the plurality of second semiconductor layers and a first main electrode connected to each of the plurality of second semiconductor layers and said at least one third semiconductor layer.

68. An insulated gate semiconductor device comprising:

a first semiconductor layer of a first conductivity type;

a low-resistance layer of the first conductivity type provided in the first semiconductor layer and having impurity concentration that is higher than that of the first semiconductor layer;

a plurality of second semiconductor layers of a second conductivity type selectively formed in a surface area of the low-resistance layer;

at least one third semiconductor layer of the first conductivity type formed in a surface area of each of the plurality of second semiconductor layers;

a plurality of first main electrodes connected to the plurality of second semiconductor layers and said at least one third semiconductor layer, respectively;

a fourth semiconductor layer formed on a bottom of the first semiconductor layer;

a second main electrode connected to the fourth semiconductor layer;

a control electrode formed on a surface of each of the plurality of second semiconductor layers, said at least one third semiconductor layer, and the low-resistance layer with a gate insulation film interposed therebetween; and a plurality of fifth semiconductor layers of the second conductivity type provided in the low-resistance layer, connected to adjacent second semiconductor layers, and having impurity concentration that is lower than that of the plurality of second semiconductor layers, wherein a seventh semiconductor layer of the first conductivity type having impurity concentration that is lower than that of the low-resistance layer is provided between the plurality of fifth semiconductor layers.

69. An insulated gate semiconductor device comprising:

a first semiconductor layer of a first conductivity type;

a low-resistance layer of the first conductivity type provided in the first semiconductor layer and having impurity concentration that is higher than that of the first semiconductor layer;

a plurality of second semiconductor layers of a second conductivity type selectively formed in a surface area of the low-resistance layer;

at least one third semiconductor layer of the first conductivity type formed in a surface area of each of the plurality of second semiconductor layers;

a plurality of first main electrodes connected to the plurality of second semiconductor layers and said at least one third semiconductor layer, respectively;

a fourth semiconductor layer formed on a bottom of the first semiconductor layer;

a second main electrode connected to the fourth semiconductor layer;

a control electrode formed on a surface of each of the plurality of second semiconductor layers, said at least one third semiconductor layer, and the low-resistance layer with a gate insulation film interposed therebetween; and a plurality of fifth semiconductor layers of the second conductivity type provided in the low-resistance layer, connected to adjacent second semiconductor layers, and having impurity concentration that is lower than that of the plurality of second semiconductor layers.

70. The insulated gate semiconductor device according to claim 69, wherein the plurality of second semiconductor layers are arranged in a latticed manner, and the plurality of fifth semiconductor layers are each provided among adjacent four second semiconductor layers.

71. The insulated gate semiconductor device according to claim 70, wherein the plurality of fifth semiconductor layers are locally connected.

72. The insulated gate semiconductor device according to claim 69, wherein said at least one third semiconductor layer is provided only in a surface area of each of the plurality of second semiconductor layers, except part of each of the plurality of second semiconductor layers to which the plurality of fifth semiconductor layers are connected.

73. The insulated gate semiconductor device according to claim 69, wherein the control electrodes are arranged in a latticed manner, and part of each of the control electrodes, which corresponds to the low-resistance layer, has one of a split gate structure and a terrace gate structure.

74. The insulated gate semiconductor device according to claim 69, wherein the plurality of second semiconductor layers are arranged in a striped manner, and the plurality of fifth semiconductor layers are locally connected to the plurality of second semiconductor layers.

75. The insulated gate semiconductor device according to claim 31, wherein the second cell further includes at least one third semiconductor layer of the first conductivity type formed in a surface area of each of the second semiconductor layers and a first main electrode connected to both the second semiconductor layers and the third semiconductor layer.

* * * * *